(12) United States Patent
Zhang et al.

(10) Patent No.: US 12,439,787 B2
(45) Date of Patent: Oct. 7, 2025

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tiaomei Zhang, Beijing (CN); Juntao Chen, Beijing (CN); Ziyang Yu, Beijing (CN); Zhiliang Jiang, Beijing (CN); Ming Hu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/670,334

(22) Filed: May 21, 2024

(65) Prior Publication Data

US 2024/0407210 A1 Dec. 5, 2024

Related U.S. Application Data

(63) Continuation of application No. 18/257,303, filed as application No. PCT/CN2022/096377 on May 31, 2022.

(51) Int. Cl.
*G09G 5/00* (2006.01)
*H10K 59/121* (2023.01)
(Continued)

(52) U.S. Cl.
CPC ....... *H10K 59/131* (2023.02); *H10K 59/1213* (2023.02); *H10K 59/1216* (2023.02); *H10D 86/441* (2025.01); *H10D 86/60* (2025.01)

(58) Field of Classification Search
CPC ......... G09G 3/3258; G09G 2300/0426; G09G 2320/00; G09G 2320/045; H10K 59/1213;
(Continued)

(56) References Cited

U.S. PATENT DOCUMENTS 10,651,264 B2    5/2020  An et al.
11,437,457 B2    9/2022  Yang et al.
(Continued)

FOREIGN PATENT DOCUMENTS

CN    103903558 A    7/2014
CN    104465711 A    3/2015
(Continued)

OTHER PUBLICATIONS

Written Opinion from PCT/CN2022/096377 dated Feb. 27, 2023.
(Continued)

*Primary Examiner* — Joe H Cheng
(74) *Attorney, Agent, or Firm* — Calfee, Halter & Griswold LLP

(57) ABSTRACT

A display panel includes a pixel drive circuit for driving a light emitting unit. The pixel drive circuit is connected to the first electrode of the light emitting unit, and the display panel further includes: a base substrate, a first power line, a second power line, and a common electrode layer. The first power line and the second power line are located a the display area of the display panel, the orthographic projection of the first power line on the base substrate is extended along the first direction, the orthographic projection of the second power line on the base substrate is extended along the second direction, and the second direction is intersected with the first direction, at least a part of the second power line is connected to at least a part of the first power line through a via hole.

26 Claims, 58 Drawing Sheets

(51) Int. Cl.
  *H10K 59/131* (2023.01)
  *H10D 86/40* (2025.01)
  *H10D 86/60* (2025.01)

(58) Field of Classification Search
  CPC . H10K 59/1216; H10K 59/131; H01L 27/124
  See application file for complete search history.

(56) References Cited

U.S. PATENT DOCUMENTS

| | | | |
|---|---|---|---|
| 11,482,170 | B2 | 10/2022 | Feng et al. |
| 2002/0158835 | A1 | 10/2002 | Kobayashi et al. |
| 2017/0323598 | A1 | 11/2017 | Park et al. |
| 2018/0190752 | A1 | 7/2018 | An et al. |
| 2020/0321428 | A1 | 10/2020 | An et al. |
| 2021/0367021 | A1 | 11/2021 | Yang et al. |
| 2022/0114958 | A1 | 4/2022 | Feng et al. |
| 2022/0262889 | A1 | 8/2022 | Song et al. |
| 2022/0310010 | A1 | 9/2022 | Cheng et al. |
| 2024/0161696 | A1 | 5/2024 | Sasakura et al. |
| 2024/0306445 | A1 | 9/2024 | Zhang et al. |
| 2024/0373690 | A1 | 11/2024 | Zhang et al. |
| 2024/0423037 | A1* | 12/2024 | Zhang ................. H10K 59/131 |

FOREIGN PATENT DOCUMENTS

| | | | |
|---|---|---|---|
| CN | 105679795 | A | 6/2016 |
| CN | 106205446 | A | 12/2016 |
| CN | 107978622 | A | 5/2018 |
| CN | 110600528 | A | 12/2019 |
| CN | 110634911 | A | 12/2019 |
| CN | 111128080 | A | 5/2020 |
| CN | 111584757 | A | 8/2020 |
| CN | 113196374 | A | 7/2021 |
| CN | 113437233 | A | 9/2021 |
| CN | 113517322 | A | 10/2021 |
| CN | 214477457 | U | 10/2021 |
| CN | 113823671 | A | 12/2021 |
| CN | 114122101 | A | 3/2022 |
| CN | 114388558 | A | 4/2022 |
| CN | 114530473 | A | 5/2022 |
| EP | 3343633 | A1 | 7/2018 |
| EP | 3343633 | B1 | 3/2021 |
| EP | 3848973 | A1 | 7/2021 |
| EP | 4068260 | A1 | 10/2022 |
| WO | 2022083348 | A1 | 4/2022 |
| WO | 2022088959 | A1 | 5/2022 |

OTHER PUBLICATIONS

International Search Report from PCT/CN2022/096377 dated Feb. 27, 2023.
Allowance from Chinese Application No. 202280001564.X dated Mar. 26, 2023.
Office action from Chinese Application No. 202280001564.X dated Jan. 6, 2023.
Yang et al, "A Method to Improve IR Drop Issue of Large-Size Top-Emission AMOLED", J. Phys, Conf. Ser. 1914, 2021, 7 pgs.
Seong et al., "CMOS Backplane Pixel Circuit with Leakage and Voltage Drop Compensation for an Micro-LED Display Achieving 5000 PPI or Higher", IEEE Access, vol. 8, 2020, 10 pgs.
Non-final OA of U.S. Appl. No. 18/398,064 dated Sep. 27, 2024.
Non-final OA of U.S. Appl. No. 18/398,042 dated Dec. 6, 2024.

* cited by examiner

DISPLAY PANEL AND DISPLAY DEVICE

CROSS REFERENCE

The present application is a continuation application of U.S. patent application Ser. No. 18/257,303, filed on Jun. 14, 2023, which is based upon International Application No. PCT/CN2022/096377, filed on May 31, 2022, and the entire contents thereof are incorporated herein by reference.

TECHNICAL FIELD

The present disclosure relates to the field of display technology, and in particular, to a display panel and a display device.

BACKGROUND

In the related art, one electrode of the light emitting unit in the display panel shares a common electrode.

It should be noted that, information disclosed in the above background portion is provided only for better understanding of the background of the present disclosure, and thus it may contain information that does not form the prior art known by those ordinary skilled in the art.

SUMMARY

According to one aspect of the present disclosure, a display panel is provided, wherein the display panel includes a display area, a light emitting unit located in the display area, and a pixel driving circuit for driving the light emitting unit, the pixel driving circuit is connected to a first electrode of the light emitting unit, and the display panel further includes: a base substrate, a first power line, a second power line, and a common electrode layer, the first power line is located in the display area of the display panel, and an orthographic projection of the first power line on the base substrate is extended along a first direction; the second power line is located in the display area of the display panel, and an orthographic projection of the second power line on the base substrate is extended along a second direction, the second direction intersects the first direction, at least part of the second power line is connected to at least part of the first power line through a via hole; the common electrode layer is located on a side of the base substrate, the common electrode layer is used to form a second electrode of the light emitting unit, and the common electrode layer is connected to the first power line and the second power line.

In an exemplary embodiment of the present disclosure, both ends of the first power line are respectively connected to the common electrode layer, and both ends of the second power line are respectively connected to the common electrode layer.

In an exemplary embodiment of the present disclosure, each of the first power line is connected to each of the second power line intersecting its orthographic projection on the base substrate through a via hole.

In an exemplary embodiment of the present disclosure, the pixel driving circuit includes a driving transistor and a seventh transistor, a first electrode of the seventh transistor is connected to a second initial signal line, and a second electrode of the seventh transistor is connected to the first electrode of the light emitting unit. the display panel further includes: a first active layer, disposed between the base substrate and the common electrode layer, the first active layer includes a third active part and a seventh active part, and the third active part is used for forming a channel region of the driving transistor, and the seventh active part is used for forming a channel region of the seventh transistor; the orthographic projection of the second power line on the base substrate is at least partly overlapped with an orthographic projection of third active part on the base substrate, and the orthographic projection of the second power line on the base substrate is at least partly overlapped with an orthographic projection of seventh active part on the base substrate.

In an exemplary embodiment of the present disclosure, the pixel driving circuit includes an N-type transistor and a P-type transistor, and the display panel further includes: a first active layer, a second active layer, and a third conductive layer. The first active layer is disposed between the base substrate and the common electrode layer, wherein a part of the first active layer is used to form a channel region of the P-type transistor; the second active layer is disposed between the base substrate and the common electrode layer, wherein a part of the second active layer is used to form a channel region of the N-type transistor; and the third conductive layer is disposed between the second active layer and the common electrode layer, wherein a part of the third conductive layer is used to form a top gate electrode of the N-type transistor; wherein, at least part of the first power line is located at the third conductive layer.

In an exemplary embodiment of the present disclosure, the pixel driving circuit includes a driving transistor and a fifth transistor, a first electrode of the fifth transistor is connected to a third power line, and a second electrode of the fifth transistor is connected to a first electrode of the driving transistor. The display panel further includes: a fifth conductive layer, disposed between the base substrate and the common electrode layer, the fifth conductive layer including the third power line; wherein at least part of the second power line is located at the fifth conductive layer.

In an exemplary embodiment of the present disclosure, the display panel further includes: a third conductive layer, a fourth conductive layer, and a fifth conductive layer, wherein the third conductive layer is disposed between the base substrate and the common electrode layer, wherein the first power line is located at the third conductive layer; the fourth conductive layer is disposed between the third conductive layer and the common electrode layer, wherein the fourth conductive layer includes a seventh bridging part; and the fifth conductive layer is disposed between the fourth conductive layer and the common electrode layer, wherein the second power line is located at the fifth conductive layer; wherein, an orthographic projection of the seventh bridging part on the base substrate is at least partially overlapped with an orthographic projection of the first power line on the base substrate, the orthographic projection of the seventh bridging part on the base substrate is at least partially overlapped with an orthographic projection of the second power line on the base substrate, and the seventh bridging part is respectively connected to the first power line and the second power line through via holes.

In an exemplary embodiment of the present disclosure, the pixel driving circuit includes: a driving transistor, a sixth transistor, and a seventh transistor, the first electrode of the sixth transistor is connected to a second electrode of the driving transistor, a second electrode of the sixth transistor is connected to a first electrode of the light emitting unit, a first electrode of the seventh transistor is connected to a second initial signal line, and a second electrode of the seventh transistor is connected to the first electrode of the light emitting unit; wherein the display panel further includes: a first active layer, disposed between the base substrate and the third conductive layer, the first active layer includes a sixth active part, a seventh active part, and a tenth active part, the sixth active part is used to form a channel region of the sixth transistor, the seventh active part is used to form a channel region of the seventh transistor, and the tenth active part is connected between the sixth active part and the seventh active part; an orthographic projection of the seventh bridging part on the base substrate is at least partially overlap with an orthographic projection of the tenth active part on the base substrate.

In an exemplary embodiment of the present disclosure, the pixel driving circuit further includes a fourth transistor, a first electrode of the fourth transistor is connected to a data line, and a second electrode of the fourth transistor is connected to the first electrode of the driving transistor; the fifth conductive layer further includes the data line; wherein, an orthographic projection of the data line on the base substrate and an orthographic projection of the third power line on the base substrate are extended along the second direction, and in a same column of pixel driving circuit, the orthographic projection on the base substrate, of the second power line at the fifth conductive layer, is located between the orthographic projection of the data line on the base substrate and the orthographic projection of the third power line on the base substrate.

In an exemplary embodiment of the present disclosure, the first direction is a row direction, and the second direction is a column direction, the display panel includes a plurality of repeating units distributed along the row and column directions, each repeating unit includes a first pixel driving circuit and a second pixel driving circuit distributed along the row direction, and the first pixel driving circuit and the second pixel driving circuit are mirror-symmetrically disposed; the pixel driving circuit includes a driving transistor and a capacitor, a first electrode of the capacitor is connected to a gate electrode of the driving transistor, a second electrode of the capacitor is connected to a third power line, and the display panel further includes: a second conductive layer and a fifth conductive layer, the second conductive layer is disposed between the base substrate and the common electrode layer, wherein the second conductive layer includes: a first conductive part, and the first conductive part is used to form the second electrode of the capacitor; and the fifth conductive layer is disposed between the second conductive layer and the common electrode layer, the fifth conductive layer includes the third power line, and each column of the pixel driving circuit is correspondingly provided with one third power line, and the third power line includes: a first extension part, a second extension part, and a third extension part, and the second extension part is connected between the first extension part and the third extension part; a size in the row direction, of an orthographic projection of the second extension part on the base substrate, is greater than a size in the row direction, of an orthographic projection of the first extension part on the base substrate, and the size in the row direction, of the orthographic projection of the second extension part on the base substrate, is greater than a size in the row direction, of an orthographic projection of the third extension part on the base substrate; wherein, in a same repeating unit, the second extension parts in two adjacent third power lines are connected, and in the repeating units adjacent in the row direction, two adjacent first conductive parts are connected.

In an exemplary embodiment of the present disclosure, the second conductive layer further includes a first connection part, and in the repeating units adjacent in the row direction, adjacent first conductive parts pass are connected by the first connection part; the pixel driving circuit further includes a fifth transistor, a first electrode of the fifth transistor is connected to a third power line, and a second electrode of the fifth transistor is connected to a first electrode of the driving transistor. The display panel further includes: a first active layer, and a fourth conductive layer, the first active layer is disposed between the base substrate and the second conductive layer, and the first active layer includes: a third active part, a fifth active part, and a ninth active part, the third active part is used to form the channel region of the driving transistor, and the fifth active part is used to forming the channel region of the fifth transistor, the ninth active part is connected to a side of the fifth active part away from the third active part, and the ninth active part is connected between two adjacent fifth active parts in the repeating units adjacent in the row direction. The fourth conductive layer is disposed between the second conductive layer and the fifth conductive layer, and the fourth conductive layer includes: a first bridging part, the first bridging part is respectively connected to the ninth active part and the first connection part through a via hole, and the first bridging part is connected to the third power line through a via hole.

In an exemplary embodiment of the present disclosure, the pixel driving circuit includes a driving transistor, a first transistor, a second transistor, and a capacitor, a first electrode of the first transistor is connected to a gate electrode of the driving transistor, and a second electrode of the first transistor is connected to the first initial signal line, a first electrode of the second transistor is connected to the gate electrode of the driving transistor, a second electrode of the second transistor is connected to a second electrode of the driving transistor, a first electrode of the capacitor is connected to the gate electrode of the driving transistor, and a second electrode of the capacitor is connected to the third power line. The display panel further includes: a first active layer, a first conductive layer, a second active layer, a fourth conductive layer, and a fifth conductive layer, the first active layer is located between the base substrate and the common electrode layer, the first active layer includes a third active part, and the third active part is used to form the channel region of the driving transistor; the first conductive layer is located between the first active layer and the common electrode layer, the first conductive layer includes a second conductive part, and an orthographic projection of the second conductive part on the base substrate covers an orthographic projection of the third active part on the base substrate, the second conductive part is used to form the gate electrode of the driving transistor and the first electrode of the capacitor; the second active layer is located between the first conductive layer and the common electrode layer, the second active layer includes: a first active part, a second active part, and a fifteenth active part connected between the first active part and the second active part, the first active part is used to form the channel region of the first transistor, and the second active part is used to form the channel region of the second transistor; the fourth conductive layer is located between the second active layer and the common electrode layer, the fourth conductive layer includes a fourth bridging part, and the fourth bridging part is respectively connected to the fifteenth active part and the second conductive part through via holes; the fifth conductive layer is located between the fourth conductive layer and the common electrode layer, the fifth conductive layer includes the third power line, and the orthographic projection of the third power line on the base substrate covers the orthographic projection of the first active part on the base substrate, the orthographic projection of the second active part on the base substrate, and the orthographic projection of the fourth bridging part on the base substrate.

In an exemplary embodiment of the present disclosure, the pixel driving circuit includes a driving transistor, a fourth transistor, a fifth transistor, a sixth transistor, a seventh transistor, and a capacitor, and a first electrode of the fourth transistor connected to a data line, a second electrode of the fourth transistor is connected to a first electrode of the driving transistor, a first electrode of the fifth transistor is connected to a third power line, and a second electrode of the fifth transistor is connected to the first electrode of the driving transistor, a first electrode of the sixth transistor is connected to a second electrode of the driving transistor, a second electrode of the seventh transistor is connected to a second electrode of the sixth transistor, and a first electrode of the seventh transistor is connected to a second initial signal line, a first electrode of the capacitor is connected to a gate electrode of the driving transistor, and a second electrode of the capacitor is connected to the third power line. The display panel further includes: a first active layer and a first conductive layer, the first active layer is disposed between the base substrate and the common electrode layer, wherein the first active layer includes: a third active part, a fourth active part, a fifth active part, a sixth active part and a seventh active part, the third active part is used to form a channel region of the driving transistor; the fourth active part is used to form a channel region of the fourth transistor; the fifth active part is used to form a channel region of the fifth transistor; the sixth active part is used to form the channel region of the sixth transistor; and the seventh active part is used to form a channel region of the seventh transistor; a first conductive layer, disposed between the first active layer and the common electrode layer, wherein the first conductive layer includes: a second gate line, an enable signal line, a second reset signal line, and a second conductive part, an orthographic projection of the second gate line on the base substrate is extended along the first direction and covers an orthographic projection of the fourth active part on the base substrate, a part of the second gate line is used to form a gate electrode of the fourth transistor; an orthographic projection of the enable signal line on the base substrate is extended along the first direction and covers an orthographic projection of the fifth active part on the base substrate and an orthographic projection of the sixth active part on the base substrate, a part of the enable signal line is used to form a gate electrode of the sixth transistor, and another part of the enable signal line is used to form a gate electrode of the fifth transistor; an orthographic projection of the second reset signal line on the base substrate is extended along the first direction and covers an orthographic projection of the seventh active part on the base substrate, and a part of the second reset signal line is used to form a gate electrode of the seventh transistor; and an orthographic projection of the second conductive part on the base substrate covers an orthographic projection of the third active part on the base substrate, and the second conductive part is used to form the gate electrode of the driving transistor and the first electrode of the capacitor; wherein, in a same pixel driving circuit, the orthographic projection of the second conductive part on the base substrate is located between the orthographic projection of the second gate line on the base substrate and the orthographic projection of the enable signal line on the base substrate; and wherein an orthographic projection of the second reset signal line on the base substrate is located at a side of the orthographic projection of the enable signal line on the base substrate away from the orthographic projection of the second conductive part.

In an exemplary embodiment of the present disclosure, the second gate line in a row of pixel driving circuit is multiplexed as the second reset signal line in a previous row of pixel driving circuit.

In an exemplary embodiment of the present disclosure, the pixel driving circuit further includes a first transistor and a second transistor, a first electrode of the first transistor is connected to the gate electrode of the driving transistor, a second electrode of the first transistor is connected to a first initial signal line, a first electrode of the second transistor is connected to the gate electrode of the driving transistor, and a second electrode of the second transistor is connected to the second electrode of the driving transistor, wherein the display panel further includes: a second active layer and a third conductive layer, the second active layer is disposed between the first conductive layer and the common electrode layer, the second active layer includes: a first active part and a second active part, the first active part is used to form a channel region of the first transistor; and the second active part is used to form a channel region of the second transistor. The third conductive layer is disposed between the second active layer and the common electrode layer, the third conductive layer comprising: a first reset signal line and a first gate line, an orthographic projection of the first reset signal line on the base substrate covers an orthographic projection of the first active part on the base substrate, and a part of the first reset signal line is used to form a top gate electrode of the first transistor; and an orthographic projection of the first gate line on the base substrate covers an orthographic projection of the second active part on the base substrate, and a part of the first gate line is used to form a top gate electrode of the second transistor; in a same pixel driving circuit, the orthographic projection of the first gate line on the base substrate is located between the orthographic projection of the second conductive part on the base substrate and the orthographic projection of the second gate line on the base substrate, and the orthographic projection of the first reset signal line on the base substrate is located at a side of the orthographic projection of the second conductive part on the base substrate away from the orthographic projection of the second conductive part on the base substrate.

In an exemplary embodiment of the present disclosure, the display panel further includes a second conductive layer disposed between the first conductive layer and the second active layer, and the second conductive layer includes: a first initial signal line, a third reset signal line, and a third gate line, an orthographic projection of the first initial signal line on the base substrate is located at a side of the orthographic projection of the first reset signal line on the base substrate away from the orthographic projection of the second conductive part on the base substrate; the third reset signal line is connected to the first reset signal line through a via hole, and an orthographic projection of the third reset signal line on the base substrate covers the orthographic projection of the first active part on the base substrate, and a part of the third reset signal line is used to form a bottom gate electrode of the first transistor; and an orthographic projection of the third gate line on the base substrate covers the orthographic projection of the second active part on the base substrate, and a part of the third gate line is used to form a bottom gate electrode of the second transistor.

In an exemplary embodiment of the present disclosure, the pixel driving circuit includes a seventh transistor, a first electrode of the seventh transistor is connected to a second initial signal line, and a second electrode of the seventh transistor is connected to a first electrode of the light emitting unit. The display panel further includes: a fourth conductive layer, disposed between the base substrate and the common electrode layer, wherein the fourth conductive layer includes a fourth bridging part, and the fourth bridging part is connected to a gate electrode of the driving transistor through a via hole; wherein the second initial signal line is located at the fourth conductive layer.

In an exemplary embodiment of the present disclosure, the display panel further includes: a third conductive layer, disposed between the first conductive layer and the common electrode layer; at least a part of the first power line is located at the third conductive layer, and the orthographic projection on the substrate, of the first power line at the third conductive layer, is located between the orthographic projection of the second conductive part on the base substrate and the orthographic projection of the second reset signal line on the base substrate, and the orthographic projection on the substrate, of the first power line at the third conductive layer, is at least partially overlapped with the orthographic projection of the enable signal line on the base substrate.

In an exemplary embodiment of the present disclosure, an area of the orthographic projection on the substrate, of the first power line at the third conductive layer, is S1; and an overlapping area between the orthographic projection of the enable signal line on the base substrate and the orthographic projection on the substrate, of the first power line at the third conductive layer, is S2, wherein S2/S1 is greater than or equal to 80%.

In an exemplary embodiment of the present disclosure, the first transistor and the second transistor are N-type transistors; and the driving transistor, the fourth transistor, the fifth transistor, the sixth transistor and the seventh transistor are P-type transistors.

In an exemplary embodiment of the present disclosure, the display area includes a fan-out area, and a normal display area; a plurality of the first power lines comprise a first sub-power line, two first cutouts located in the fan-out area are formed on the first sub-power line, and the first sub-power line includes a first sub-power line segment located between the two first cutouts; a plurality of the second power lines comprise a second sub-power line, second cutouts located in the fan-out area are formed on the second sub-power line, the second sub-power line includes a second sub-power line segment spaced by the second cutouts, and the second sub-power line segment is located in the fan-out area; the display panel further includes a plurality of data lines, orthographic projections of the data lines on the base substrate are extended along the second direction, and the plurality of data lines comprise a first data line; wherein, the first data line is connected to the first sub-power line segment, and the first sub-power line segment is connected to the second sub-power line segment.

In an exemplary embodiment of the present disclosure, the display panel further includes: a third conductive layer, a fourth conductive layer, and a fifth conductive layer, the third conductive layer is disposed between the base substrate and the common electrode layer, wherein the third conductive layer includes the first sub-power line; the fourth conductive layer is disposed between the third conductive layer and the common electrode layer, wherein the fourth conductive layer includes: a seventh bridging part and a tenth bridging part; and the fifth conductive layer is disposed between the fourth conductive layer and the common electrode layer, wherein the fifth conductive layer includes the first data line and the second sub-power line; wherein, the first data line is connected to the tenth bridging part through a via hole, the tenth bridging part is connected to the first sub-power line segment through a via hole, the seventh bridging part is connected to the first sub-power line segment through a via hole, and the second sub-power line segment is connected to the seventh bridging part through a via hole.

In an exemplary embodiment of the present disclosure, the display panel further includes: a first signal line and a second signal line, the first signal line is disposed corresponding to a row of the pixel driving circuit, wherein an orthographic projection of the first signal line on the base substrate is extended along the first direction; and the second signal line is disposed corresponding to a column of the pixel driving circuit, wherein an orthographic projection of the second signal line on the base substrate is extended along the second direction; wherein the display panel further includes a dummy pixel row and a dummy pixel column in the display area, wherein the first signal line in the dummy pixel row is multiplexed as the first power line, and the second signal line in the dummy pixel columns is multiplexed as the second power line.

In an exemplary embodiment of the present disclosure, the pixel driving circuit includes a driving transistor and a fifth transistor, a first electrode of the fifth transistor is connected to a third power line, a second electrode of the fifth transistor is connected to a first electrode of the driving transistor, and a gate electrode of the fifth transistor is connected to an enable signal line; and the first signal line includes the enable signal line.

In an exemplary embodiment of the present disclosure, the pixel driving circuit includes a driving transistor and a fourth transistor, a first electrode of the fourth transistor is connected to a data line, and a second electrode of the fourth transistor is connected to a first electrode of the driving transistor; and the second signal line includes the data line.

In an exemplary embodiment of the present disclosure, the pixel driving circuit includes a driving transistor and a capacitor, a first electrode of the capacitor is connected to a gate electrode of the driving transistor, and a second electrode of the capacitor is connected to a third power line, wherein the display panel further includes: a second conductive layer and a fourth conductive layer, the second conductive layer is disposed between the base substrate and the common electrode layer, wherein the second conductive layer includes: a first conductive part, and the first conductive part is used to form the second electrode of the capacitor; and the fourth conductive layer is disposed between the second conductive layer and the common electrode layer, wherein the fourth conductive layer includes: a first bridging part, and the first bridging part is connected to the first conductive part through a via hole; wherein, in the dummy pixel row, the first bridging parts are connected to each other, and the first signal line includes a signal line formed by the connected first bridging parts.

In an exemplary embodiment of the present disclosure, the pixel driving circuit further includes a fourth transistor, a first electrode of the fourth transistor is connected to a data line, and a second electrode of the fourth transistor is connected to the driving transistor, and the gate electrode of the fourth transistor is connected to a second gate line; the first signal line includes the second gate line.

In an exemplary embodiment of the present disclosure, the pixel driving circuit includes a driving transistor, and the display panel further includes: a fourth conductive layer, disposed between the base substrate and the common electrode layer, wherein the fourth conductive layer includes a fourth bridging part, and the fourth bridging part is connected to a gate electrode of the driving transistor through a via hole; at least part of the first power line is located at the fourth conductive layer.

In an exemplary embodiment of the present disclosure, the pixel driving circuit includes a driving transistor, and the display panel further includes: a first active layer and a light-shielding layer, the first active layer is disposed between the base substrate and the common electrode layer, wherein the first active layer includes a third active part, and the third active part is used to form a channel area of the driving transistor; and the light-shielding layer is disposed between the base substrate and the first active layer, wherein the light-shielding layer includes a light-shielding part, and an orthographic projection of the light-shielding part on the base substrate covers an orthographic projection of the third active part on the base substrate; at least a part of the second power line is located at the light-shielding layer.

In an exemplary embodiment of the present disclosure, the pixel driving circuit includes a driving transistor and a capacitor, a first electrode of the capacitor is connected to a gate electrode of the driving transistor, and a second electrode of the capacitor is connected to a third power line; wherein the display panel further includes: a second conductive layer, disposed between the base substrate and the common electrode layer, wherein the second conductive layer includes a first conductive part, and the first conductive part is used to form the second electrode of the capacitor; at least a part of the first power line is located at the second conductive layer.

In an exemplary embodiment of the present disclosure, the pixel driving circuit includes a driving transistor, a fourth transistor, and a capacitor, a first electrode of the fourth transistor is connected to a data line, a second electrode of the fourth transistor is connected to a first electrode of the driving transistor, a first electrode of the capacitor is connected to a gate electrode of the driving transistor, and a second electrode of the capacitor is connected to a third power line. The display panel further includes: a first active layer and a second conductive layer, the first active layer is disposed between the base substrate and the common electrode layer, wherein the first active layer includes a third active part, a fourth active part, and a nineteenth active part, the third active part is used to form a channel region of the driving transistor, the fourth active part is used to form a channel region of the fourth transistor, and the nineteenth active part is connected between the third active part and the fourth active part, a size of an orthographic projection of the nineteenth active part on the base substrate in the first direction is larger than a size of an orthographic projection of the fourth active part on the base substrate in the first direction; and the second conductive layer is disposed between the first active layer and the common electrode layer, wherein the second conductive layer includes a first conductive part and a fourth conductive part, the first conductive part is used to form the second electrode of the capacitor, the fourth conductive part is connected to the first conductive part, and an orthographic projection of the fourth conductive part on the substrate is at least partly overlapped with an orthographic projection of the nineteenth active part on the base substrate.

In an exemplary embodiment of the present disclosure, the pixel driving circuit includes a P-type transistor, and the display panel further includes: a first active layer, a first conductive layer, and a fourth conductive layer, and the first active layer is located between the base substrate and the common electrode layer, a part of the first active layer is used to form the channel region of the P-type transistor; the first conductive layer is located between the first active layer and the common electrode layer, the first conductive layer includes a first gate drive signal line, the first gate drive signal line includes a plurality of first gate drive signal line segments, and the orthographic projections of the first gate drive signal line segments on the base substrate are distributed at intervals along the first direction and extend along the first direction, and a part of the first gate driving signal line segment is used to form the gate electrode of the P-type transistor; the fourth conductive layer is located between the first conductive layer and the common electrode layer, the fourth conductive layer includes a first connection line, and the orthographic projection of the first connection line on the base substrate is extended along the first direction, and the first connection line is connected to the first gate driving signal line segment in the same first gate driving signal line through via holes, respectively; wherein, the sheet resistance of the fourth conductive layer is smaller than the sheet resistance of the first conductive layer.

In an exemplary embodiment of the present disclosure, the pixel driving circuit includes an N-type transistor, and the display panel further includes: a second active layer, a third conductive layer, and a fourth conductive layer, the second active layer is located between the first conductive layer and the common electrode layer, a part of the second active layer is used to form the channel region of the N-type transistor; the third conductive layer is located between the second active layer and the common electrode layer, the third conductive layer includes a second gate driving signal line, the second gate driving signal line includes a plurality of second gate driving signal line segments, and the orthographic projections of the second gate driving signal line segments on the base substrate are distributed at intervals along the first direction and extend along the first direction, and a part of the second gate driving signal line segment is used to form the gate electrode of the N-type transistor; the fourth conductive layer is located between the third conductive layer and the common electrode layer, the fourth conductive layer includes a second connection line, and the orthographic projection of the second connection line on the base substrate is extended in the first direction, and the second connections line is connected to the second gate driving signal line segment in the same second gate driving signal line through via holes, respectively; wherein, the sheet resistance of the fourth conductive layer is smaller than the sheet resistance of the third conductive layer.

According to one aspect of the present disclosure, a display device is provided, the display device includes the above display panel.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
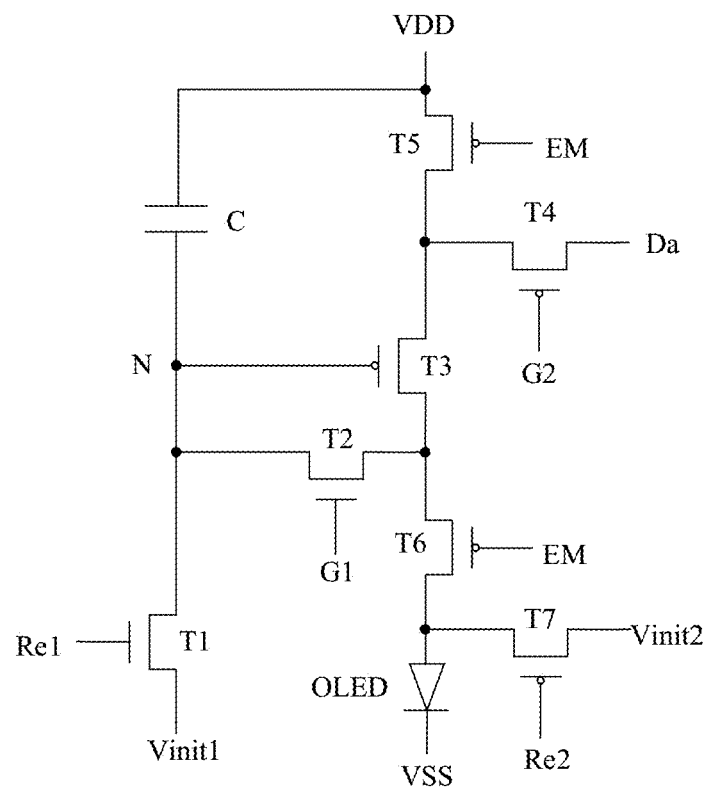
FIG. 1 is a schematic diagram of a circuit structure of a pixel driving circuit in a display panel of the present disclosure.

Example embodiments will now be described more fully with reference to the accompanying drawings. Example embodiments may, however, be embodied in many forms and should not be construed as limited to the examples set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

The terms "a", "an" and "the" are used to indicate the presence of one or more elements/components/etc. The terms "comprising" and "having" are used in an open inclusive sense and mean that there may be additional elements/components/etc. in addition to the listed elements/components/etc.

As shown in FIG. 1, which is a schematic diagram of a circuit structure of a pixel driving circuit in a display panel of the present disclosure. The pixel driving circuit may include: a driving transistor T3, a first transistor T1, a second transistor T2, a fourth transistor T4, a fifth transistor T5, a sixth transistor T6, a seventh transistor T7, and a capacitor C. Wherein, the first electrode of the fourth transistor T4 is connected to the data signal terminal Da, the second electrode of the fourth transistor T4 is connected to the first electrode of the driving transistor T3, and the gate electrode of the fourth transistor T4 is connected to the second gate driving signal terminal G2. The first electrode of the fifth transistor T5 is connected to the first power supply terminal VDD, the second electrode of the fifth transistor T5 is connected to the first electrode of the driving transistor T3, and the gate electrode of the fifth transistor T5 is connected to the enable signal terminal EM. The gate electrode of the driving transistor T3 is connected to the node N. The first electrode of the second transistor T2 is connected to the node N, the second electrode of the second transistor T2 is connected to the second electrode of the driving transistor T3, and the gate electrode of the second transistor T2 is connected to the first gate driving signal terminal G1. The first electrode of the sixth transistor T6 is connected to the second electrode of the driving transistor T3, the second electrode of the sixth transistor T6 is connected to the second electrode of the seventh transistor T7, and the gate electrode of the sixth transistor T6 is connected to the enable signal terminal EM. The first electrode of the seven transistor T7 is connected to the second initial signal terminal Vinit2, and the gate electrode of the seventh transistor T7 is connected to the second reset signal terminal Re2. The second electrode of the first transistor T1 is connected to the node N, the first electrode of the first transistor T1 is connected to the first initial signal terminal Vinit1, and the gate electrode of the first transistor T1 is connected to the first reset signal terminal Re1. The first electrode of the capacitor C is connected to the node N, and the second electrode of the capacitor C is connected to the first power supply terminal VDD. The pixel drive circuit can be connected to a light emitting unit OLED for driving the light emitting unit OLED to emit light, the light emitting unit OLED can be connected between the second electrode of the sixth transistor T6 and the second power supply terminal VSS, the first electrode of the light emitting unit can be is the anode of the light emitting unit, and the second electrode of the light emitting unit may be the cathode of the light emitting unit. Wherein, the first transistor T1 and the second transistor T2 may be N-type transistors, for example, the first transistor T1 and the second transistor T2 can be N-type metal oxide transistors. The N-type transistors have a small leakage current, thereby avoiding the node N from leaking electricity through the first transistor T1 and the second transistor T2 in the light-emitting phase. Meanwhile, the driving transistor T3, the fourth transistor T4, the fifth transistor T5, the sixth transistor T6, and the seventh transistor T7 may be P-type transistors, for example, the driving transistor T3, the fourth transistor T4, the fifth transistor T5, the six transistors T6 and the seventh transistor T7 can be P-type low-temperature polysilicon transistors. The P-type transistors have higher carrier mobility, which is conducive to realizing high resolution, high response speed, high pixel density, and high aperture ratio display panel. The first initial signal terminal and the second initial signal terminal may output the same or different voltage signals according to actual conditions.

Figure 2:
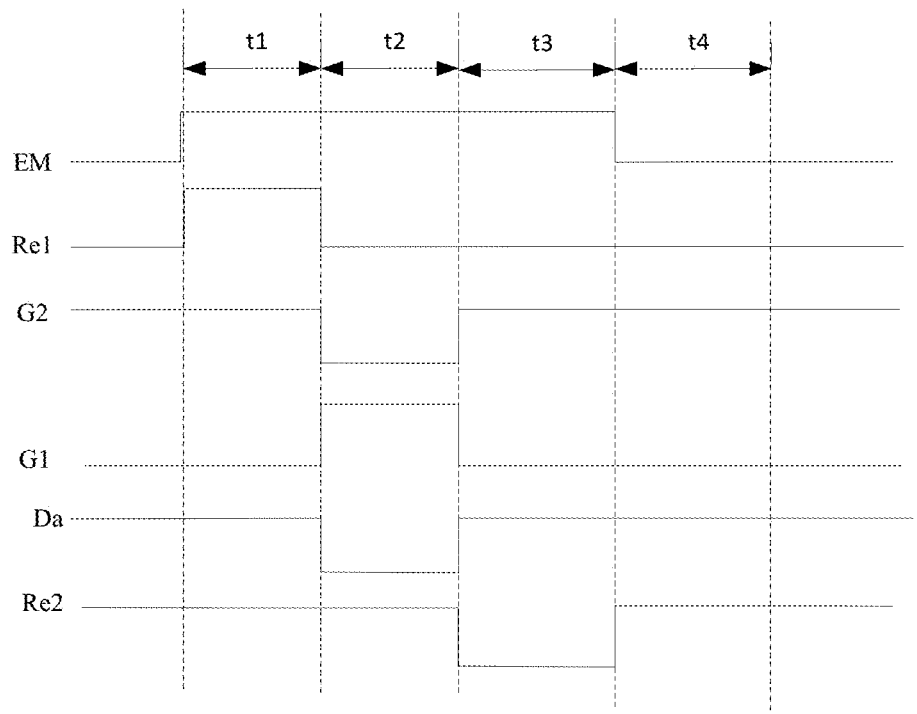
FIG. 2 is a timing diagram of each node in a driving method of the pixel driving circuit in FIG. 1.

As shown in FIG. 2, it is a timing diagram of each node in a driving method of the pixel driving circuit in FIG. 1. Wherein, G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the enable signal terminal EM, and Da represents the timing of the data signal terminal Da. The driving method of the pixel driving circuit may include a first reset phase t1, a data writing phase t2, a second reset phase t3, and a light emitting phase t4. In the first reset phase t1: the first reset signal terminal Re1 outputs a high-level signal, the first transistor T1 is turned on, and the first initial signal terminal Vinit1 inputs an initial signal to the node N. In the data writing phase t2: the first gate drive signal terminal G1 outputs a high-level signal, the second gate drive signal terminal G2 outputs a low-level signal, the fourth transistor T4 and the second transistor T2 are turned on, and the data signal terminal Da outputs a data signal to write the compensation voltage Vdata+Vth to the node N, wherein Vdata is the voltage of the data signal, and Vth is the threshold voltage of the driving transistor T3. In the second reset phase t3, the second reset signal terminal Re2 outputs a low voltage, the seventh transistor T7 is turned on, and the second initial signal terminal Vinit2 inputs an initial signal to the second electrode of the sixth transistor T6. The light-emitting stage t4: the enable signal terminal EM outputs a low-level signal, the sixth transistor T6 and the fifth transistor T5 are turned on, and the driving transistor T3 drives the light emitting unit to emit light under the action of the compensation voltage Vdata+Vth stored in the capacitor C.

The driving transistor output current formula is as follows:

$$I=(\mu W Cox/2L)(Vgs-Vth)^2$$

In the formula, I is the output current of the driving transistor; u is the carrier mobility; Cox is the gate capacitance per unit area, W is the width of the driving transistor channel, L is the length of the driving transistor channel, Vgs is the gate-source voltage of the driving transistor, and Vth is the threshold voltage of the driving transistor. The output current of the driving transistor in the pixel driving circuit of the present disclosure is I=(μWCox/2L)(Vdata+Vth−Vdd−Vth)$^2$. The pixel driving circuit can avoid the influence of the threshold value of the driving transistor on its output current.

In this exemplary embodiment, the second electrodes of the light emitting units OLED in the display panel share a common electrode layer. However, due to the high self-resistance of the common electrode layer, the voltages of the second electrodes of the light emitting units at different positions of the display panel are different, resulting in uneven display of the display panel.

Figure 3A:
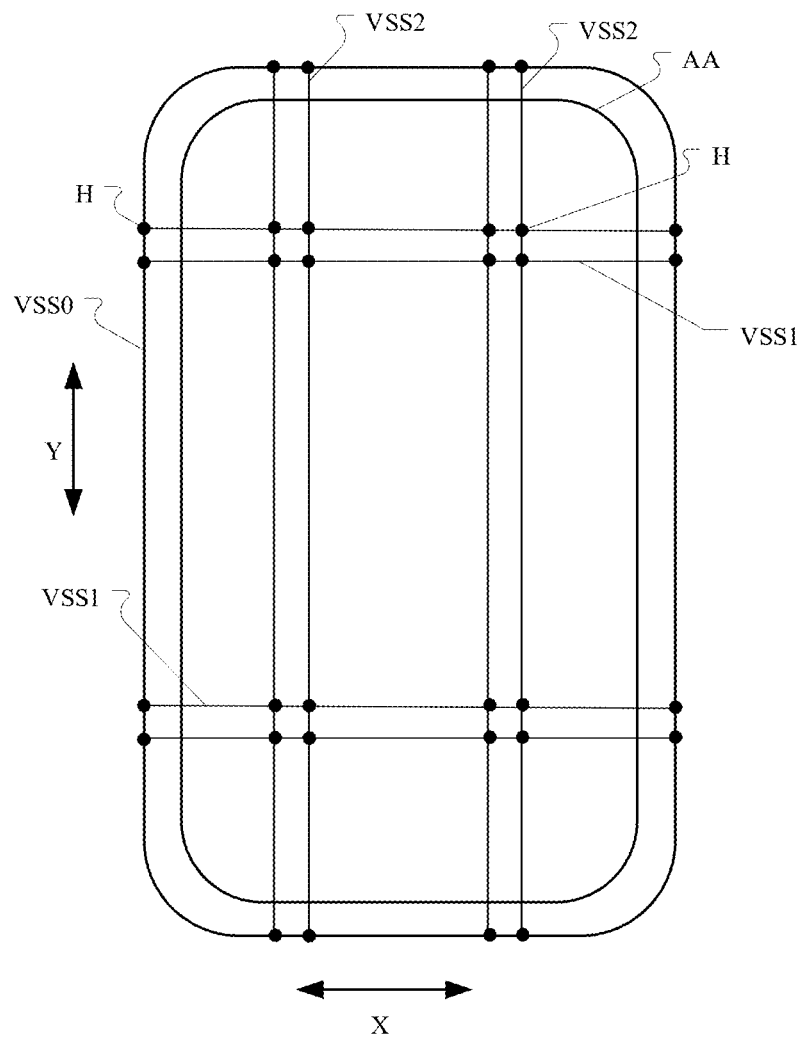
FIG. 3A is a schematic structural diagram of an exemplary embodiment of a display panel of the present disclosure.
Figure 3B:
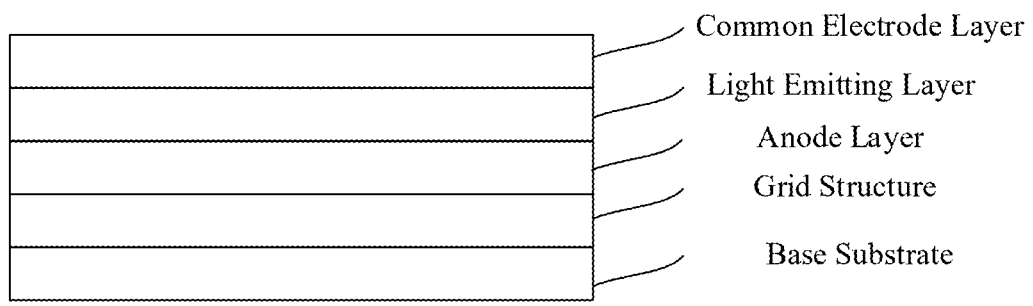
FIG. 3B is a schematic structural diagram of an exemplary embodiment of a display panel of the present disclosure.

Based on this, this exemplary embodiment firstly provides a display panel, as shown in FIG. 3A, which is a schematic structural diagram of the display panel of the present disclosure. As shown in FIG. 3A, the display panel includes a display area AA, an electrode ring VSS0, a first power line VSS1, a second power line VSS2, and a base substrate, the electrode ring VSS0 is located in the frame area around the display area AA, and the orthographic projection of the first power line VSS1 on the base substrate extends along the first direction X, the orthographic projection of the second power line VSS2 on the base substrate extends along the second direction, and the first direction X intersects the second direction Y, for example, the first The direction X is the row direction, and the second direction Y is the column direction. The first power line VSS1 and the second power line VSS2 can be located on different conductive layers, and the first power line VSS1 and the second power line VSS2 intersected by the orthographic projection on the substrate can be connected through the via H to form a grid structure. Wherein, the plurality of first power lines VSS1 may be respectively located in different conductive layers in the display panel, and the plurality of second power lines VSS2 may be respectively located in different conductive layers in the display panel. The first power line VSS1 may be connected to the electrode ring VSS0, the second power line VSS2 may be connected to the electrode ring VSS0, and the electrode ring VSS0 may be connected to the common electrode layer. Therefore, the first power line VSS1 and the second power line VSS2 forming the grid structure can reduce the voltage difference between different positions on the common electrode layer. It should be noted that when the first power line VSS1 and the electrode ring VSS0 are located on different conductive layers, the first power line VSS1 and the electrode ring VSS0 can be connected through via holes; when the first power line VSS1 and the electrode ring VSS0 are located on the same conductive layer, the first power line VSS1 and the electrode ring VSS0 can be directly connected; similarly, when the second power line VSS2 and the electrode ring VSS0 are located in different conductive layers, the second power line VSS2 and the electrode ring VSS0 can be connected through via holes, and when the second power line VSS2 and the electrode ring VSS0 are located on the same conductive layer, the second power line VSS2 and the electrode ring VSS0 can be directly connected. Further, FIG. 3B shows a schematic structural diagram of an exemplary embodiment of a display panel of the present disclosure. As shown in FIG. 3B, the display panel includes the base substrate and the grid structure discussed above with reference with FIG. 3A. Further, the light emitting elements is formed on the grid structure, which include an anode layer, a light emitting layer and a common electrode layer. In the example, the common electrode layer is formed as the common cathode for a plurality of light emitting elements.

The display panel provided in this exemplary embodiment may include the pixel driving circuit shown in FIG. 1, and in other exemplary embodiments, the pixel driving circuit in the display panel may also have other structures.

Figure 4:
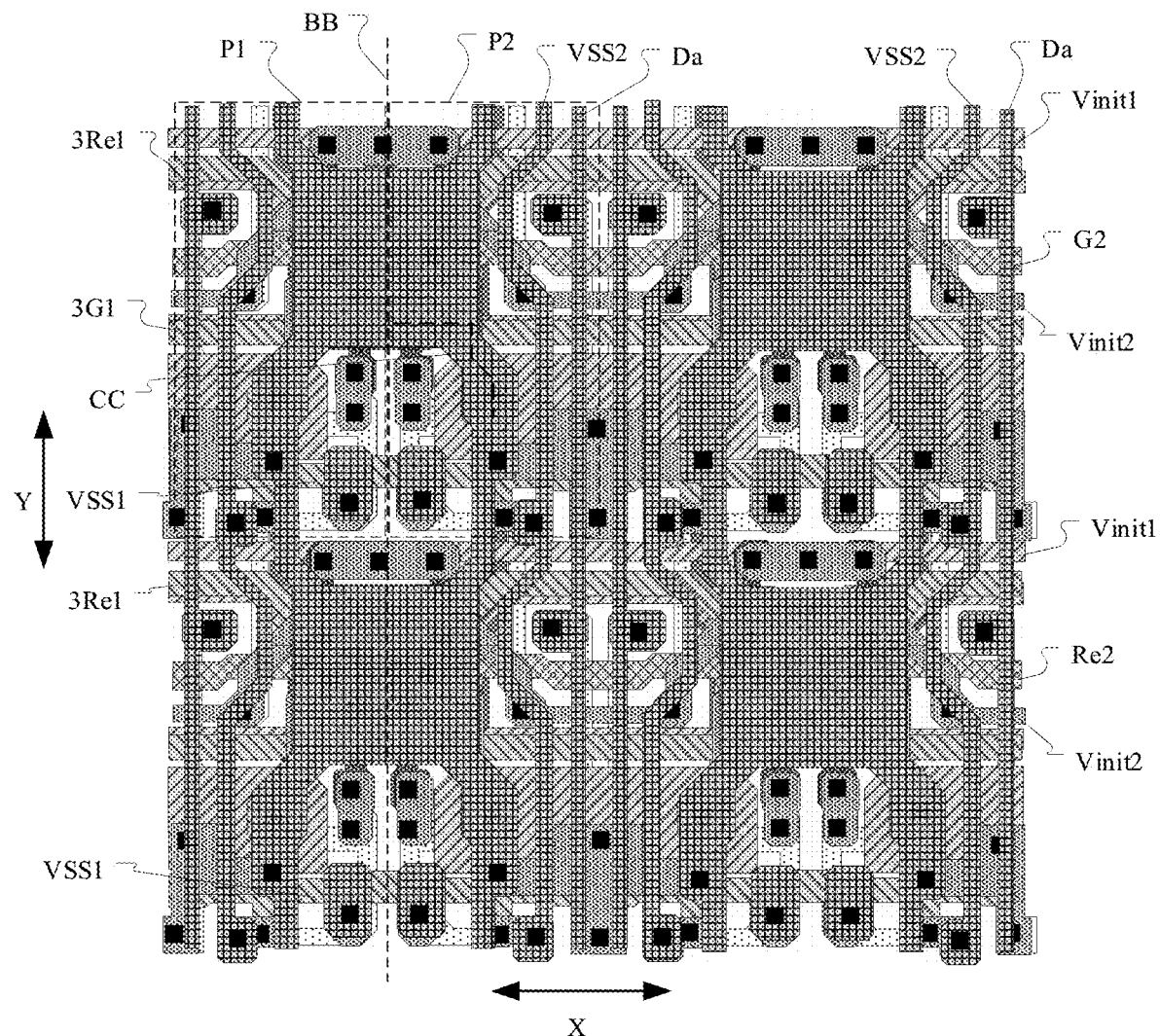
FIG. 4 is a structural layout of an exemplary embodiment of a display panel of the present disclosure.
Figure 5:
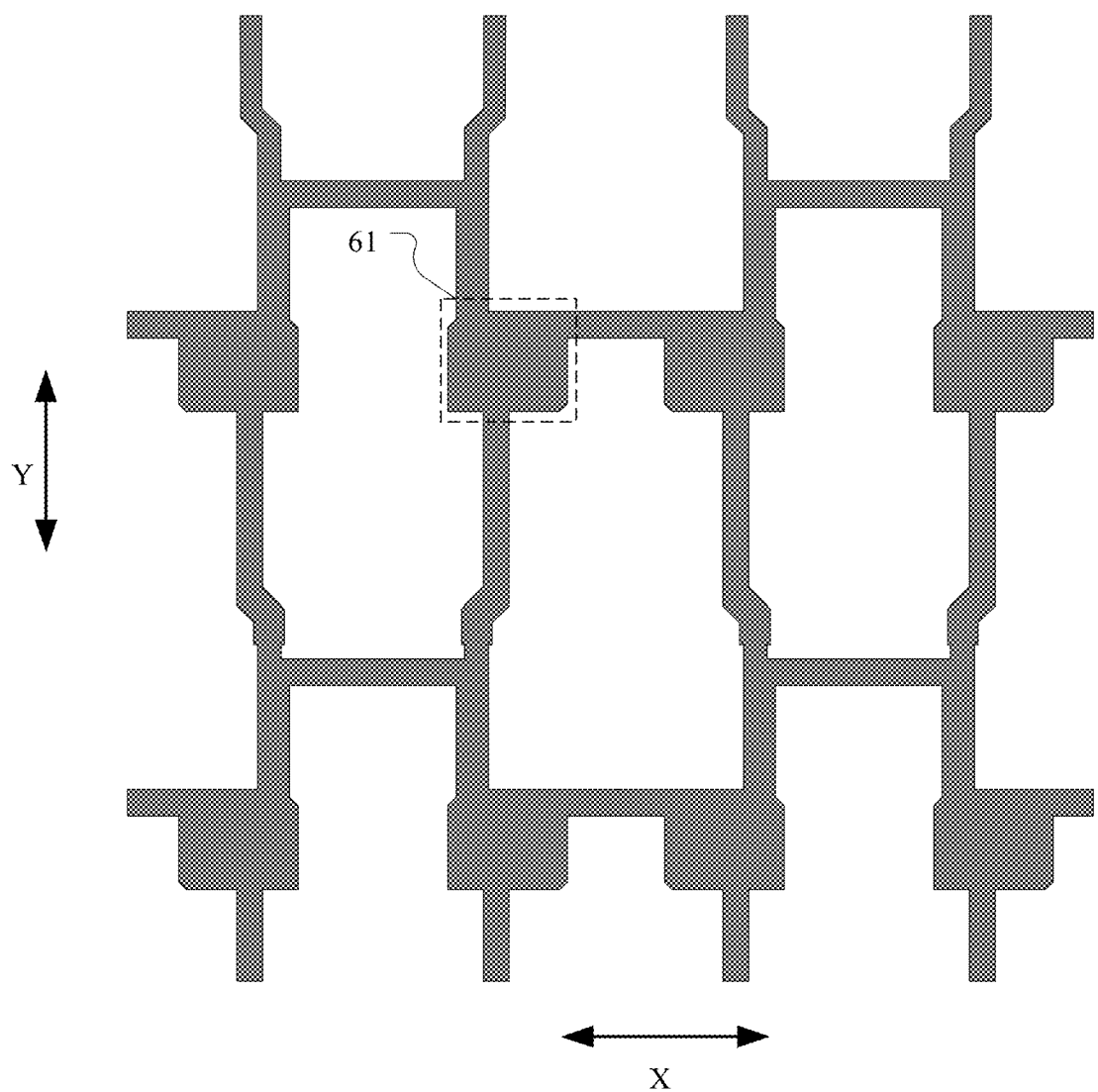
FIG. 5 is a structural layout of the light-shielding layer in FIG. 4.
Figure 6:
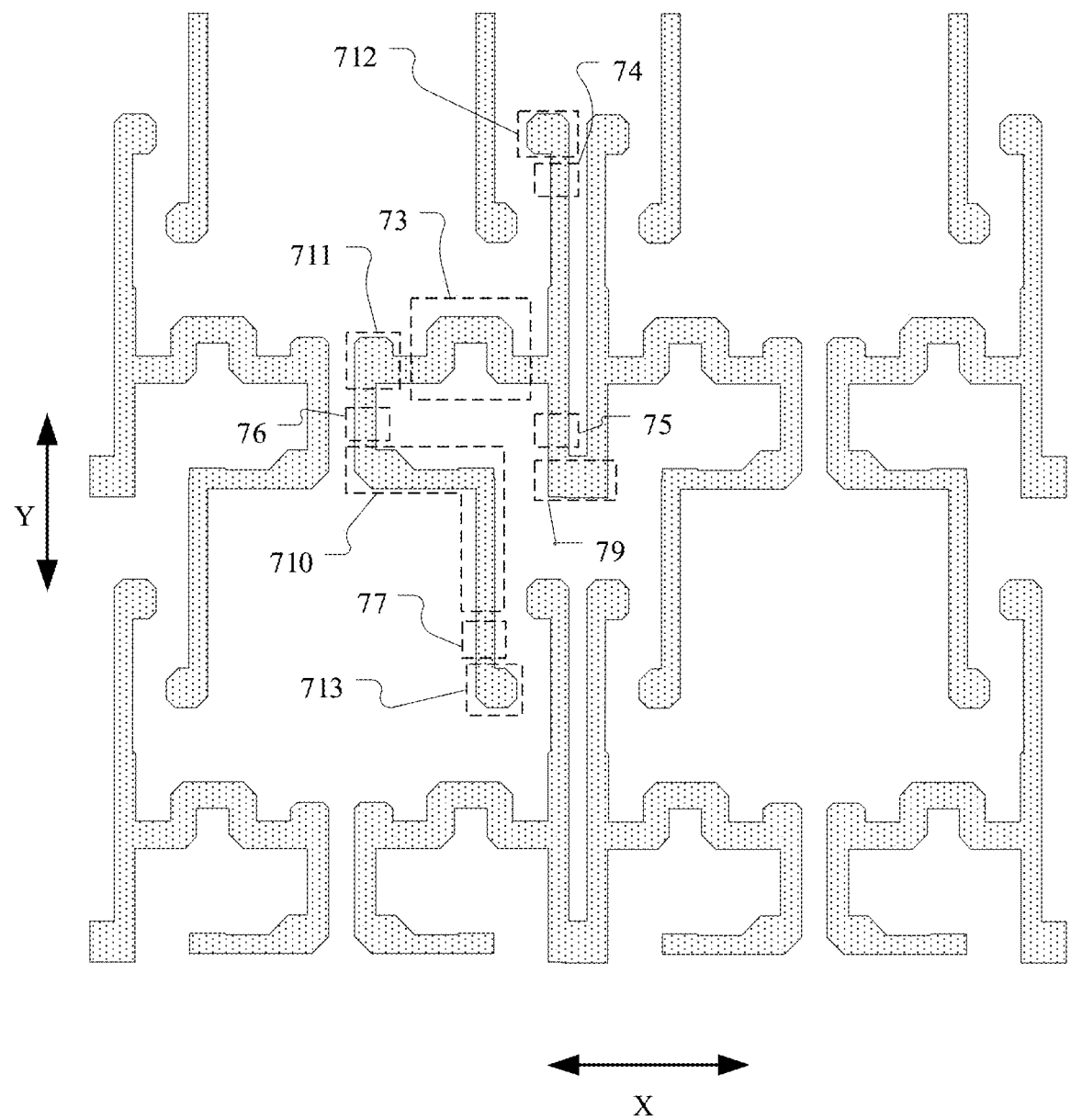
FIG. 6 is a structural layout of the first active layer in FIG. 4.
Figure 7:
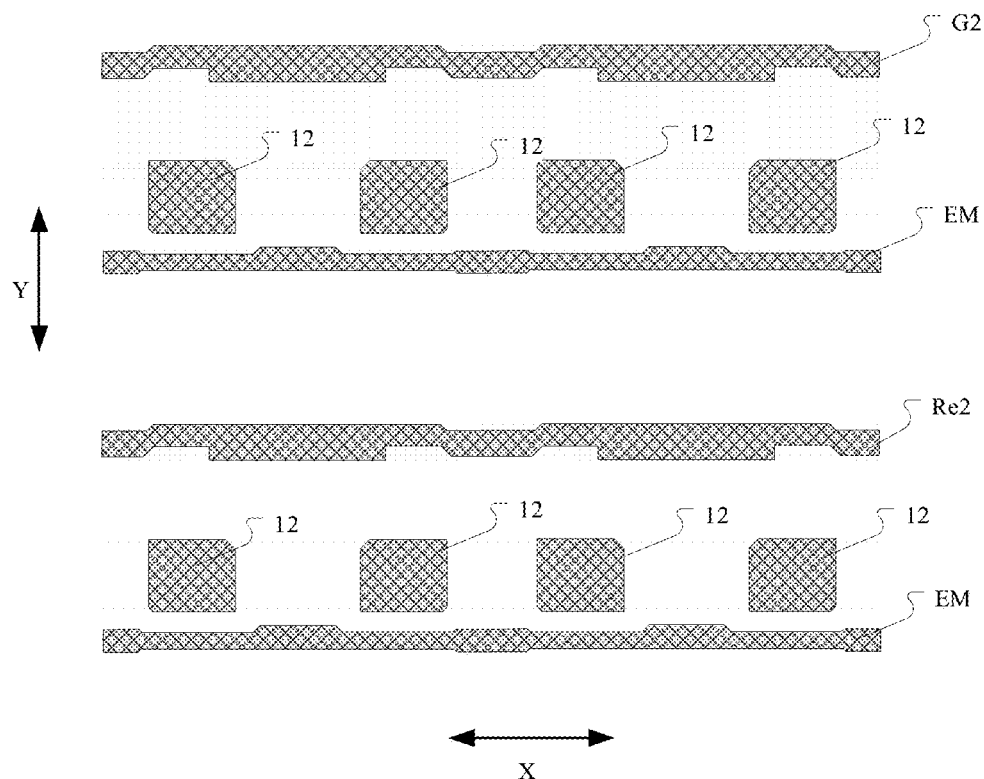
FIG. 7 is a structural layout of the first conductive layer in FIG. 4.
Figure 8:
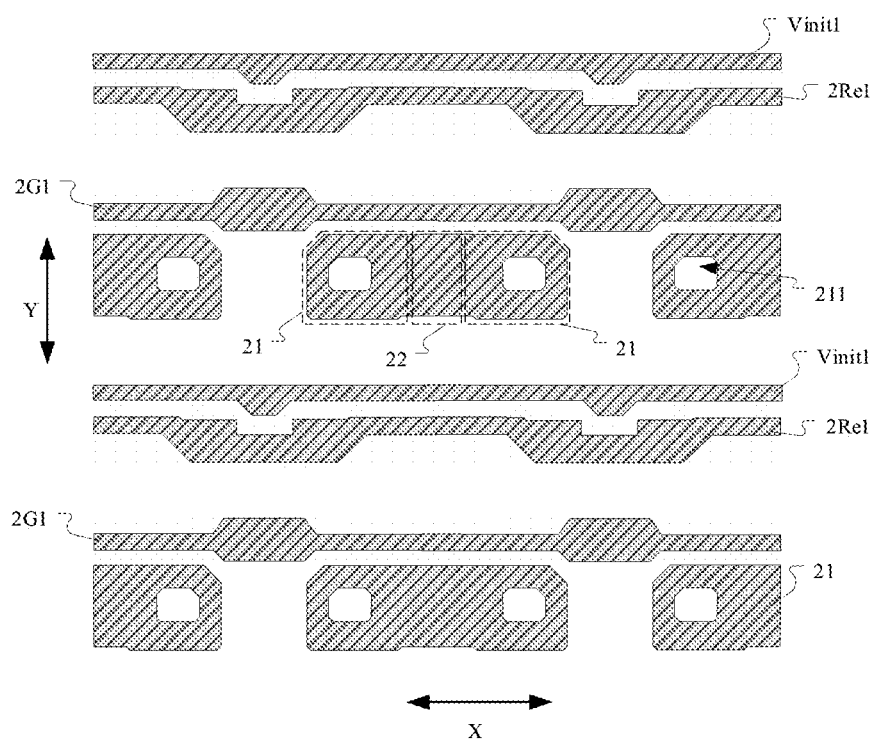
FIG. 8 is a structural layout of the second conductive layer in FIG. 4.
Figure 9:
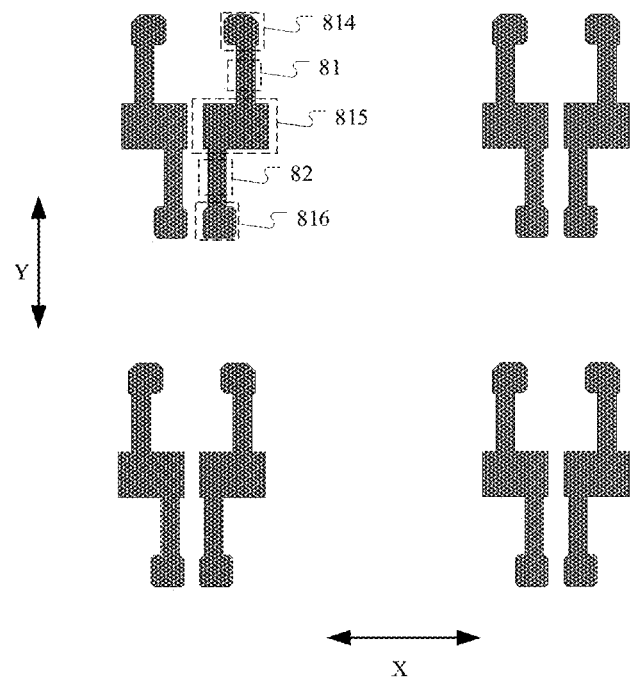
FIG. 9 is a structural layout of the second active layer in FIG. 4.
Figure 10:
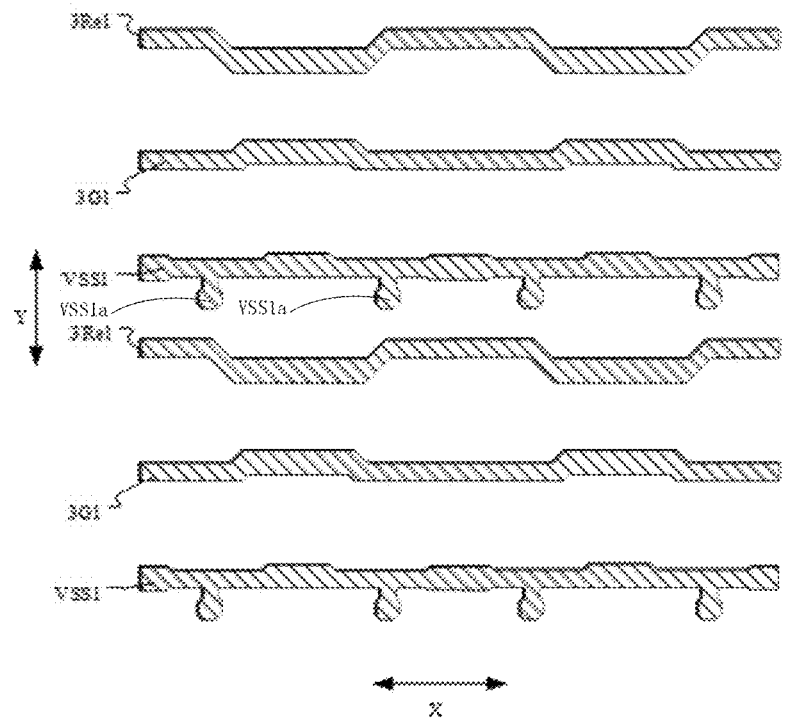
FIG. 10 is a structural layout of the third conductive layer in FIG. 4.
Figure 11:
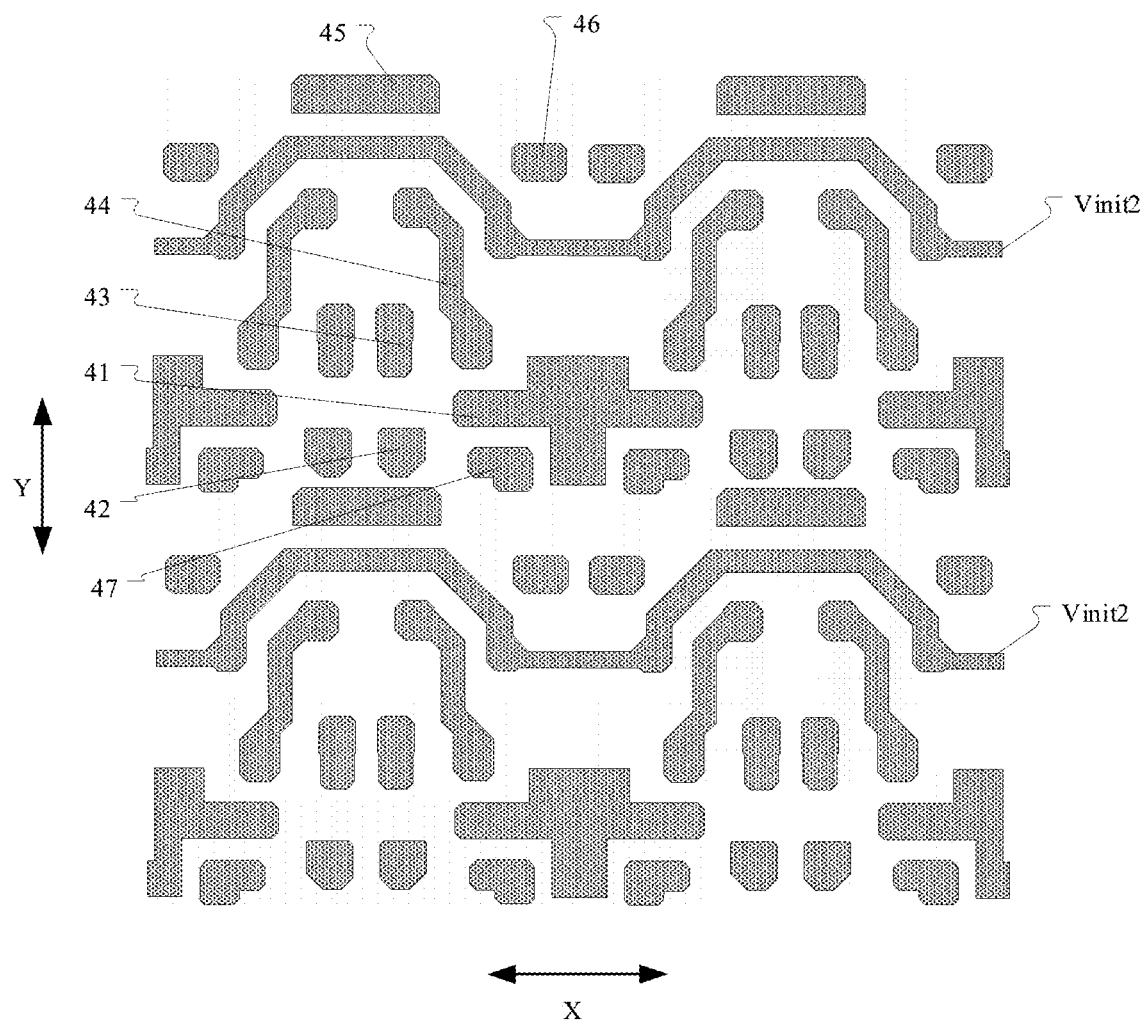
FIG. 11 is a structural layout of the fourth conductive layer in FIG. 4.
Figure 12:
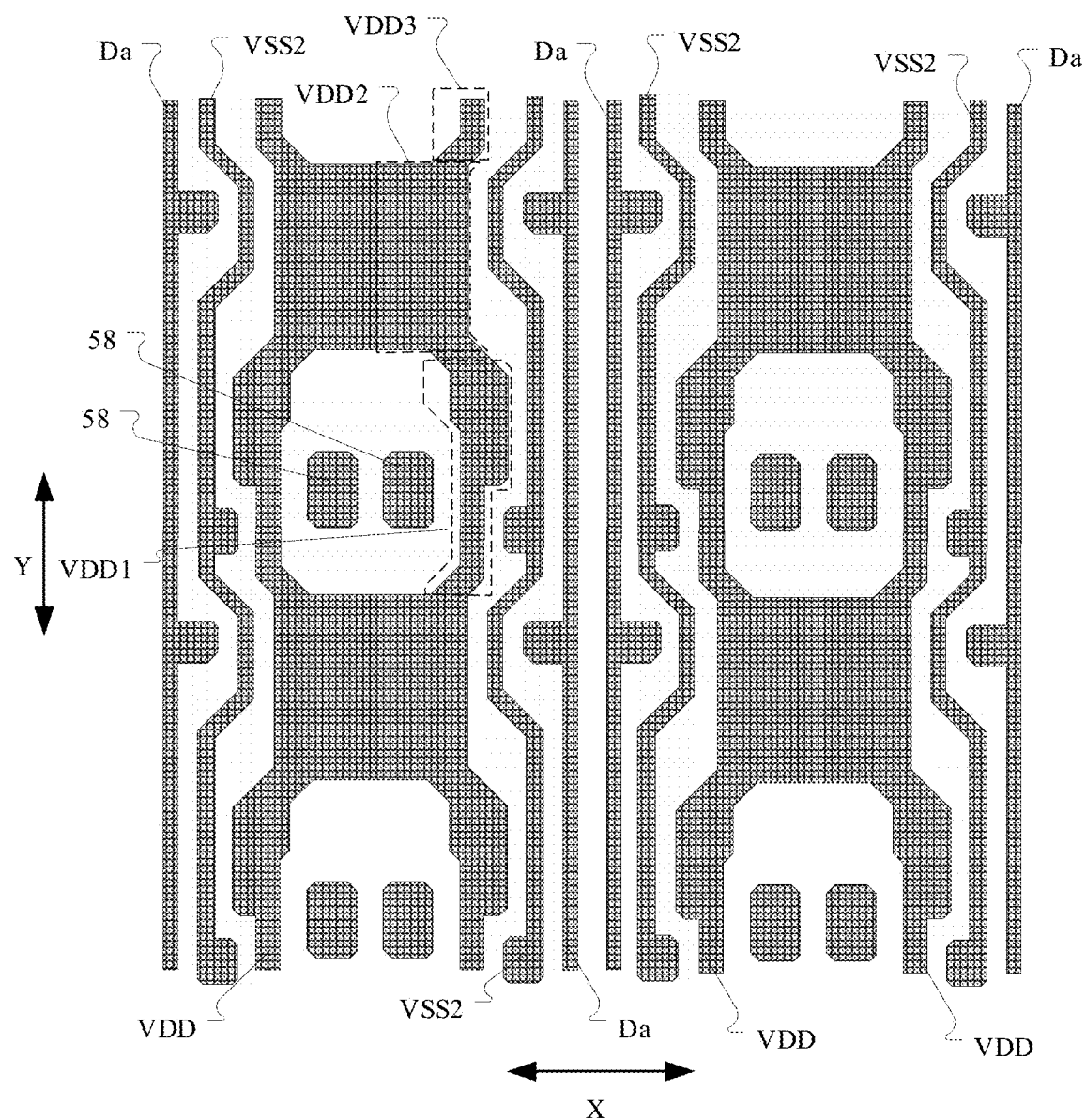
FIG. 12 is a structural layout of the fifth conductive layer in FIG. 4.
Figure 13:
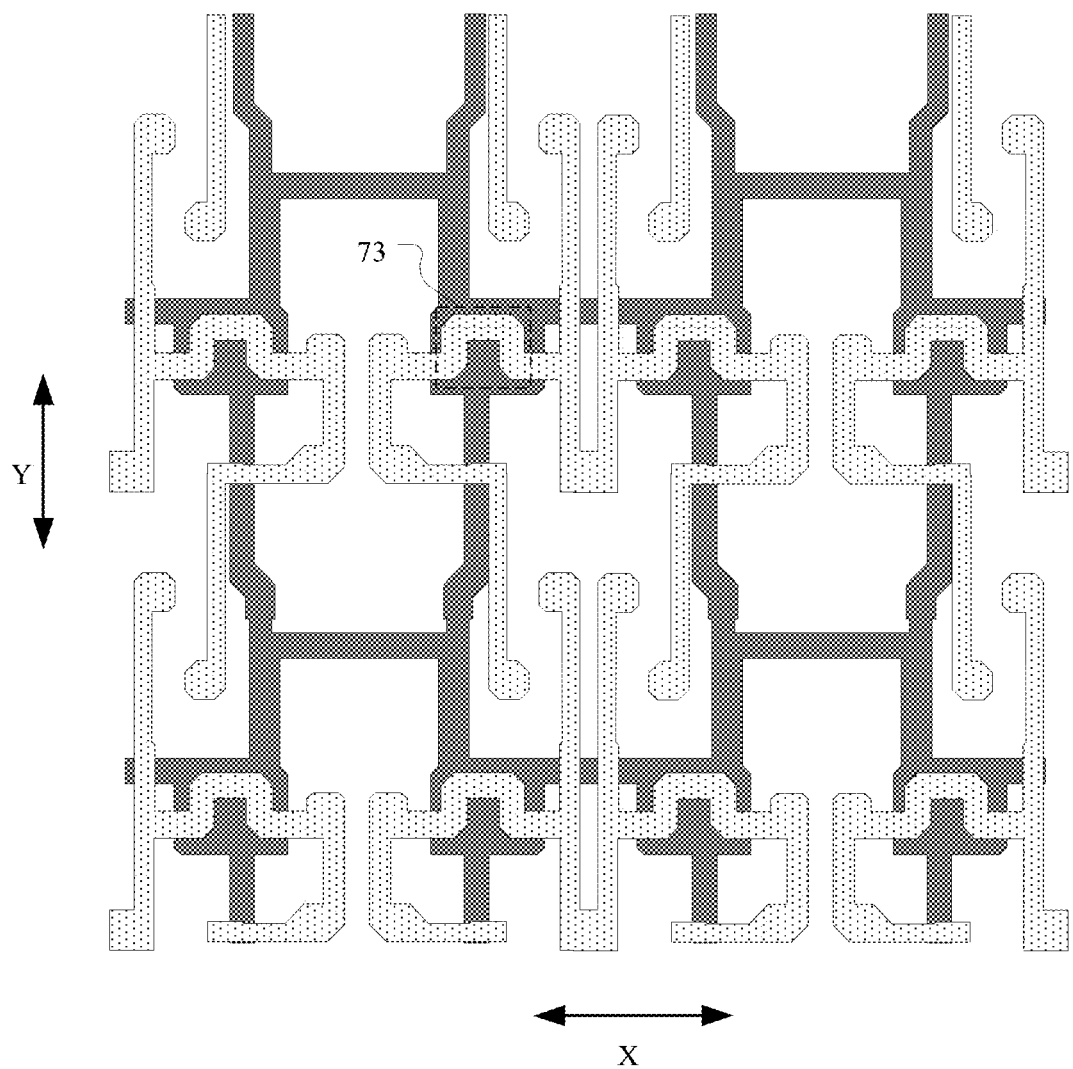
FIG. 13 is a structural layout of the light-shielding layer and the first active layer in FIG. 4.
Figure 14:
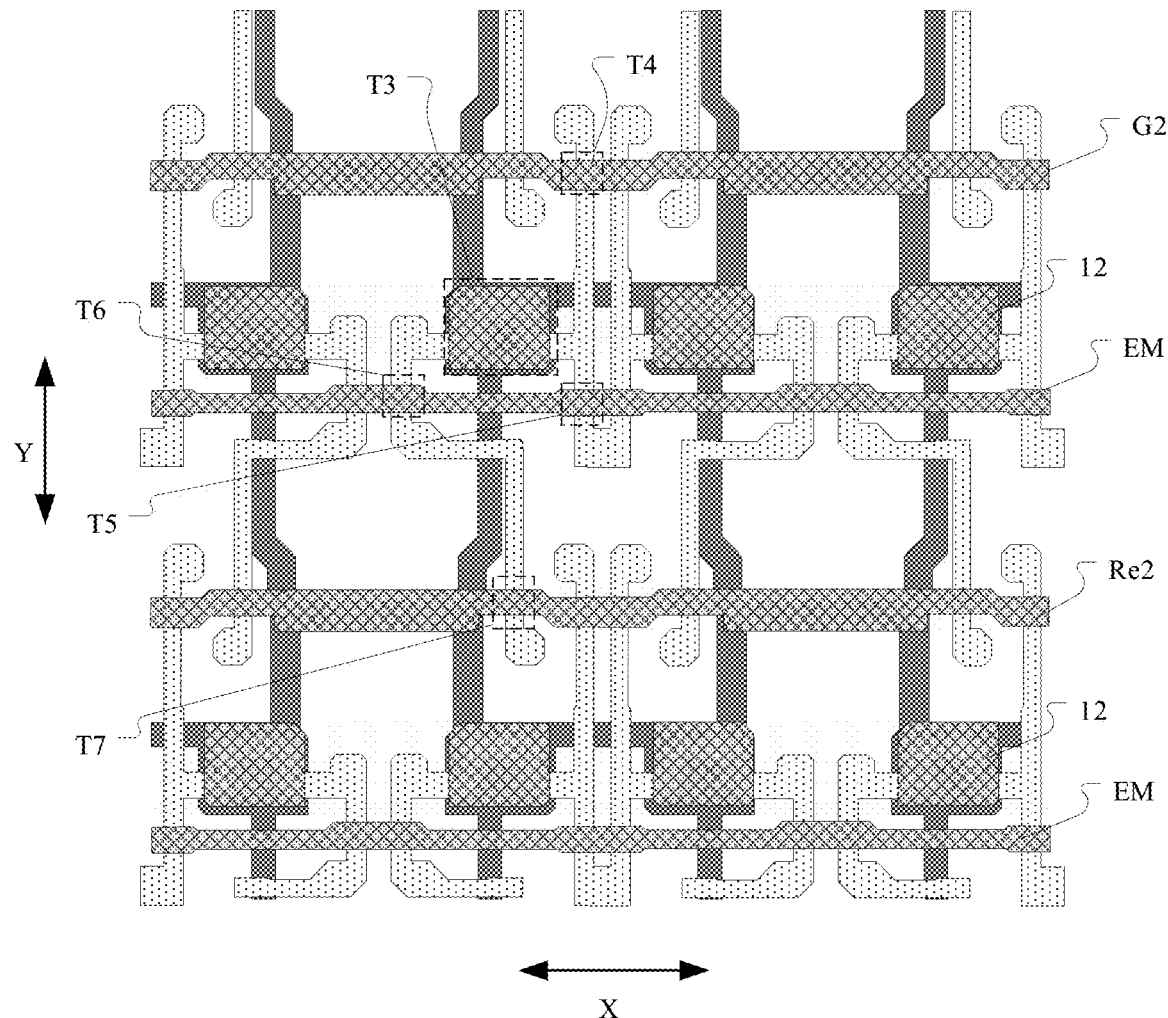
FIG. 14 is a structural layout of the light-shielding layer, the first active layer, and the first conductive layer in FIG. 4.
Figure 15:
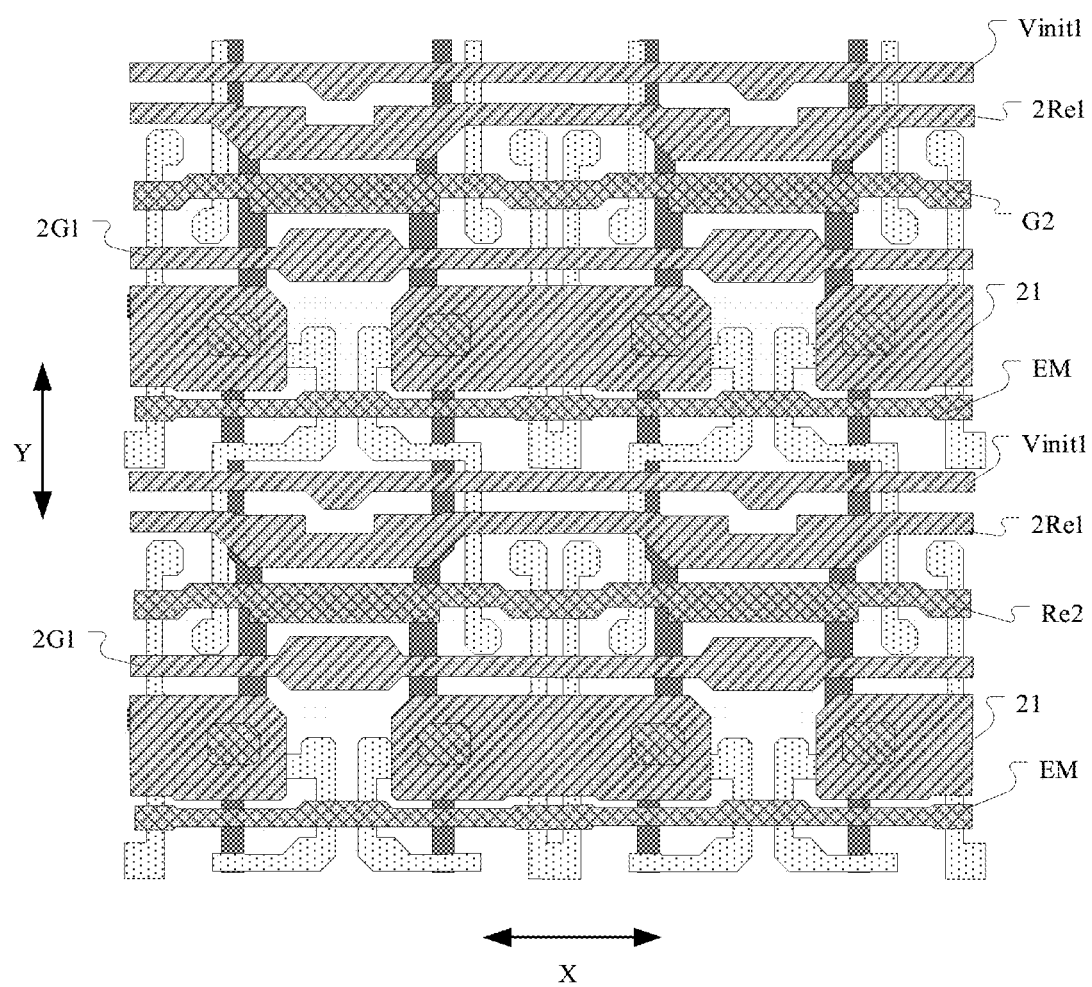
FIG. 15 is a structural layout of the light-shielding layer, the first active layer, the first conductive layer, and the second conductive layer in FIG. 4.
Figure 16:
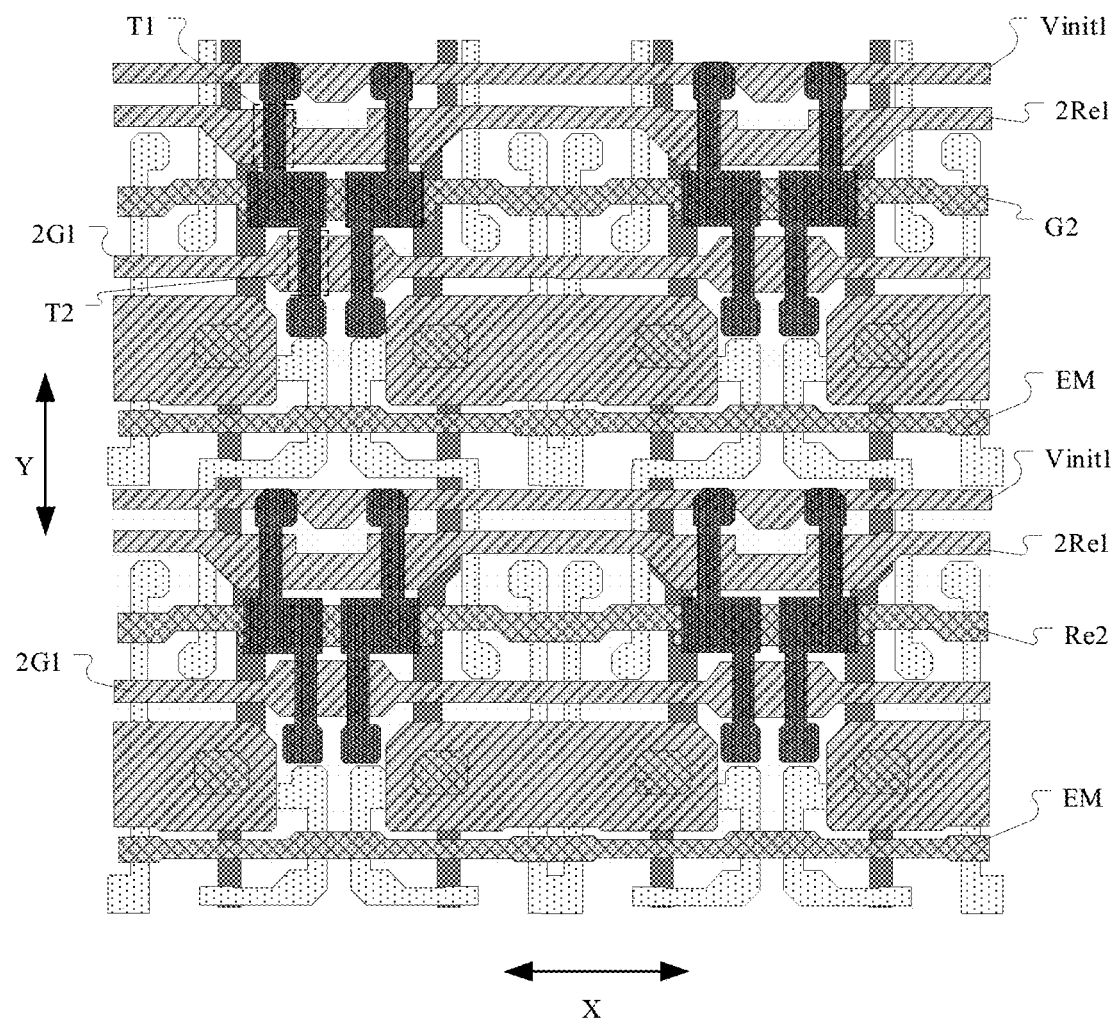
FIG. 16 is a structural layout of the light-shielding layer, the first active layer, the first conductive layer, the second conductive layer, and the second active layer in FIG. 4.
Figure 17:
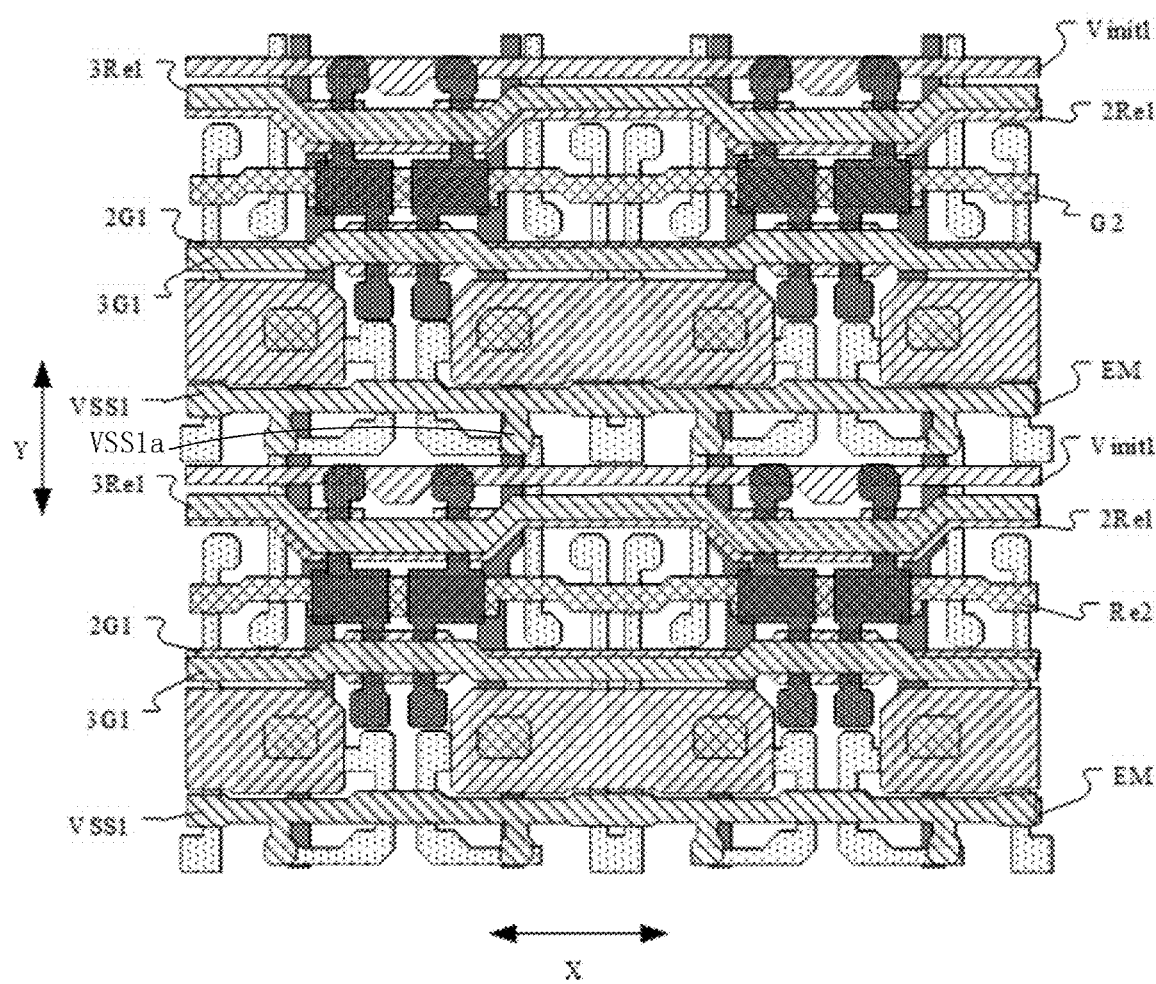
FIG. 17 is a structural layout of the light-shielding layer, the first active layer, the first conductive layer, the second conductive layer, the second active layer, and the third conductive layer in FIG. 4.
Figure 18:
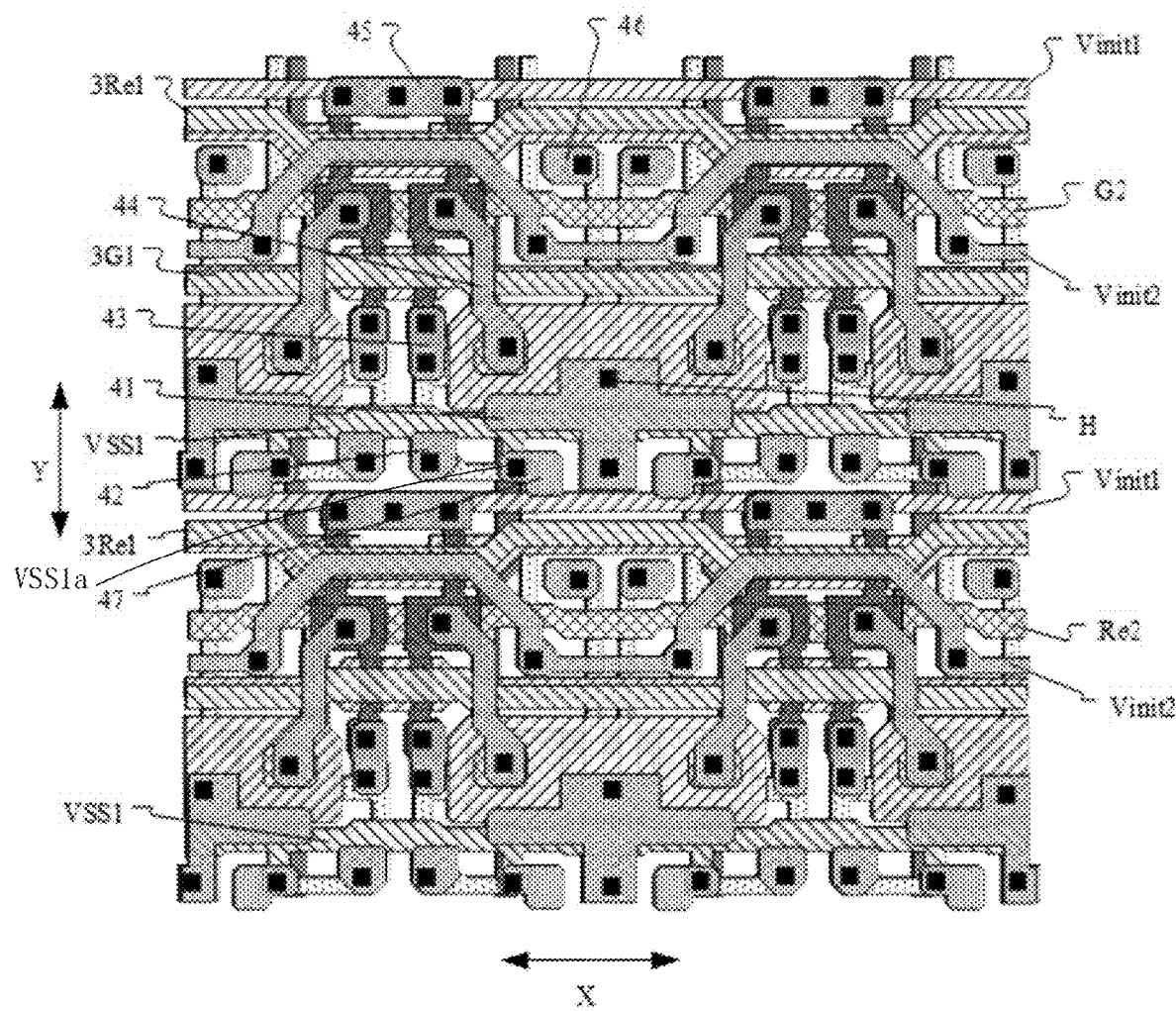
FIG. 18 is a structural layout of the light-shielding layer, the first active layer, the first conductive layer, the second conductive layer, the second active layer, the third conductive layer, and the fourth conductive layer in FIG. 4.

In this exemplary embodiment, the first power line VSS1 and the second power line VSS2 may be located on different conductive layers in the display panel. For example, in an exemplary embodiment, the display panel may include a base substrate, a light-shielding layer, a first active layer, a first conductive layer, a second conductive layer, a second active layer, a third conductive layer, a fourth conductive layer, and the fifth conductive layer, wherein an insulating layer may be arranged between the above-mentioned adjacent layers. As shown in FIGS. 4-18, FIG. 4 is the structural layout of an exemplary embodiment of a display panel of the present disclosure, FIG. 5 is the structural layout of the light-shielding layer in FIG. 4, FIG. 6 is a structural layout of the first active layer in FIG. 4, FIG. 7 is the structural layout of the first conductive layer in FIG. 4, FIG. 8 is the structural layout of the second conductive layer in FIG. 4, FIG. 9 is the structural layout of the second active layer in FIG. 4, FIG. 10 is the structural layout of the third conductive layer in FIG. 4, FIG. 11 is the structural layout of the fourth conductive layer in FIG. 4, FIG. 12 is the structural layout of the fifth conductive layer in FIG. 4, FIG. 13 is the structural layout of the light-shielding layer and the first the active layer in FIG. 4, FIG. 14 is the structural layout of the light-shielding layer, the first active layer, and the first conductive layer in FIG. 4, FIG. 15 is the structural layout of the light-shielding layer, the first active layer, the first conductive layer, and the second conductive layer in FIG. 4, FIG. 16 is the structural layout of the light-shielding layer, the first active layer, the first conductive layer, the second conductive layer, and the second active layer in FIG. 4, FIG. 17 is the structural layout of the light-shielding layer, the first active layer, the first conductive layer, the second conductive layer, the second active layer, and the third conductive layer in FIG. 4, and FIG. 18 is the structural layout of the light-shielding layer, the first active layer, the first conductive layer, the second conductive layer, the second active layer, the third conductive layer, and the fourth conductive layer in FIG. 4. The display panel may include a plurality of pixel driving circuits shown in FIG. 1. As shown in FIG. 4, the plurality of pixel driving circuits may include a first pixel driving circuit P1 and a second pixel driving circuit P2 adjacently distributed in the first direction X, the first pixel driving circuit P1 and the second pixel driving circuit P2 can be arranged mirror-symmetrically with the mirror-symmetric plane BB. Wherein, the mirror symmetry plane BB may be perpendicular to the base substrate. Moreover, the orthographic projection of the first pixel driving circuit P1 on the base substrate and the orthographic projection of the second pixel driving circuit P2 on the base substrate can be arranged symmetrically with the intersection line of the mirror symmetry plane BB and the base substrate as a symmetrical axis. Wherein, the first pixel driving circuit P1 and the second pixel driving circuit P2 may form a repeating unit, and the display panel may include a plurality of repeating units arrayed in the first direction X and the second direction Y.

As shown in FIGS. 4, 5, and 13, the light-shielding layer may include a plurality of light-shielding parts 61, and adjacent light-shielding parts 61 may be connected to each other. It should be understood that, in other exemplary embodiments, the display panel may not include a light-shielding layer. In addition, the light-shielding parts 61 may also be provided independently, that is, the light-shielding parts 61 may not be connected to each other.

As shown in FIGS. 4, 6, and 14, the first active layer may include a third active part 73, a fourth active part 74, a fifth active part 75, a sixth active part 76, and a seventh active part 77. Wherein, the third active part 73 can be used to form the channel region of the driving transistor T3; the fourth active part 74 can be used to form the channel region of the fourth transistor T4; the fifth active part 75 can be used to form the channel region of the fifth transistors T5; the sixth active part 76 may be used to form the channel region of the sixth transistor T6; and the seventh active part 77 may be used to form the channel region of the seventh transistor T7. The first active layer further includes a ninth active part 79, a tenth active part 710, an eleventh active part 711, a twelfth active part 712, and a thirteenth active part 713. Wherein, the ninth active part 79 is connected to the side of the fifth active part 75 away from the third active part 73, and the ninth active part 79 is connected between the fifth active parts 75 of two repeating units adjacent in the first direction X. The tenth active part 710 is connected between the sixth active part 76 and the seventh active part 77, the eleventh active part 711 is connected between the sixth active part 76 and the third active part 73, and the sixth active part 711 is connected between the sixth active part 76 and the third active part 73. The twelfth active part 712 is connected to an end of the fourth active part 74 away from the third active part 73, and the thirteenth active part 713 is connected to an end of the seventh active part 77 away from the sixth active part 76. Wherein, the orthographic projection of the light-shielding part 61 on the base substrate can cover the orthographic projection of the third active part 73 on the base substrate, and the light-shielding part 61 can reduce the influence of light on the driving characteristics of the driving transistor T3. The first active layer may be formed of polysilicon material. Correspondingly, the driving transistor T3, the fourth transistor T4, the fifth transistor T5, the sixth transistor T6 and the seventh transistor T7 may be P-type low temperature polysilicon thin film transistors.

As shown in FIGS. 4, 7, and 14, the first conductive layer may include: a second conductive part 12, a second gate line G2, an enable signal line EM, and a second reset signal line Re2. The second gate line G2 can be used to provide the second gate drive signal terminal in FIG. 1; the enable signal line EM can be used to provide the enable signal terminal in FIG. 1; the second reset signal line Re2 can be used to provide the signal terminal in FIG. 1n the second reset signal terminal. The orthographic projection of the second gate line G2 on the substrate, the orthographic projection of the enable signal line EM on the substrate, and the orthographic projection of the second reset signal line Re2 on the substrate can all extend along the first direction X. In this exemplary embodiment, the orthographic projection of a certain structure on the substrate extending along a certain direction, may be understood as that the orthographic projection of the structure on the substrate is extended along the direction in straight line or polyline. The orthographic projection of the second gate line G2 on the substrate covers the orthographic projection of the fourth active part 74 on the substrate, and part of the structure of the second gate line G2 is used to form the gate electrode of the fourth transistor. The orthographic projection of the enable signal line EM on the base substrate covers the orthographic projection of the fifth active part 75 on the base substrate and the orthographic projection of the sixth active part 76 on the base substrate, and part of the structure of the enable signal line EM can be used to form the gate electrodes of the fifth transistor T5 and the sixth transistor T6 respectively. The orthographic projection of the second reset signal line Re2 on the substrate can cover the orthographic projection of the seventh active part 77 on the substrate, and part of the structure of the second reset signal line Re2 can be used to form the gate electrode of the seventh transistor T7. The orthographic projection of the second conductive part 12 on the base substrate covers the orthographic projection of the third active part 73 on the base substrate, and the second conductive part 12 can be used to form the gate electrode of the driving transistor T3 and the first electrode of the capacitor C. As shown in FIG. 14, the second gate line G2 in the current row of pixel driving circuits can be multiplexed as the second reset signal line Re2 in the previous row of pixel driving circuits. This arrangement can increase the integration degree of the pixel driving circuit and reduce the layout area of the pixel driving circuit. The light-shielding layer can also be connected to a stable power supply terminal. For example, the light-shielding layer can be connected to the first power supply terminal, the first initial signal terminal, the second initial signal terminal, etc. in FIG. 1. The light-shielding part 61 can stabilize the voltage of the second conductive part 12, thereby reducing the voltage fluctuation of the gate of the driving transistor T3 during the light-emitting stage, and at the same time, the light-shielding layer can also shield the interference of other signals on the driving transistor T3. In addition, the display panel can use the first conductive layer as a mask to conduct conductorization treatment on the first active layer, that is, the region covered by the first conductive layer in the first active layer can form the channel region of the transistor, and the region of the first active layer not covered by the first conductive layer may form a conductor structure. In addition, the light-shielding layer may not be connected to a voltage, that is, the light-shielding layer is in a floated state.

As shown in FIGS. 4, 8, and 15, the second conductive layer may include: a first initial signal line Vinit1, a third reset signal line 2Re1, a third gate line 2G1, and a plurality of first conductive parts 21. Wherein, the first initial signal line Vinit1 is used to provide the first initial signal terminal in FIG. 1, the third reset signal line 2Re1 can be used to provide the first reset signal terminal in FIG. 1, and the third gate line 2G1 can be used to provide the first gate drive signal terminal in FIG. 1. The orthographic projection of the first initial signal line Vinit1 on the substrate, the orthographic projection of the third reset signal line 2Re1 on the substrate, and the orthographic projection of the third gate line 2G1 on the substrate can all be along the first direction X extend. As shown in FIG. 8, the second conductive layer may further include a plurality of first connection parts 22. In the repeating units adjacent in the first direction X, the first connection parts 22 are connected between the two first conductive parts 21 adjacent in the first direction X. In addition, in other exemplary embodiments, in the same repeating unit, adjacent first conductive parts 21 may also be connected.

As shown in FIGS. 4, 9, and 16, the second active layer may include a first active part 81, a second active part 82, a fourteenth active part 814, a fifteenth active part 815, and a sixteenth active part active part 816. The first active part 81 is used to form the channel region of the first transistor T1, and the second active part 82 is used to form the channel region of the second transistor T2. The fifteenth active part 815 is connected between the first active part 81 and the second active part 82. The fourteenth active part 814 is connected to an end of the first active part 81 away from the second active part 82, and the sixteenth active part 816 is connected to an end of the second active part 82 away from the first active part 81. Wherein, the second active layer may be formed of InGaZnO, and correspondingly, the first transistor T1 and the second transistor T2 may be N-type metal oxide thin film transistors. The orthographic projection of the third gate line 2G1 on the substrate may cover the orthographic projection of the second active part 82 on the substrate, and part of the structure of the third gate line 2G1 may be used to form the bottom gate electrode of the second transistor T2. The orthographic projection of the third reset signal line 2Re1 on the substrate can cover the orthographic projection of the first active part 81 on the substrate, and the partial structure of the third reset signal line 2Re1 can be used to form the bottom gate electrode of the first transistor T1.

As shown in FIGS. 4, 10 and 17, the third conductive layer may include a first reset signal line 3Re1, a first gate line 3G1, and a first power line VSS1. The orthographic projection of the first reset signal line 3Re1 on the substrate, the orthographic projection of the first gate line 3G1 on the substrate, and the orthographic projection of the first power line VSS1 on the substrate can all extend along the first direction X. The first reset signal line 3Re1 can be used to provide the first reset signal terminal in FIG. 1, and the orthographic projection of the first reset signal line 3Re1 on the substrate can cover the orthographic projection of the first active part 81 on the substrate. Part of the structure of the first reset signal line 3Re1 can be used to form the top gate electrode of the first transistor T1, and at the same time, the first reset signal line 3Re1 can be connected to the third reset signal line 2Re1 through a via hole located in the frame area of the display panel. The first gate line 3G1 can be used to provide the first gate driving signal terminal in FIG. 1, and the orthographic projection of the first gate line 3G1 on the substrate can cover the orthographic projection of the second active part 82 on the substrate. Part of the structure of the first gate line 3G1 can be used to form the top gate electrode of the second transistor T2, and at the same time, the first gate line 3G1 can be connected to the third gate line 2G1 through a via hole located in the frame area of the display panel. The first power line VSS1 can be used to provide the second power supply terminal in FIG. 1, and the first power line VSS1 can be disposed corresponding to the row of the pixel driving circuit. The orthographic projection on the base substrate of the first power line VSS1 in the currently row of pixel driving circuit can be located between the orthographic projection on the base substrate of the first initial signal line Vinit1 in the next row of pixel driving circuit and the orthographic projection on the base substrate of the second conductive part 12 in the pixel driving circuit of the current row. The orthographic projection on the base substrate of the first power line VSS1 in the pixel driving circuit in the current row is at least partly overlapped with the orthographic projection on the base substrate of the enable signal line EM in the pixel driving circuit of the current row. In this exemplary embodiment, the area of the orthographic projection of the first power line VSS1 on the base substrate is S1; and the overlapping area of the orthographic projection of the first power line VSS1 on the base substrate and the orthographic projection of the enable signal line EM on the base substrate is S2; wherein, S2/S1 may be greater than or equal to 80%. For example, S2/S1 can be 80%, 90%, 100%, etc. This arrangement can improve the integration degree of the pixel driving circuit, reduce the size of the pixel driving circuit in the second direction Y, and at the same time, this arrangement can also improve the transmittance of the display panel. As shown in FIGS. 10 and 17, in the same pixel driving circuit, the orthographic projection of the second conductive part 12 on the base substrate may be located between the orthographic projection of the first gate line 3G1 on the base substrate and the orthographic projection of the enable signal line EM on the base substrate; the orthographic projection of the first reset signal line 3Re1 on the base substrate may be located at a side of the orthographic projection of the first gate line 3G1 on the base substrate away from the orthographic projection of the second conductive part 12 on the base substrate. The orthographic projection of the second gate line G2 on the base substrate may be located between the orthographic projection of the first gate line 3G1 on the base substrate and the orthographic projection of the first reset signal line 3Re1 on the base substrate. The orthographic projection of the second reset signal line Re2 on the base substrate may be located at the side of the orthographic projection of the enable signal line EM on the base substrate away from the orthographic projection of the second conductive part 12 on the base substrate. In addition, the display panel can use the third conductive layer as a mask to conduct conductorization treatment on the second active layer, that is, the region of the second active layer covered by the third conductive layer can form the channel region of the transistor, and the region of the second active layer not covered by the third conductive layer may form a conductor structure.

As shown in FIGS. 4, 11, and 18, the fourth conductive layer may include a first bridging part 41, a second bridging part 42, a third bridging part 43, a fourth bridging part 44, a fifth bridging part 45, a sixth bridging part 46, a seventh bridging part 47, and a second initial signal line Vinit2. Wherein, the first bridging part 41 can be connected to the first connection part 22 through the via hole H, and connected to the ninth active part 79 through the via hole, so as to connect the first electrode of the fifth transistor and the second electrode of the capacitor C. It should be noted that, in this exemplary embodiment, the black squares indicate the positions of via holes. In addition, adjacent pixel driving circuits in adjacent repeating units in the first direction X may share the same first bridging part 41. The second bridging part 42 may be connected to the tenth active part 710 through a via hole, so as to connect the second electrode of the sixth transistor T6 and the second electrode of the seventh transistor T7. The third bridging part 43 can be respectively connected to the eleventh active part 711 and the sixteenth active part 816 through via holes to connect the second electrode of the second transistor T2, the first electrode of the sixth transistor T6, and the second electrode of the driving transistor T3. The fourth bridging part 44 can be connected to the fifteenth active part 815 and the second conductive part 12 through via holes, so as to connect the first electrode of the second transistor T2 and the gate electrode of the driving transistor. As shown in FIG. 8, an opening 211 is formed on the first conductive part 21, and the orthographic projection of the via hole connected between the second conductive part 12 and the fourth bridging part 44 on the base substrate is located within the orthographic projection of the opening 211 on the base substrate, such that the via hole and the first conductive part 21 are insulated from each other. The fifth bridging part 45 can be connected to the fourteenth active part 814 and the first initial signal line Vinit1 through via holes, so as to connect the first electrode of the first transistor and the first initial signal terminal. Wherein, in the same repeating unit, two adjacent pixel driving circuits may share the same fifth bridging part 45. The sixth bridging part 46 may be connected to the twelfth active part 712 through a via hole, so as to be connected to the first electrode of the fourth transistor. The second initial signal line Vinit2 can be used to provide the second initial signal terminal in FIG. 1, the orthographic projection of the second initial signal line Vinit2 on the base substrate can extend along the first direction X, and the second initial signal line Vinit2 can be connected to the thirteenth active part 713 through a via hole to connect the first electrode of the seventh transistor and the second initial signal terminal. The seventh bridging part 47 may be connected to the first power line VSS1 through a via hole.

As shown in FIGS. 4 and 12, the fifth conductive layer may include a plurality of third power lines VDD, a plurality of data lines Da, a second power line VSS2, and an eighth bridging part 58. Wherein, the orthographic projection of the third power line VDD on the base substrate, the orthographic projection of the data line Da on the base substrate, and the orthographic projection of the second power line VSS2 on the base substrate can all extend along the second direction Y. The third power line VDD can be used to provide the first power supply terminal in FIG. 1, the data line Da can be used to provide the data signal terminal in FIG. 1, and the second power line VSS2 can be used to provide the second power supply terminal in FIG. 1. As shown in FIG. 4, a third power line VDD can be provided for each column of the pixel driving circuit, and the third power line VDD can be connected to the first bridging part 41 through a via hole to connect the first electrode of the fifth transistor and the first power supply terminal. The data line Da can be connected to the sixth bridging part 46 through a via hole, so as to connect the first electrode of the fourth transistor and the data signal terminal. The eighth bridging part 58 may be connected to the second bridging part 42 through a via hole, so as to be connected to the second electrode of the seventh transistor. As shown in FIG. 12, the third power line VDD may include a first extension VDD1, a second extension VDD2, and a third extension VDD3, and the second extension VDD2 is connected between the first extension VDD1 and the third extension VDD3. The size in the first direction X of the orthographic projection of the second extension VDD2 on the base substrate may be larger than the size in the first direction X of the orthographic projection of the first extension VDD1 on the base substrate, and the size in the first direction X of the orthographic projection of the second extension VDD2 on the base substrate may be larger than the size in the first direction X of the orthographic projection of the third extension VDD3 on the base substrate. The orthographic projection of the second extension VDD2 on the base substrate can cover the orthographic projection of the first active part 81 on the base substrate and the orthographic projection of the second active part 82 on the base substrate. The second extension VDD2 can reduce the influence of light on the characteristics of the first transistor T1 and the second transistor T2. In addition, the orthographic projection of the third power line VDD on the base substrate can cover the orthographic projection of the fourth bridging part 44 on the base substrate, and the third power line VDD can be used to shield the noise interference of other signals on the fourth bridging part 44, thereby improving the stability of the gate voltage of the driving transistor T3. In addition, in the same repeating unit, the second extension parts VDD2 in two adjacent pixel driving circuits can be connected to each other, so that the third power line VDD and the first conductive part 21 can form a grid structure, and the power line of the grid structure can reduce the voltage drop of the power signal thereof.

The second power line VSS2 can be connected to the seventh bridging part 47 through a via hole, so as to be connected to the first power line VSS1 at a branch VSS1a protruded from the first power line VSS1 in the column direction. Wherein, each column of pixel driving circuits can be correspondingly provided with a second power line VSS2, each row of pixel driving circuits can be correspondingly provided with a first power line VSS1, and each pixel driving circuit can be correspondingly provided with a seventh bridging part 47, so that the first power line VSS1 and the second power line VSS2 may be connected through via holes to form a grid structure. The first power line VSS1 and the second power line VSS2 forming the grid structure can reduce the voltage difference between different positions on the common electrode layer. It should be understood that, in other exemplary embodiments, multiple column pixel drive circuits may be provided with a corresponding second power line VSS2, and multiple row pixel drive circuits may be provided with a corresponding first power line VSS1. The first power line VSS1 and the second power line VSS2 intersected by the orthographic projection can be connected through via holes, so that the first power line VSS1 and the second power line VSS2 can also form a grid structure.

In this exemplary embodiment, as shown in FIGS. 4 and 12, the orthographic projection of the second power line VSS2 on the base substrate and the orthographic projection of the third active part 73 on the base substrate are at least partially overlapped, and the orthographic projection of the second power line VSS2 on the base substrate and the orthographic projection of the seventh active part 77 on the base substrate are at least partially overlapped. This arrangement can improve the transmittance of the display panel.

In this exemplary embodiment, as shown in FIG. 4 and FIG. 12, the orthographic projection of the seventh bridging part 47 on the base substrate and the orthographic projection of the tenth active part 710 on the base substrate are at least partially overlapped. This arrangement can also improve the transmittance of the display panel.

In this exemplary embodiment, in the same row of pixel driving circuits, the orthographic projection of the second power line VSS2 on the base substrate is located between the orthographic projection of the third power line VDD on the base substrate and the orthographic projection of the data line Da on the base substrate, the second power line VSS2 can shield the signal crosstalk between the data line Da and the third power line VDD. At the same time, in the same row of pixel driving circuits, the orthographic projection of the second power line VSS2 on the substrate is located between the orthographic projection of the fourth bridging part 44 on the substrate and the orthographic projection of the data line Da on the substrate. The second power line VSS2 can shield the noise interference of the data line Da on the fourth bridging part 44, thereby improving the stability of the gate voltage of the driving transistor.

It should be noted that, as shown in FIGS. 4 and 18, the black square drawn on the side of the fourth conductive layer away from the base substrate indicates the via hole where the fourth conductive layer is connected to other layers opposite to the side of the base substrate, and the black square drawn on the side of the fifth conductive layer away from the base substrate indicates the via hole where the fifth conductive layer is connected to other layers opposite to the side of the base substrate. The black square only indicates the position of the via hole, and different via holes represented by black squares at different positions may penetrate through different insulating layers.

Figure 19:
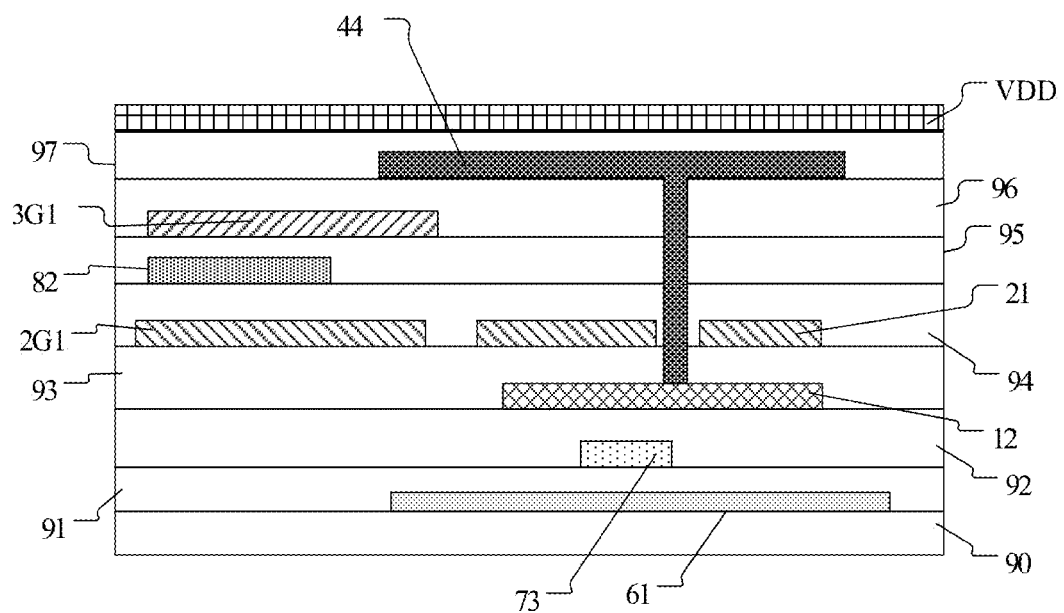
FIG. 19 is a partial cross-sectional view of the display panel shown in FIG. 4 cut along the dotted line CC.

As shown in FIG. 19, it is a partial cross-sectional view of the display panel shown in FIG. 4 cut along the dotted line CC. The display panel may further include a first insulating layer 91, a second insulating layer 92, a third insulating layer 93, a fourth insulating layer 94, a fifth insulating layer 95, a first dielectric layer 96, and a first planar layer 97, wherein, the base substrate 90, the light-shielding layer, the first insulating layer 91, the first active layer, the second insulating layer 92, the first conductive layer, the third insulating layer 93, the second conductive layer, the fourth insulating layer 94, the second active layer, the fifth insulating layer 95, the third conductive layer, the first dielectric layer 96, the fourth conductive layer, the first planar layer 97, and the fifth conductive layer are sequentially stacked. The first insulating layer 91, the second insulating layer 92, the third insulating layer 93, the fourth insulating layer 94, and the fifth insulating layer 95 can be a single-layer structure or a multi-layer structure, and the material of the first insulating layer 91, the second insulating layer 92, the third insulating layer 93, the fourth insulating layer 94, and the fifth insulating layer 95 can be at least one of silicon nitride, silicon oxide, and silicon oxynitride; the first dielectric layer 96 can be silicon nitride layer; the material of the first planar layer 97 can be an organic material, such as polyimide (PI), polyethylene terephthalate (PET), polyethylene naphthalate (PEN), silicon-Glass bonded structure (SOG), and the like. The base substrate 90 may include a glass substrate, a barrier layer, and a polyimide layer stacked in sequence, and the barrier layer may be an inorganic material. The material of the first conductive layer, the second conductive layer, and the third conductive layer may be one or an alloy of molybdenum, aluminum, copper, titanium, and niobium, or a molybdenum/titanium alloy or laminate. The material of the fourth conductive layer and the fifth conductive layer may include metal materials, such as one or an alloy of molybdenum, aluminum, copper, titanium, and niobium, or a molybdenum/titanium alloy or laminate, etc., or may be titanium/aluminum/titanium laminate.

It should be noted that the scale of the drawings in this disclosure can be used as a reference in the actual process, but is not limited thereto, for example: the width-to-length ratio of the channel, the thickness and spacing of each film layer, and the width and spacing of each signal line, can be adjusted according to actual needs. The number of pixels in the display substrate and the number of sub-pixels in each pixel are not limited to the numbers shown in the figures, and the figures described in this disclosure are only structural schematic diagrams. In addition, the first, second and other qualifiers are only used to define different structural names, and they have no meaning of a specific order.

Figure 20:
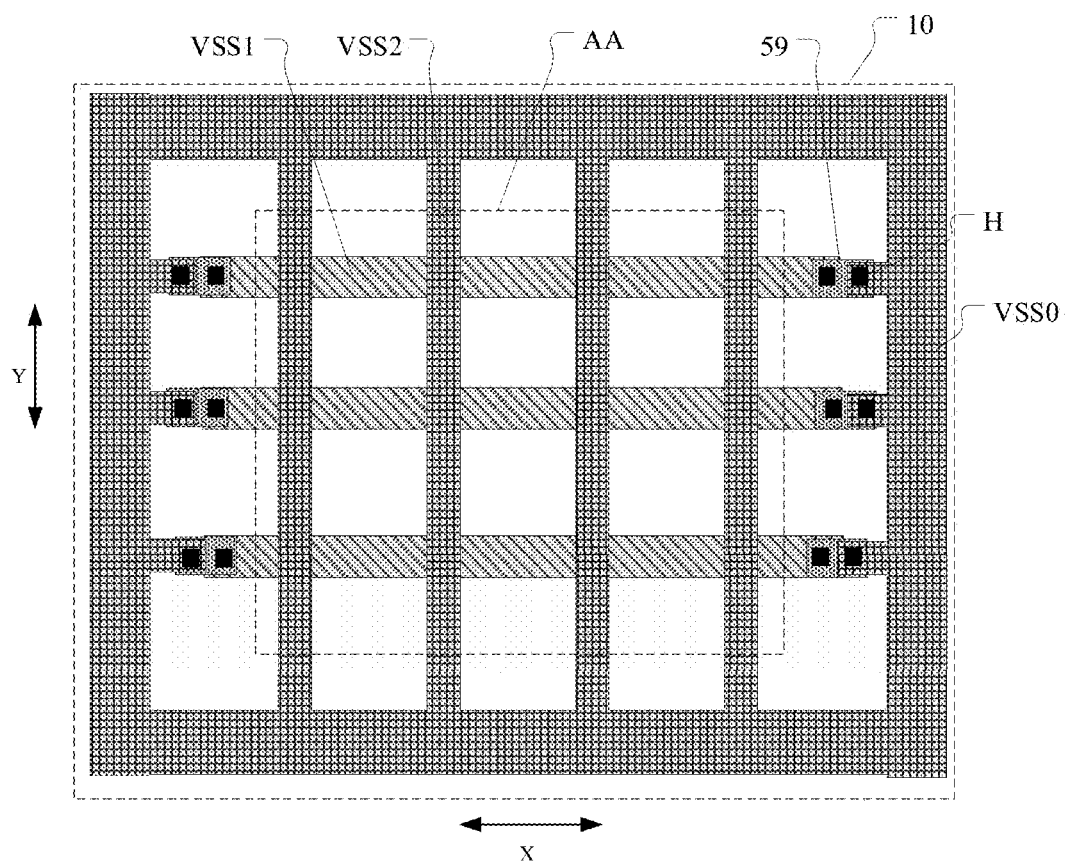
FIG. 20 is a schematic structural diagram of another exemplary embodiment of a display panel of the present disclosure.

As shown in FIG. 20, which is a schematic structural diagram of another exemplary embodiment of a display panel of the present disclosure, the display panel may include a display area AA and a frame area 10 around the display area. Wherein, the structure of the display area AA of the display panel may be the same as that of the display panel shown in FIG. 4. In this exemplary embodiment, both the first power line VSS1 and the second power line VSS2 may be located in the display area AA of the display panel. The display panel may further include an electrode ring VSS0 on the fifth conductive layer, and the electrode ring VSS0 may be connected to a common electrode through a via hole H. As shown in FIG. 20, the display panel can use the ninth bridging part 59 on the fourth conductive layer to connect the electrode ring VSS0 and the first power line VSS1 through a via hole, and the second power line VSS2 can be directly connected to the electrode ring VSS0 on the same conductive layer.

Figure 21:
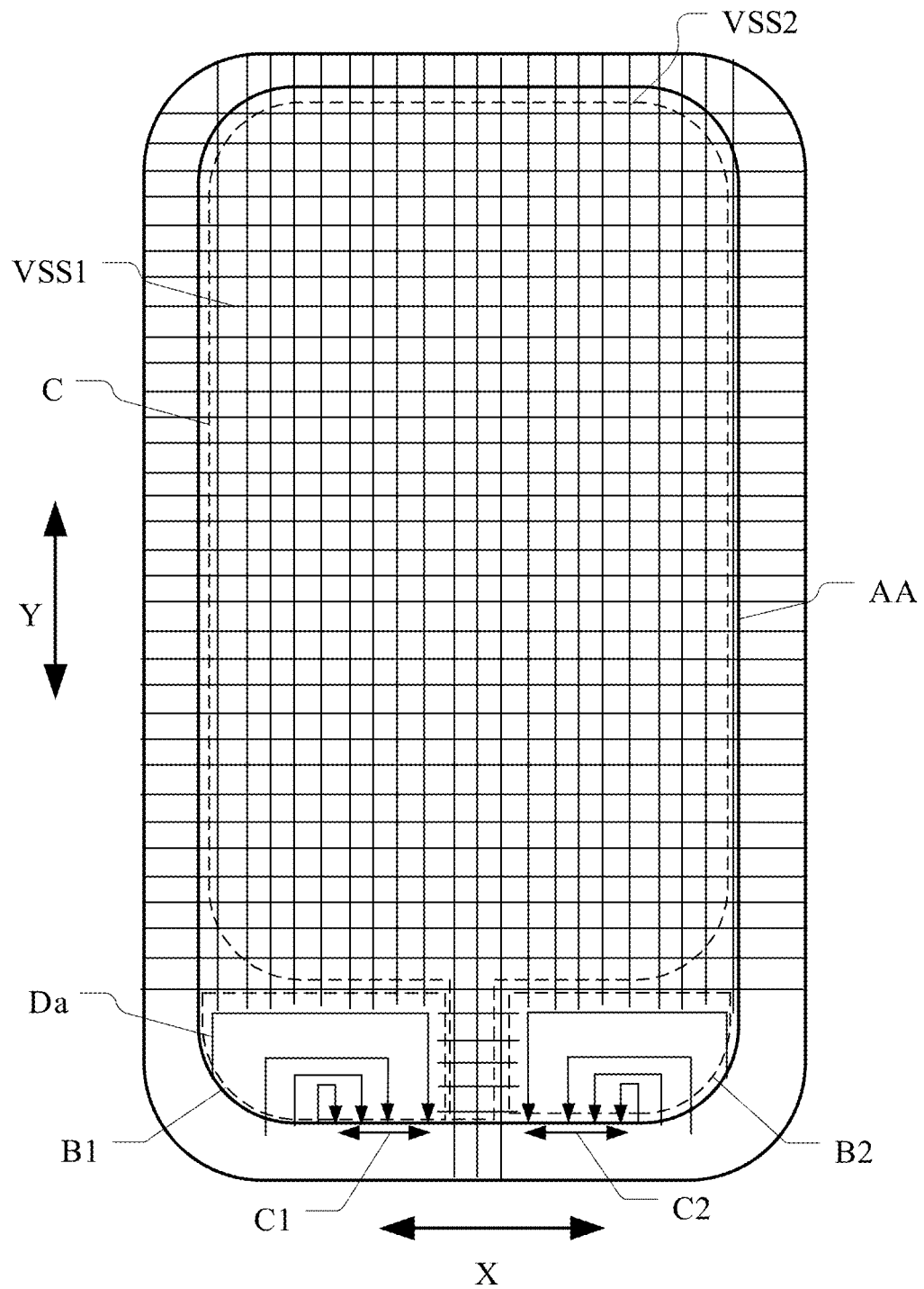
FIG. 21 is a schematic structural diagram of another exemplary embodiment of a display panel of the present disclosure.
Figure 22:
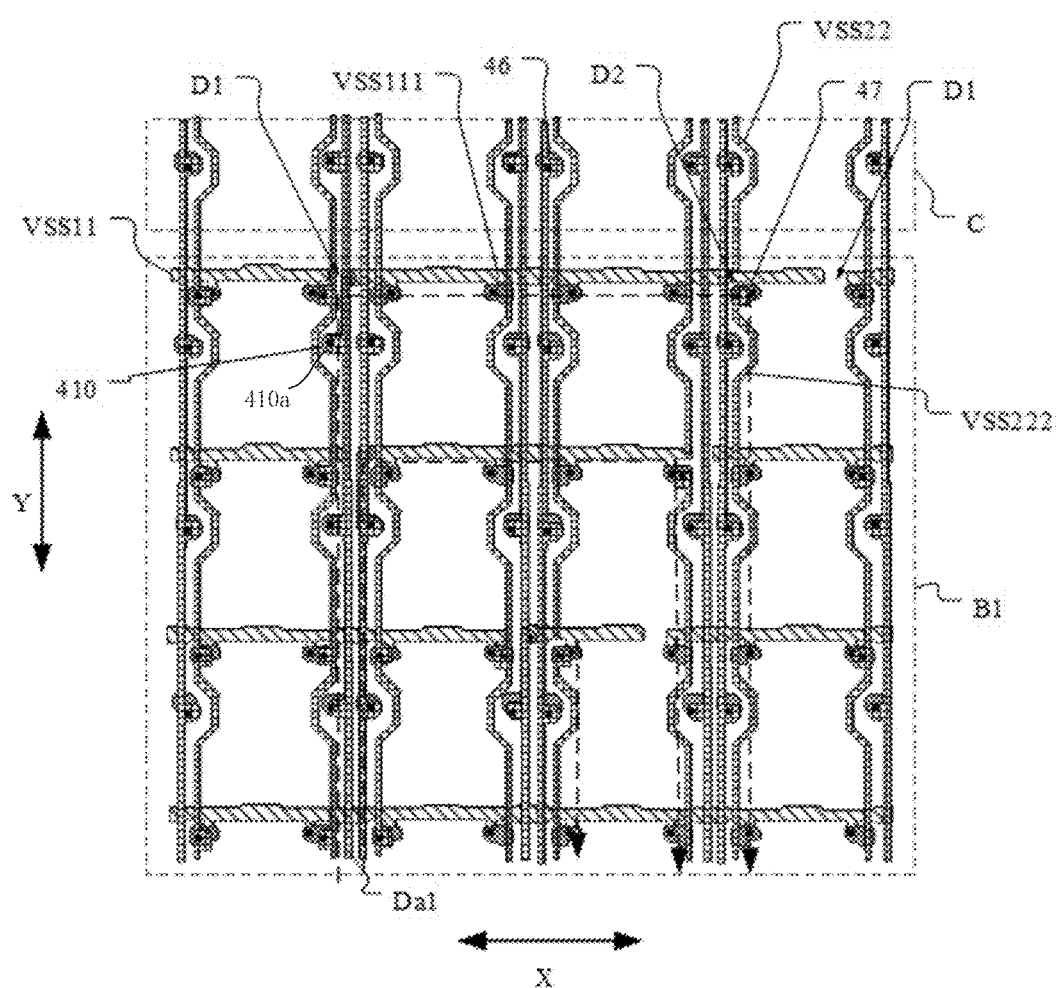
FIG. 22 is a structural layout of the first fan-out area of the display panel shown in FIG. 21.
Figure 23:
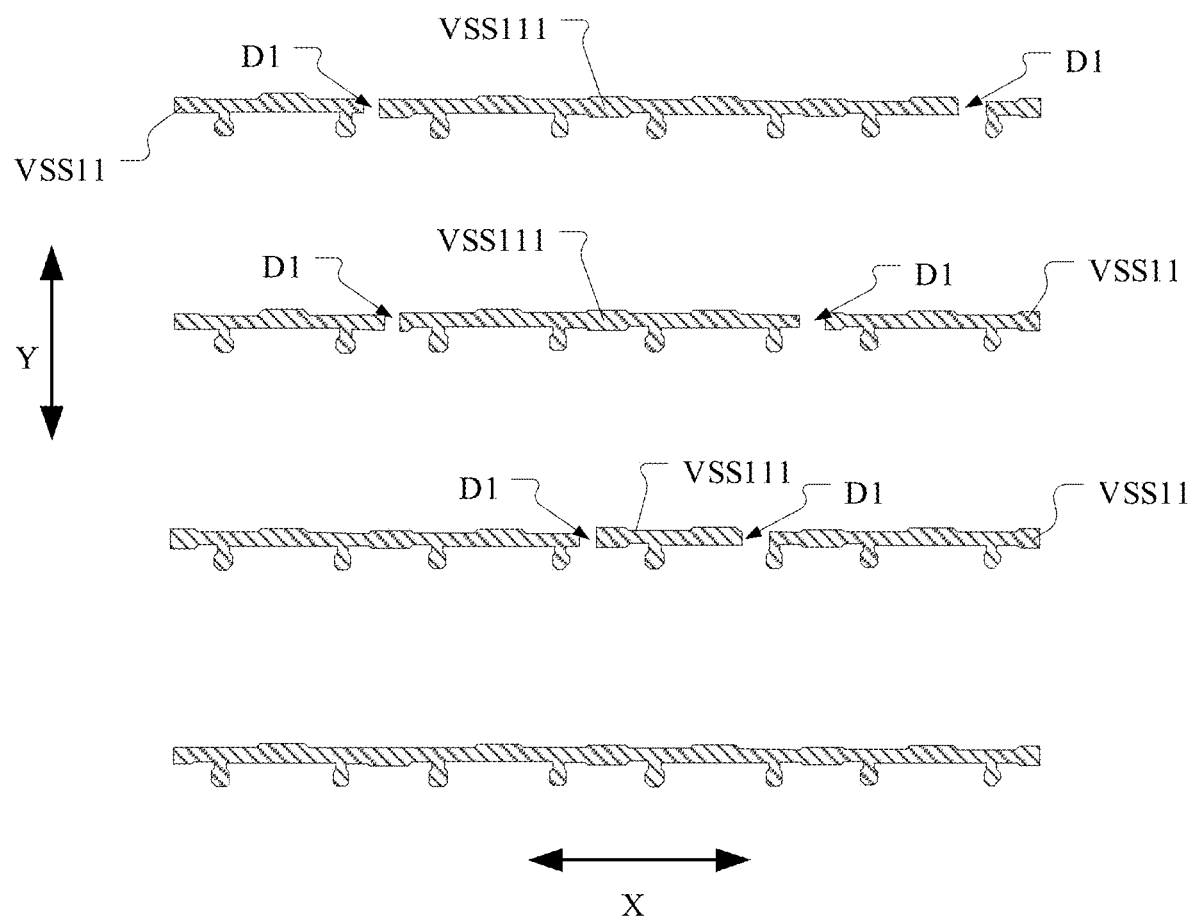
FIG. 23 is a structural layout of the third conductive layer in FIG. 22.
Figure 24:
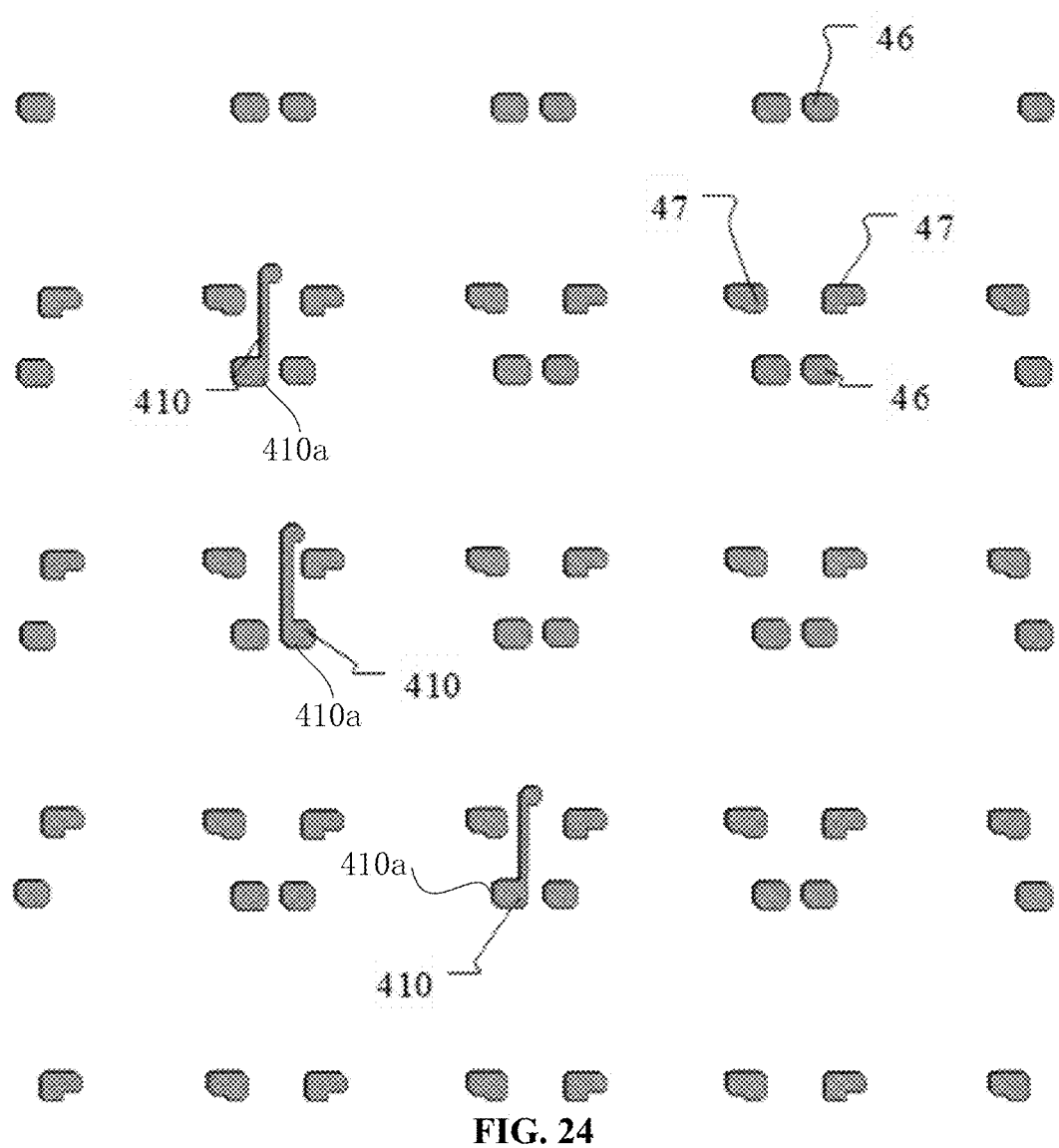
FIG. 24 is a structural layout of the fourth conductive layer in FIG. 22.
Figure 25:
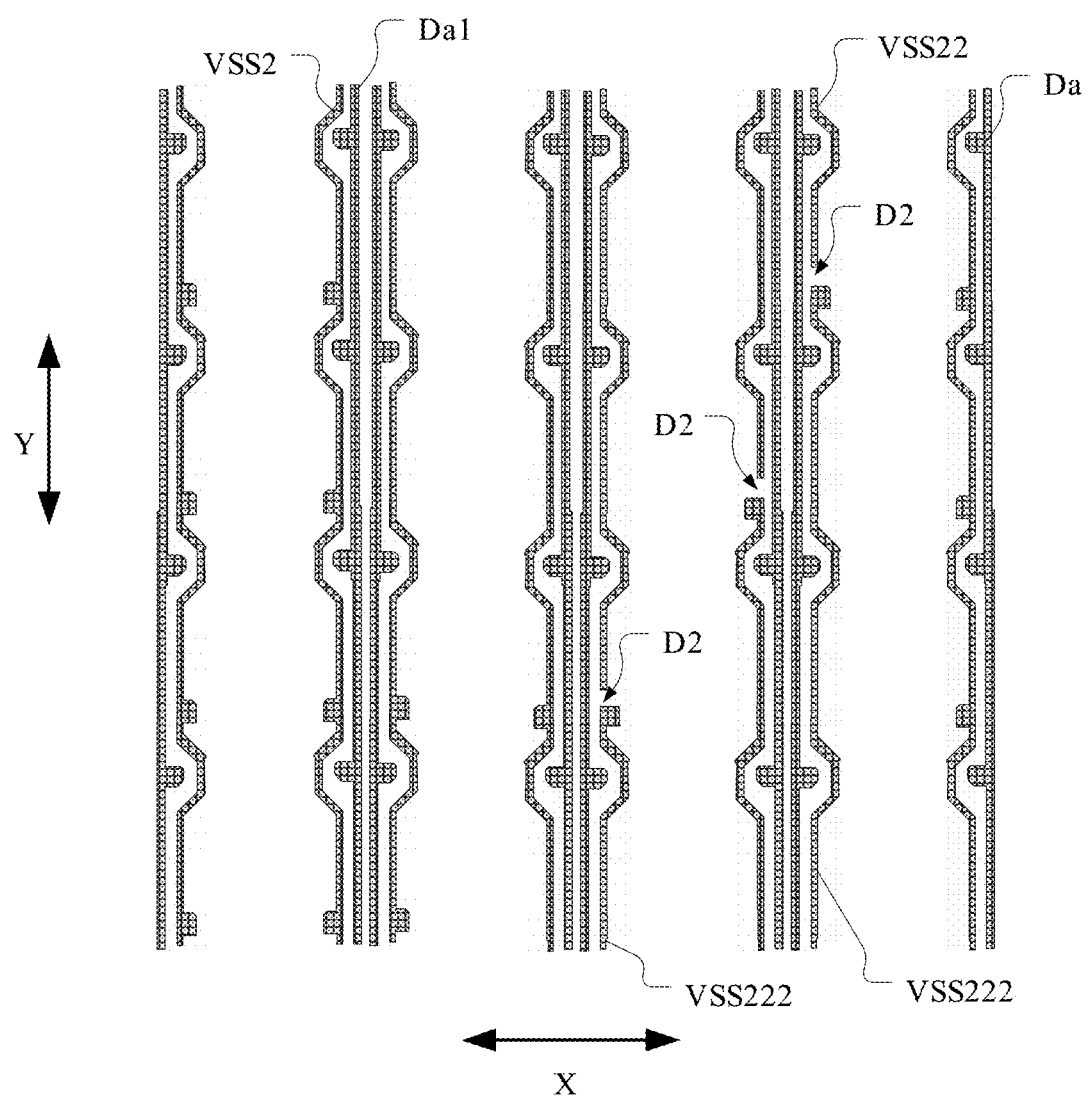
FIG. 25 is a structural layout of the fifth conductive layer in FIG. 22.
Figure 26:
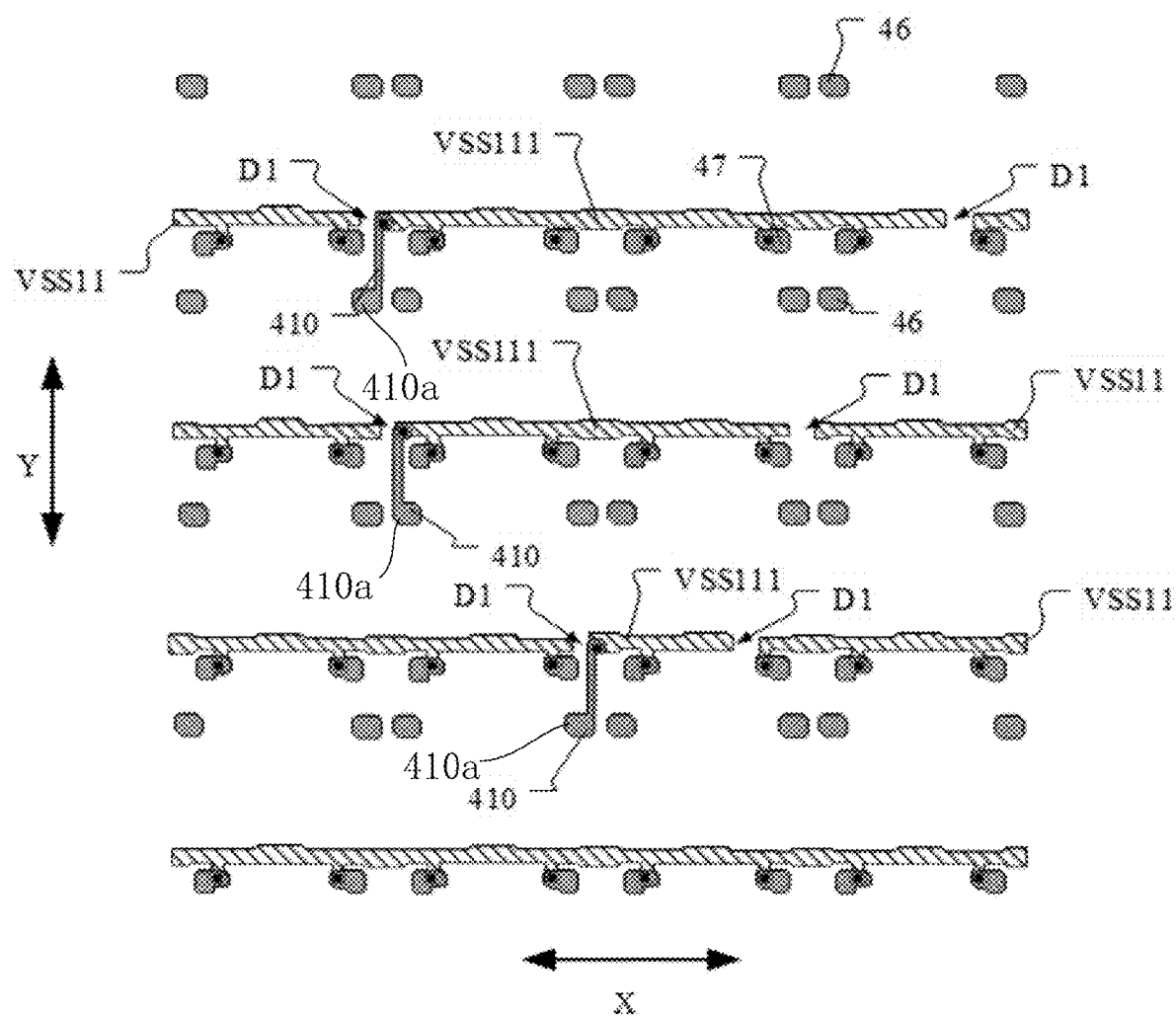
FIG. 26 is a structural layout of the third conductive layer and the fourth conductive layer in FIG. 22.

As shown in FIG. 21, it is a schematic structural diagram of another exemplary embodiment of the display panel of the present disclosure. The display panel includes a display area AA, and the display area AA includes a first fan-out area B1, a second fan-out area B2, and a normal display area C other than the first fan-out area B1 and the second fan-out area B2. Wherein, the data line Da may extend along the first direction X in the first fan-out area B1 and the second fan-out area B2, so as to be drawn out in the local areas C1 and C2 on the edge of the display area AA. The display panel can also include a first power line VSS1 and a second power line VSS2, and in the normal display area C, the arrangement of the data line Da, the first power line VSS1, and the second power line VSS2 can be as shown in FIG. 4. In addition, in the normal display area C, other structures of the display panel can also be as shown in FIG. 4. As shown in FIGS. 22-26, FIG. 22 is the structural layout of the first fan-out region of the display panel shown in FIG. 21, FIG. 23 is the structural layout of the third conductive layer in FIG. 22, FIG. 24 is the structural layout of the fourth conductive layer in FIG. 22, FIG. 25 is the structural layout of the fifth conductive layer in FIG. 22, and FIG. 26 is the structural layout of the third conductive layer and the fourth conductive layer in FIG. 22.

As shown in FIGS. 22, 23, and 26, the difference between the third conductive layer in the first fan-out area B1 and in the normal display area C is that in the first fan-out area B1, a plurality of first power lines may include a first sub-power line VSS11, two first cutouts D1 located in the first fan-out area are formed on the first sub-power line VSS11, the first sub-power line VSS11 is disconnected at the position of the first cutout D1, so as to separate the first sub-power line VSS11 into a first sub-power line segment VSS111 between the two first cutout D1.

As shown in FIGS. 22, 24, and 26, the difference between the fourth conductive layer in the first fan-out area B1 and in the normal display area C is that the fourth conductive layer in the first fan-out area B1 may further include a tenth bridging part 410. The tenth bridging part 410 is connected to the first sub-power line segment VSS111 through a via hole.

As shown in FIGS. 22, 24, and 26, the difference between the fourth conductive layer in the first fan-out area B1 and in the normal display area C is that in the first fan-out area B1, a plurality of second power lines include a second sub-power lines VSS22, a second cutout D2 is formed on the second sub-power line VSS22, and the second sub-power line VSS22 is disconnected at the second cutout D2 to separate the second sub-power line VSS22 into a second sub-power line segment VSS222, the second sub-power line segment VSS222 is located in the first fan-out area B1. The second sub-power line segment VSS222 can be connected to the seventh bridging part 47 through a via hole, and the seventh bridging part 47 can be connected to the first sub-power line section VSS111 through a via hole. The plurality of data lines includes a first data line Dal, and the first data line Dal is connected to the tenth bridging part 410 through a via hole at a widened portion 410a. In addition, the first sub-power line segment VSS111 is no longer connected to other second power line VSS2. This arrangement can use the first sub-power line segment VSS111 and the second sub-power line segment VSS222 to form a data signal transmission path, thereby forming a data signal transmission path as shown by the dotted arrow in FIG. 22. In this exemplary embodiment, the data lines may be fanned out as shown in FIG. 21. It should be noted that FIG. 22 only shows the fan-out structure of some data lines. In this exemplary embodiment, other data lines in the first fan-out area B1 can also be fan-out in the same manner. In addition, the structure in the second fan-out area B2 and the structure in the first fan-out area B1 may be mirror-symmetrical.

Figure 27:
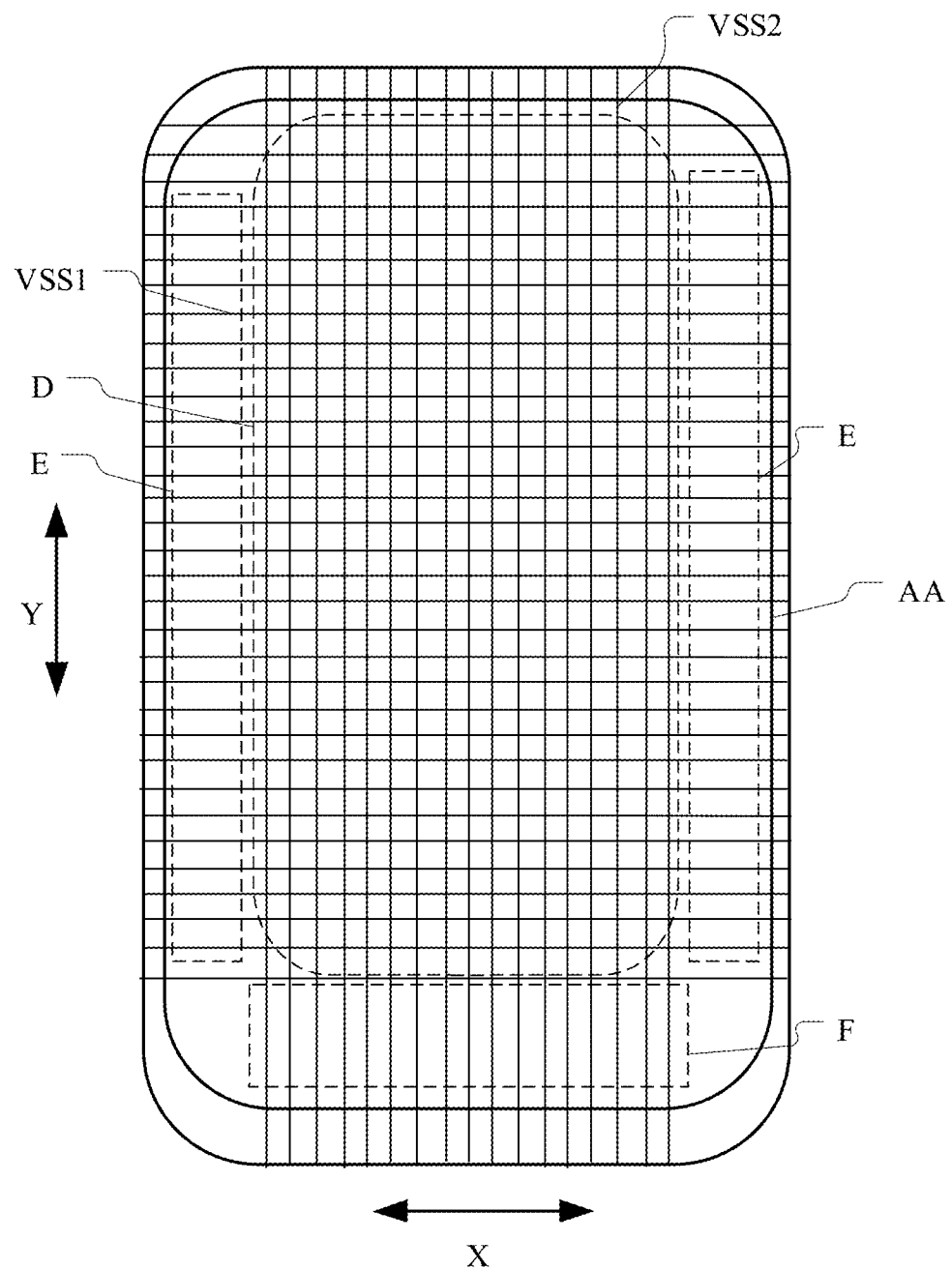
FIG. 27 is a schematic structural diagram of another exemplary embodiment of a display panel of the present disclosure.

As shown in FIG. 27, it is a schematic structural diagram of another exemplary embodiment of the display panel of the present disclosure. The display panel may include a display area AA, and the display area AA may include a normal display area D. The gate driving circuit and the fan-out area in the display panel may be located in the display area AA outside the normal display area D. For example, as shown in FIG. 27, the gate drive circuit can be integrated in the area E on both sides of the normal display area D in the first direction X, and the fan-out area can be located in the area F on one side of the normal display area D in the second direction Y.

The display panel needs to shrink the pixel driving circuit in the area E to free up the space for forming the gate driving circuit. Similarly, the display panel needs to shrink the pixel driving circuit in the area F to leave a fan-out area free. Correspondingly, in order to keep the size of the pixel driving circuits in each area of the display panel consistent, it is necessary to insert dummy pixel rows and dummy pixel columns in the normal display area D. A dummy pixel row can be inserted every interval of multiple normal pixel rows, and a dummy pixel column can be inserted every interval of multiple normal pixel columns, wherein the pixel driving circuits in the dummy pixel row and dummy pixel column may not output driving current.

Figure 28:
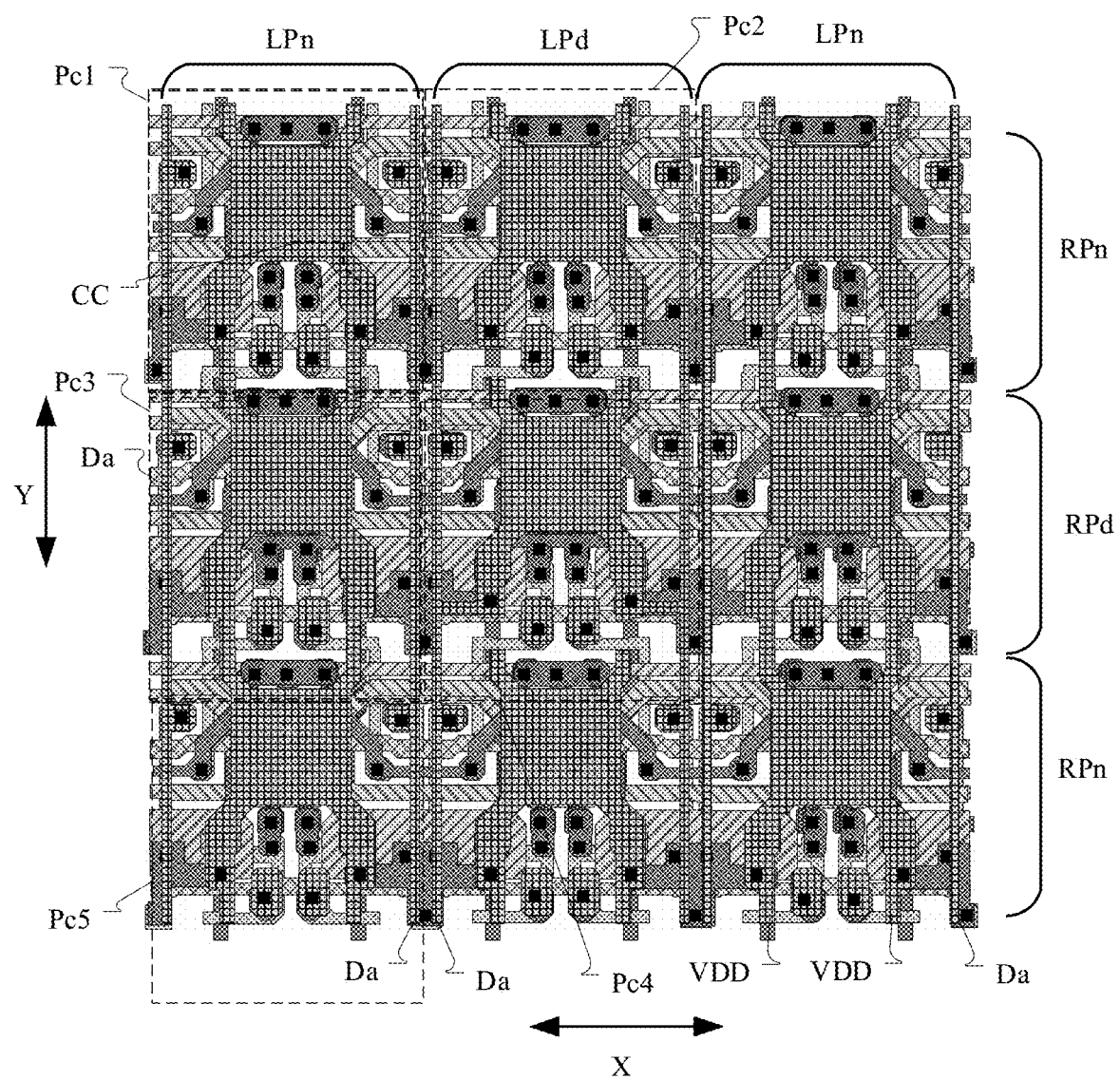
FIG. 28 is a structural layout of an exemplary embodiment of a display panel of the present disclosure.
Figure 29:
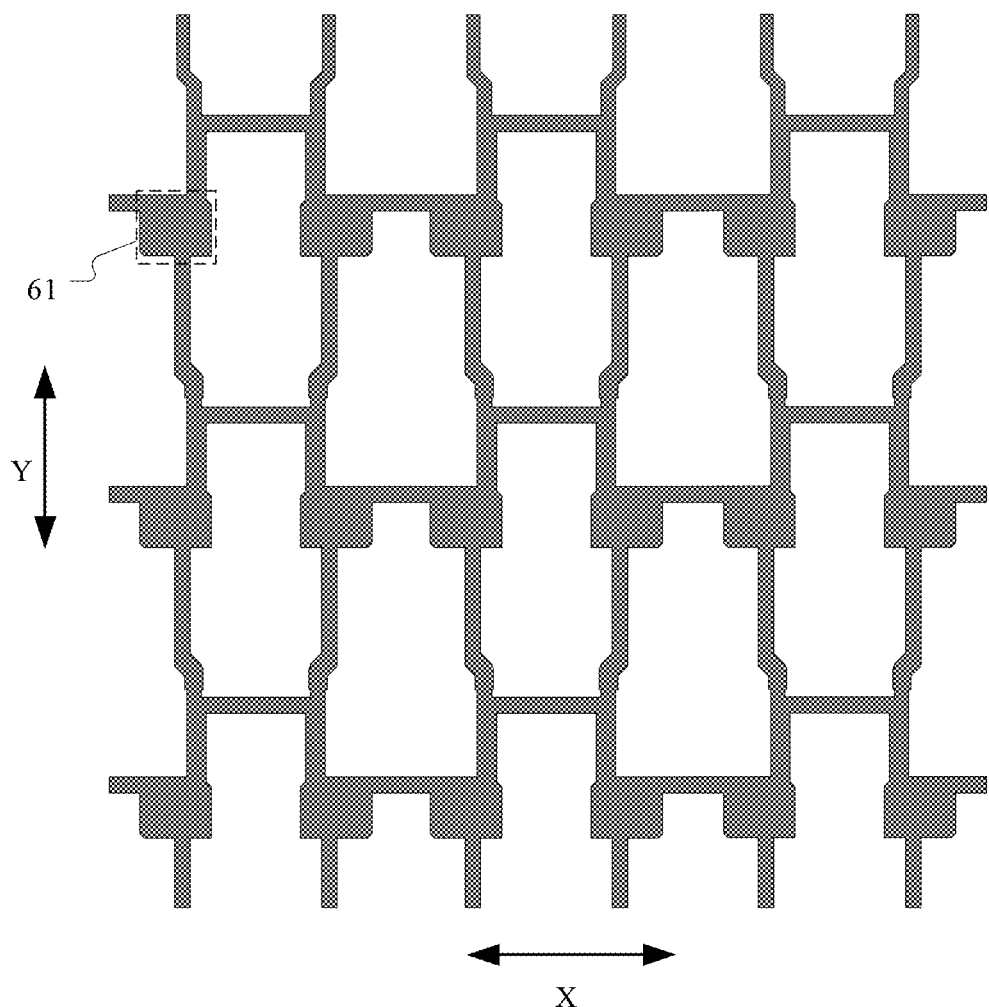
FIG. 29 is a structural layout of the light-shielding layer in FIG. 28.
Figure 30:
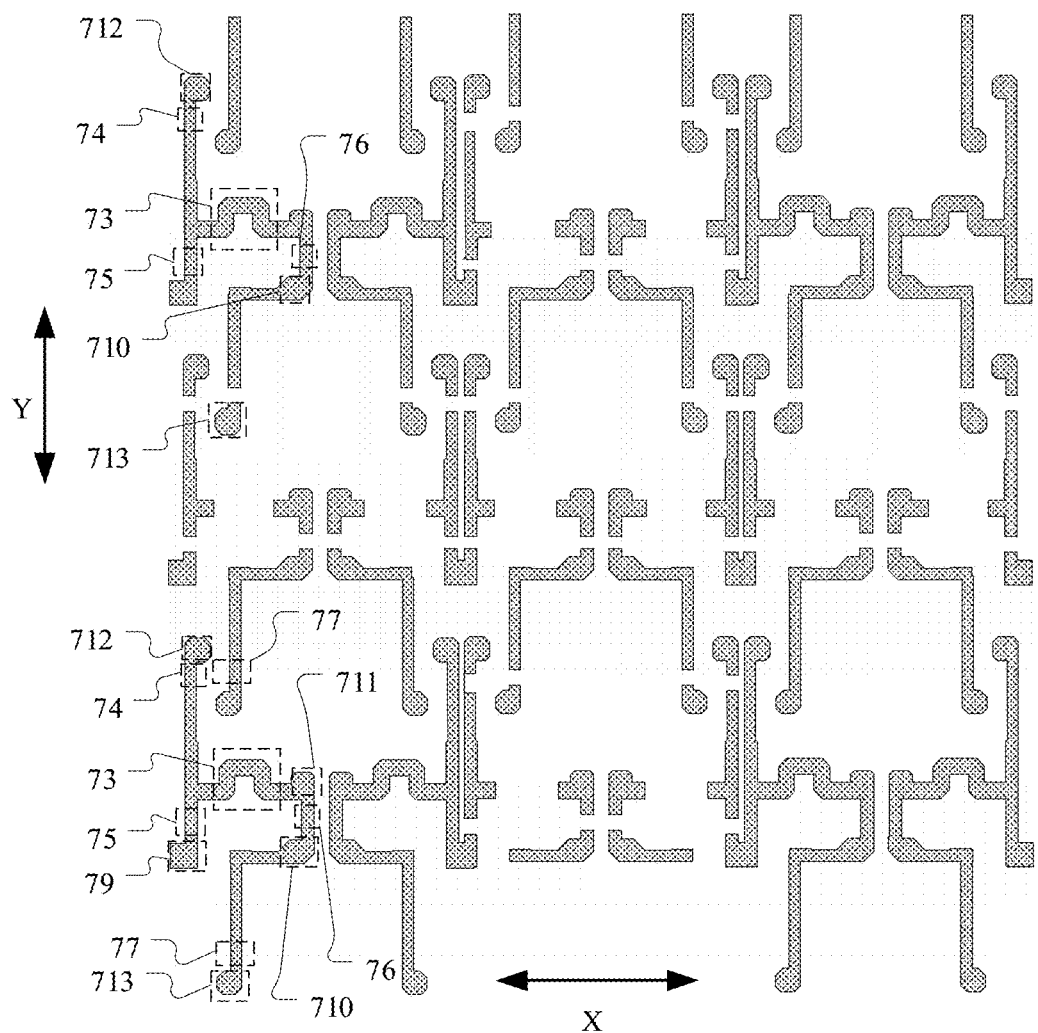
FIG. 30 is a structural layout of the first active layer in FIG. 28.
Figure 31:
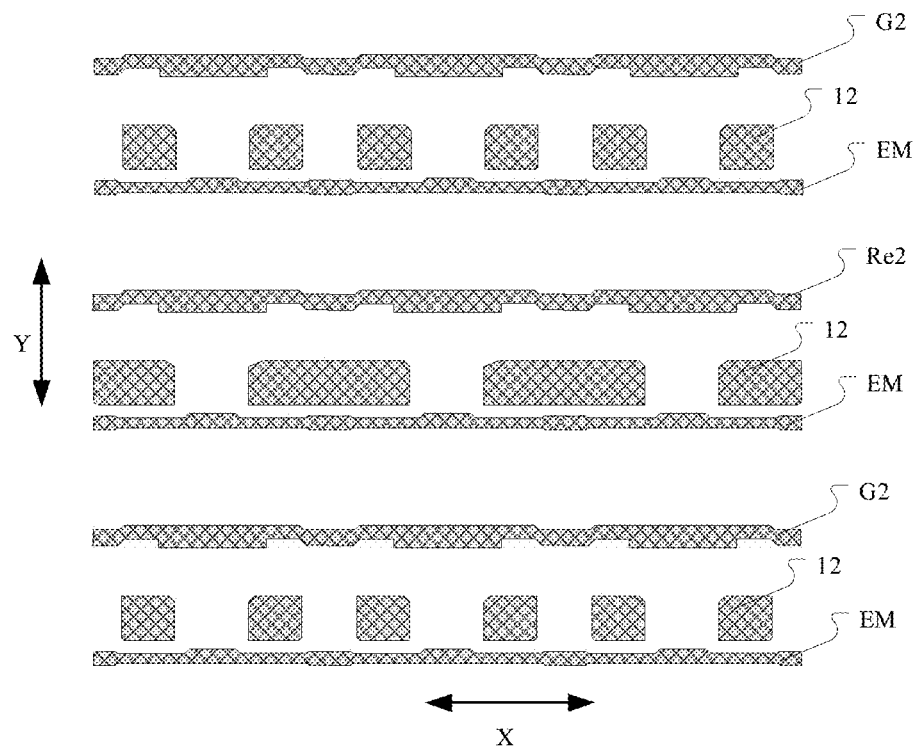
FIG. 31 is a structural layout of the first conductive layer in FIG. 28.
Figure 32:
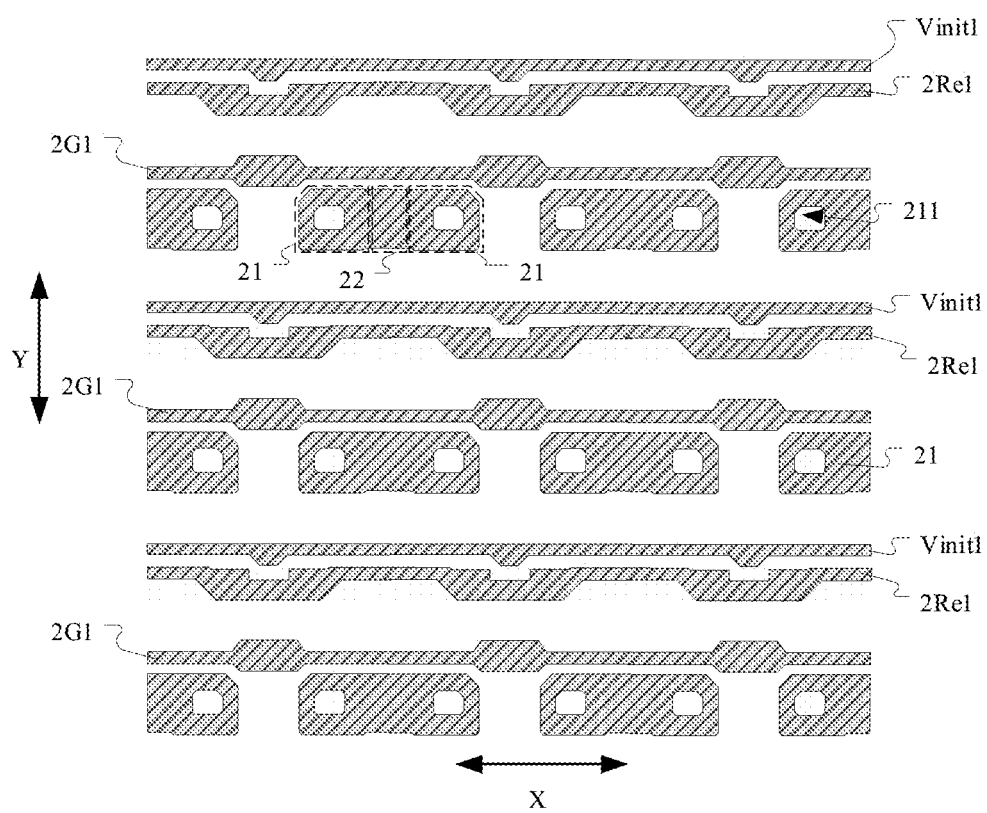
FIG. 32 is a structural layout of the second conductive layer in FIG. 28.
Figure 33:
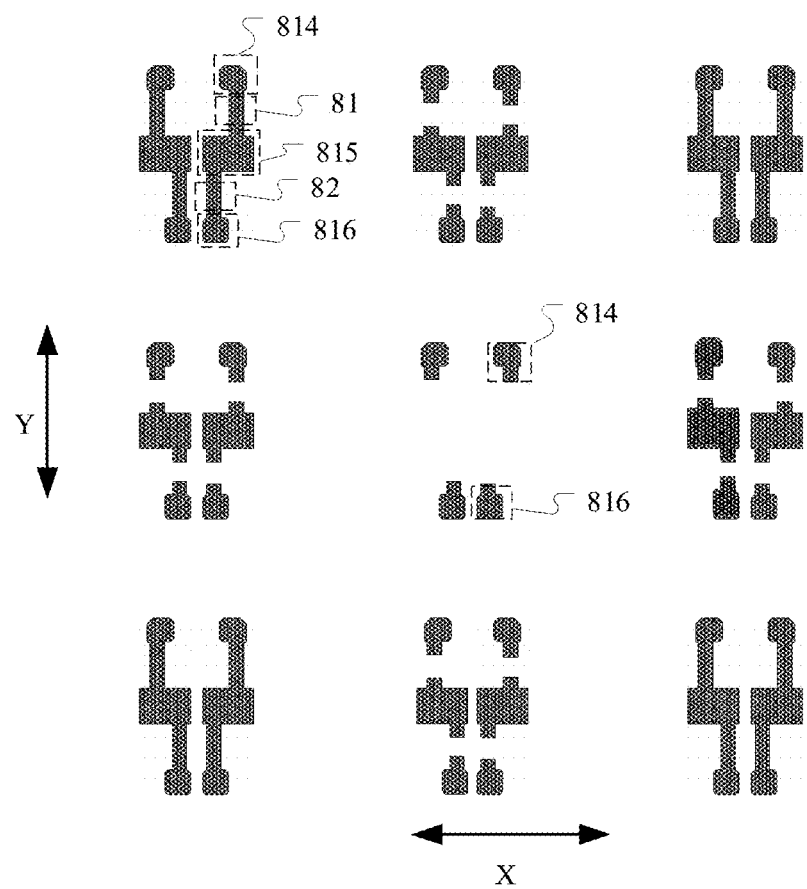
FIG. 33 is a structural layout of the second active layer in FIG. 28.
Figure 34:
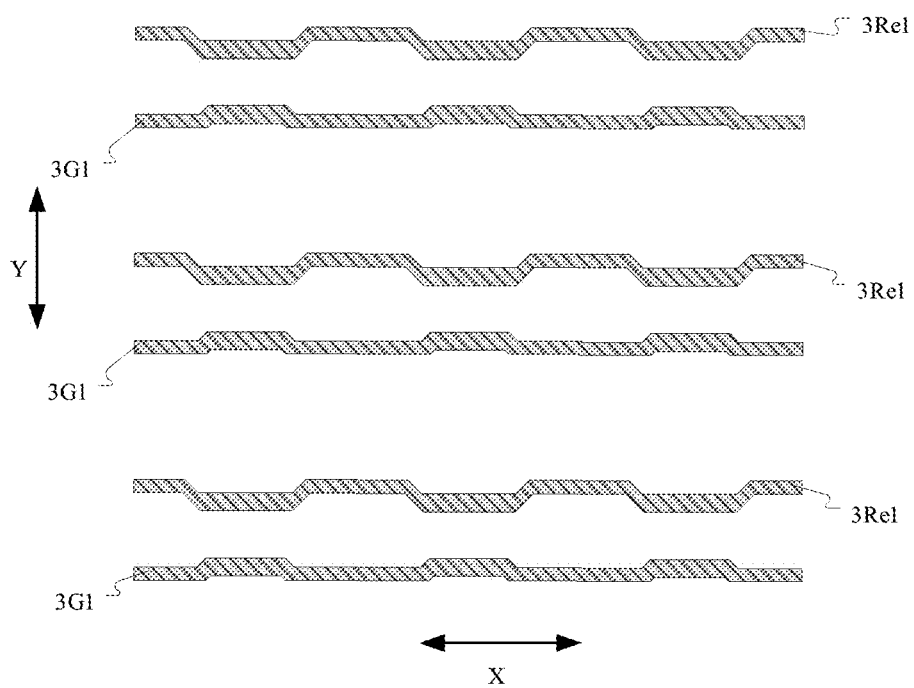
FIG. 34 is a structural layout of the third conductive layer in FIG. 28.
Figure 35:
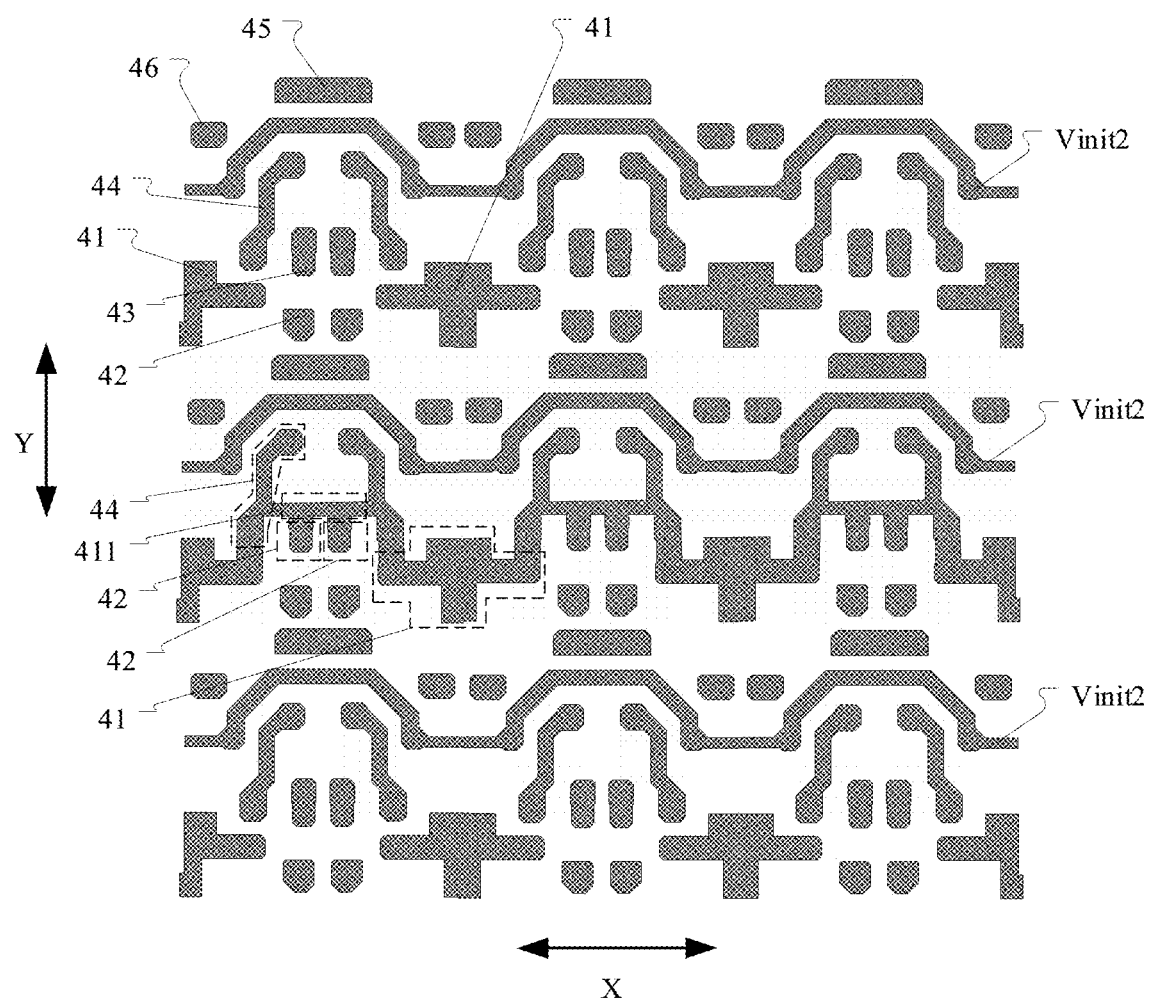
FIG. 35 is a structural layout of the fourth conductive layer in FIG. 28.
Figure 36:
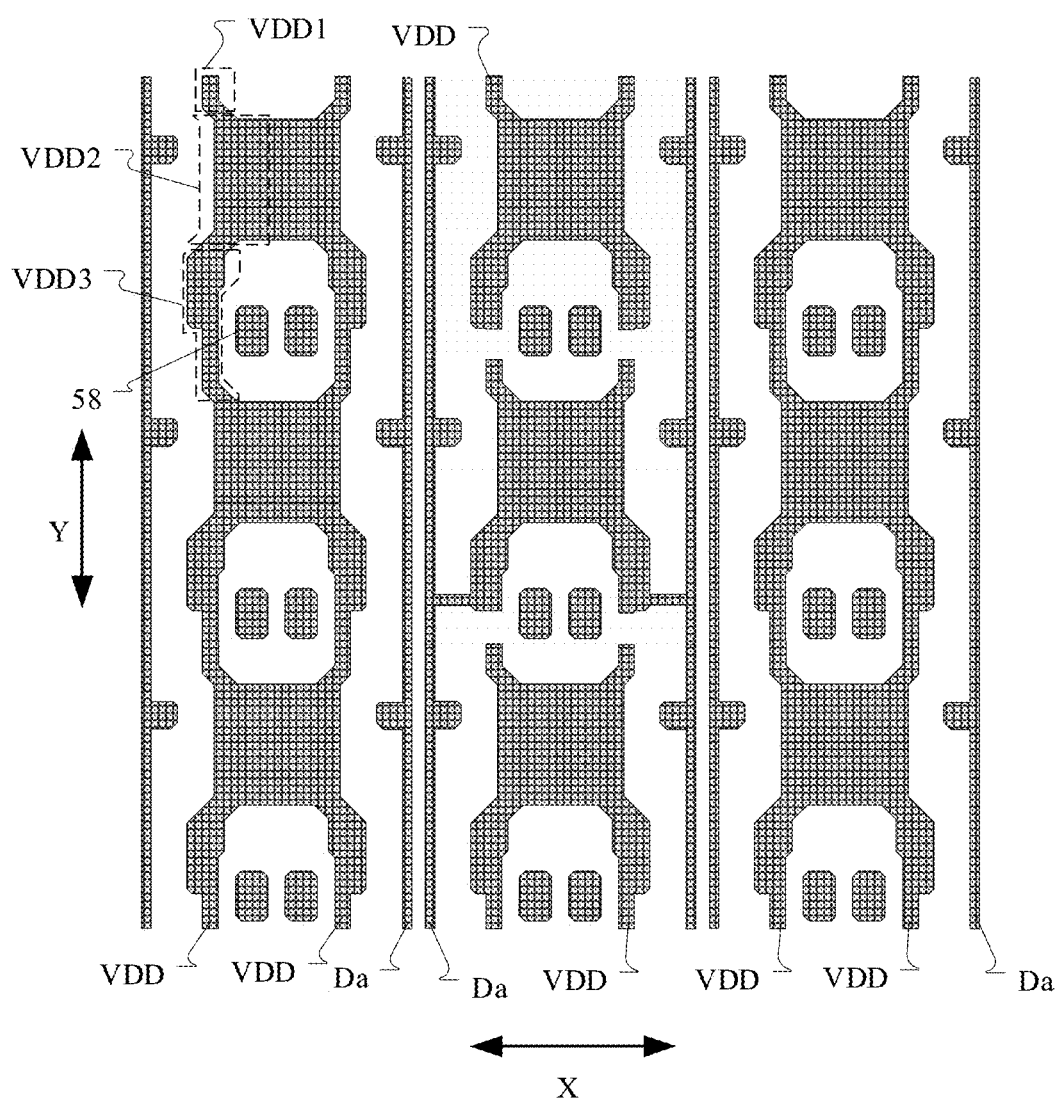
FIG. 36 is a structural layout of the fifth conductive layer in FIG. 28.
Figure 37:
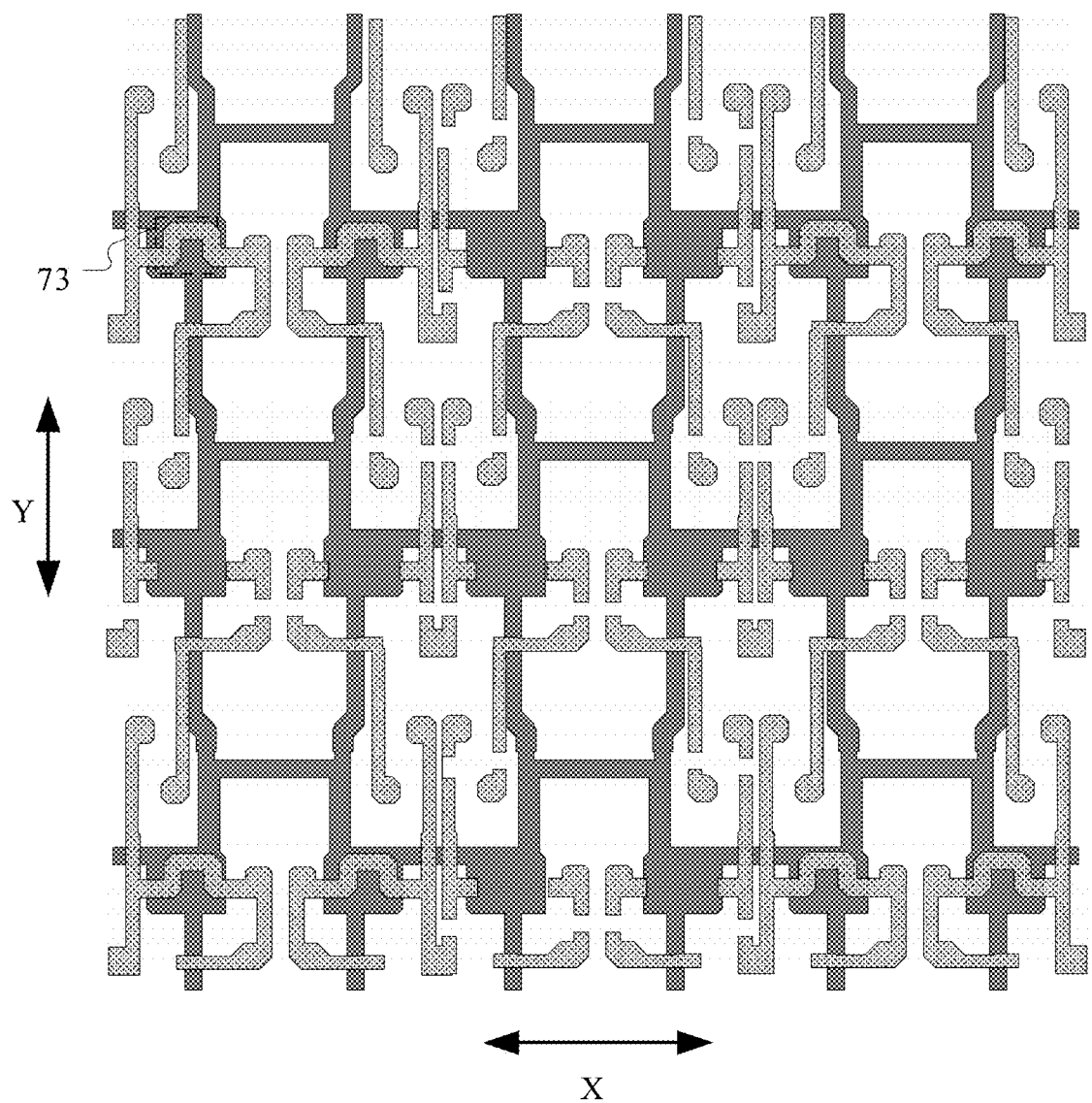
FIG. 37 is a structural layout of the light-shielding layer and the first active layer in FIG. 28.
Figure 38:
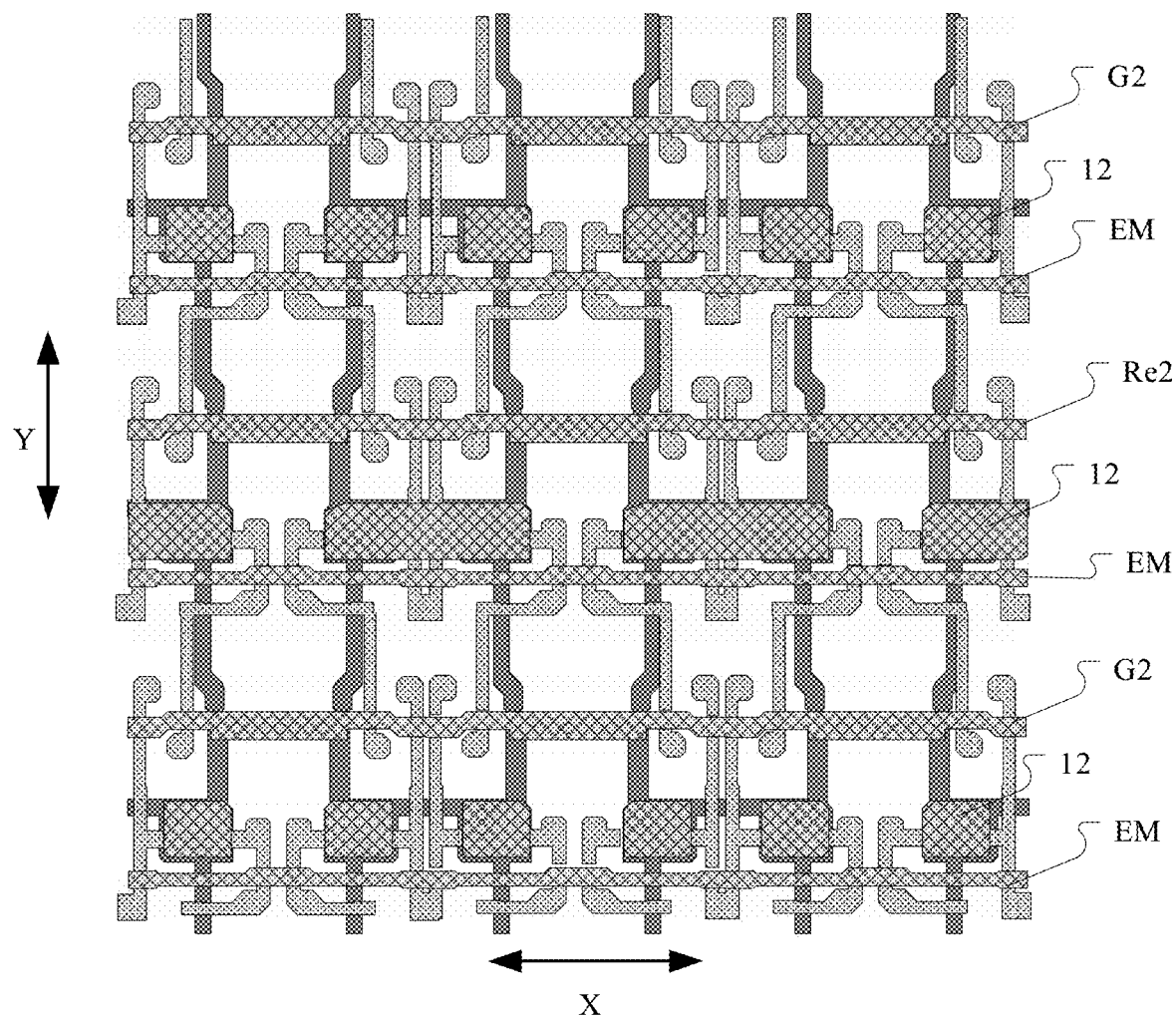
FIG. 38 is a structural layout of the light-shielding layer, the first active layer, and the first conductive layer in FIG. 28.
Figure 39:
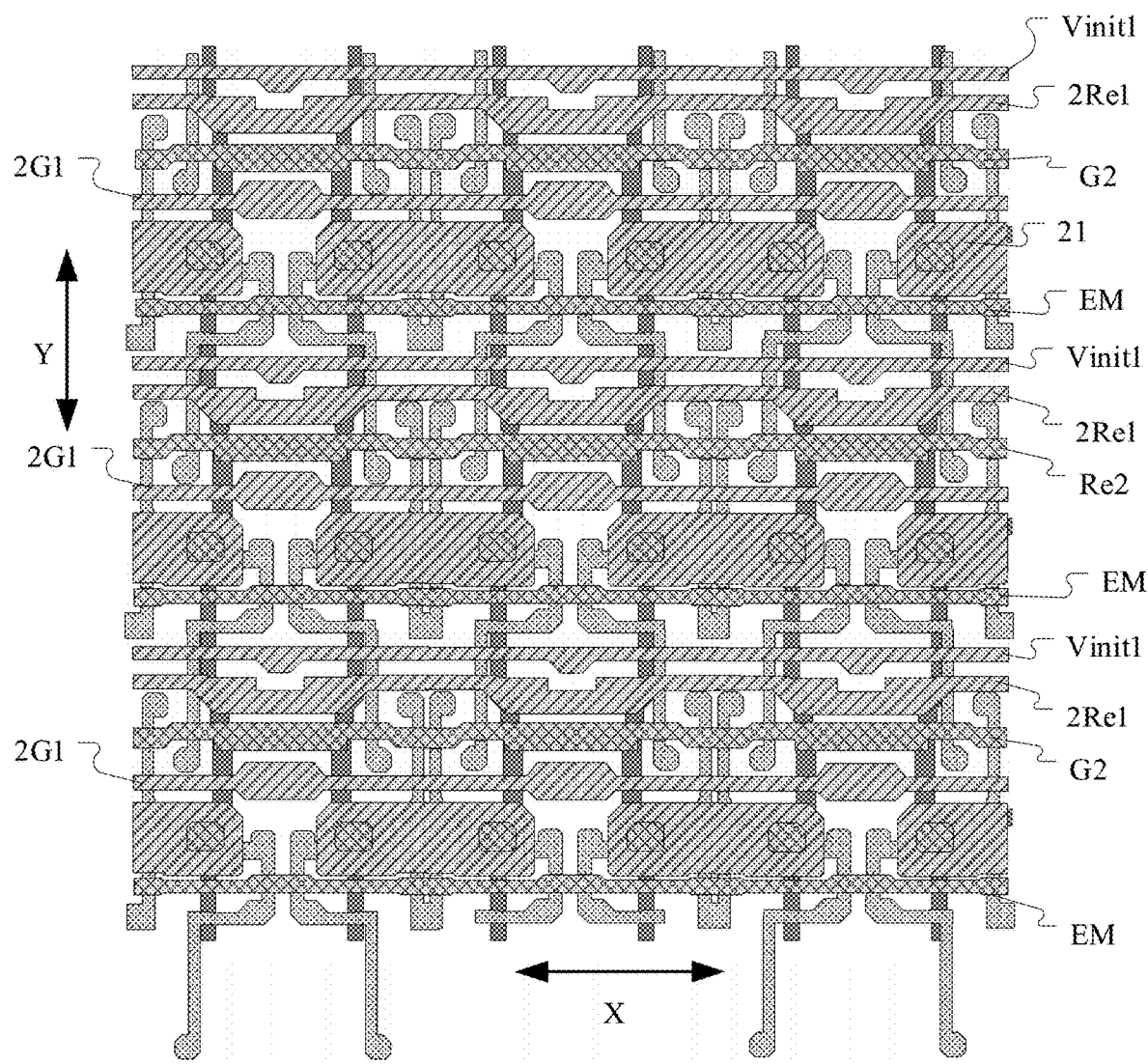
FIG. 39 is a structural layout of the light-shielding layer, the first active layer, the first conductive layer, and the second conductive layer in FIG. 28.
Figure 40:
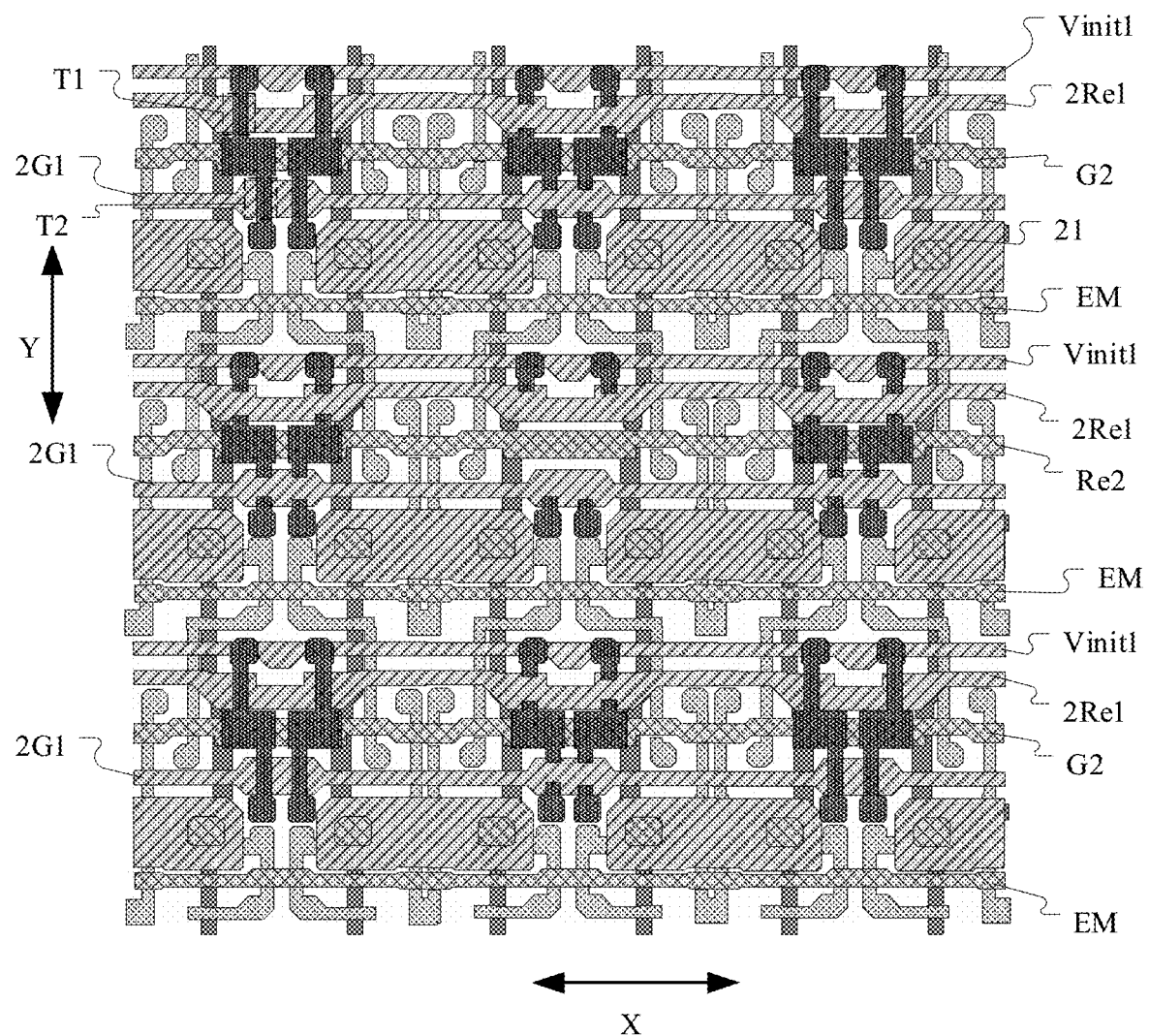
FIG. 40 is a structural layout of the light-shielding layer, the first active layer, the first conductive layer, the second conductive layer, and the second active layer in FIG. 28.
Figure 41:
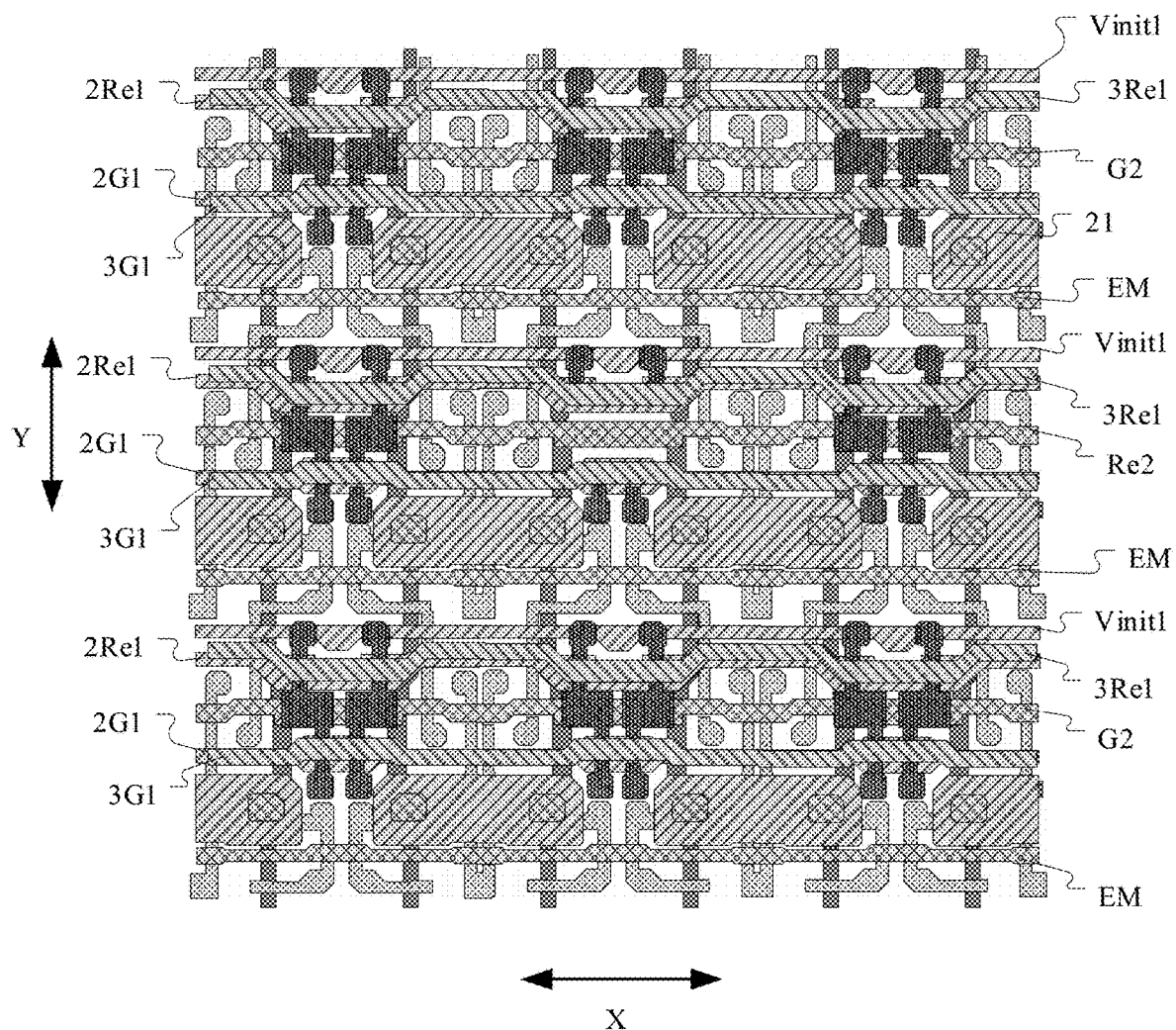
FIG. 41 is a structural layout of the light-shielding layer, the first active layer, the first conductive layer, the second conductive layer, the second active layer, and the third conductive layer in FIG. 28.

The display panel may include a base substrate, a light-shielding layer, a first active layer, a first conductive layer, a second conductive layer, a second active layer, a third conductive layer, a fourth conductive layer, and a fifth conductive layer, wherein an insulating layer may be arranged between the above-mentioned adjacent layers. As shown in FIGS. 28-42, FIG. 28 is a structural layout of an exemplary embodiment of a display panel of the present disclosure, FIG. 29 is a structural layout of the light-shielding layer in FIG. 28, FIG. 30 is a structural layout of the first active layer in FIG. 28, FIG. 31 is a structural layout of the first conductive layer in FIG. 28, FIG. 32 is a structural layout of the second conductive layer in FIG. 28, FIG. 33 is a structural layout of the second active layer in FIG. 28, FIG. 34 is a structural layout of the third conductive layer in FIG. 28, FIG. 35 is a structural layout of the fourth conductive layer in FIG. 28, FIG. 36 is the structural layout of the fifth conductive layer in FIG. 28, FIG. 37 is a structural layout of the light-shielding layer and the first active layer in FIG. 28, FIG. 38 is a structural layout of the light-shielding layer, the first active layer, and the first conductive layer in FIG. 28, FIG. 39 is a structural layout of the light-shielding layer, the first active layer, the first conductive layer, and the first conductive layer in FIG. 28, FIG. 40 is the structural layout of the light-shielding layer, the first active layer, the first conductive layer, the second conductive layer, and the second active layer in FIG. 28, FIG. 41 is a structural layout of the light-shielding layer, the first active layer, the first conductive layer, the second conductive layer, the second active layer, and the third conductive layer in FIG. 28, and FIG. 42 a structural layout of the light-shielding layer, the first active layer, the first conductive layer, the second conductive layer, the second active layer, the third conductive layer, and the fourth conductive layer. The display panel may include a plurality of pixel driving circuits shown in FIG. 1. As shown in FIG. 28, the display panel includes normal pixel rows RPn, dummy pixel rows RPd, normal pixel columns LPn, and dummy pixel columns LPd. Wherein, the display panel may include a plurality of pixel unit groups arranged in an array along the first direction X and the second direction Y, and each pixel unit group may include two mirror-symmetrical pixel driving circuits. The plurality of pixel unit groups located in the normal pixel row RPn and in the normal pixel column LPn may include a first pixel unit group Pc1 located at the adjacent previous row of the dummy pixel row RPd and a fifth pixel unit group Pc5 located in other positions. The plurality of pixel unit groups may also include a second pixel unit group Pc2 located in the normal pixel column LPn and a dummy pixel column LPd, a third pixel unit group Pc3 located in the dummy pixel row RPd and located in the normal pixel column LPn, and a fourth pixel unit group Pc4 located in the dummy pixel row LPn and located in the dummy pixel column LPd.

As shown in FIGS. 28, 29, and 37, the light-shielding layer may include a plurality of light-shielding parts 61, and adjacent light-shielding parts 61 may be connected to each other.

As shown in FIGS. 28, 30, and 38, the first active layer may include a third active part 73, a fourth active part 74, a fifth active part 75, a sixth active part 76 and a seventh active part 77 located in the fifth pixel unit group Pc5. Wherein, the third active part 73 can be used to form the channel region of the driving transistor T3; the fourth active part 74 can be used to form the channel region of the fourth transistor T4; the fifth active part 75 can be used to form the channel region of the fifth transistors T5; the sixth active part 76 may be used to form the channel region of the sixth transistor T6; and the seventh active part 77 may be used to form the channel region of the seventh transistor T7. The first active layer further includes a ninth active part 79, a tenth active part 710, an eleventh active part 711, a twelfth active part 712, and a thirteenth active part 713. Wherein, the ninth active part 79 is connected to the side of the fifth active part 75 away from the third active part 73, and the ninth active part 79 is connected between two adjacent fifth active parts 75 in the pixel unit groups adjacent in the row direction X. The tenth active part 710 is connected between the sixth active part 76 and the seventh active part 77, the eleventh active part 711 is connected between the sixth active part 76 and the third active part 73, the twelfth active part 712 is connected to an end of the fourth active part 74 away from the third active part 73, and the thirteenth active part 713 is connected to an end of the seventh active part 77 away from the sixth active part 76. Wherein, the orthographic projection of the light-shielding part 61 on the base substrate can cover the orthographic projection of the third active part 73 on the base substrate, and the light-shielding part 61 can reduce the influence of light on the driving characteristics of the driving transistor T3.

As shown in FIGS. 28, 30, and 38, compared with the fifth pixel unit group Pc5, in the first pixel unit group Pc1, a cutout is formed at the position of the seventh active part 77, that is, there is no seventh active part 77 in the first pixel unit group Pc1.

As shown in FIGS. 28, 30, and 38, compared with the fifth pixel unit group Pc5, in the second pixel unit group Pc2 and the fourth pixel unit group Pc4, a cutout may be formed at the position of the third active part 73, the fourth active part 74, the fifth active part 75, the sixth active part 76, and the seventh active part 77, that is, neither the second pixel unit group Pc2 nor the fourth pixel unit group Pc4 is provided with the third active part 73, the fourth active part 74, the fifth active part 75, the sixth active part 76, and the seventh active part 77.

As shown in FIGS. 28, 30, and 38, compared with the fifth pixel unit group Pc5, in the third pixel unit group Pc3, a cutout may be formed at the position of the third active part 73, the fourth active part 74, the fifth active part 75, and the sixth active part 76, that is, the third active part 73, the fourth active part 74, the fifth active part 75, and the sixth active part 76 are not provided in the second pixel unit group Pc2. The seventh active part 77 in the fifth pixel unit group Pc5 can be used as the channel region of the seventh transistor in the first pixel unit group Pc1, and correspondingly, the seventh active part 77 in the fifth pixel unit group Pc5 shall be connected to the tenth active part 710 in the first pixel unit group Pc1, wherein the seventh active part 77 in the fifth pixel unit group Pc5 and the tenth active part 710 in the first pixel unit group Pc1 can be connected through any conductive layer.

In addition, the first active layer can be formed of polysilicon material, and correspondingly, the driving transistor T3, the fourth transistor T4, the fifth transistor T5, the sixth transistor T6 and the seventh transistor T7 can be P-type low temperature polysilicon thin film transistors.

As shown in FIGS. 28, 31, and 38, the first conductive layer may include: a second conductive part 12, a second gate line G2, an enable signal line EM, and a second reset signal line Re2. The second gate line G2 can be used to provide the second gate drive signal terminal in FIG. 1; the enable signal line EM can be used to provide the enable signal terminal in FIG. 1; and the second reset signal line Re2 can be used to provide the second reset signal terminal in FIG. 1. The orthographic projection of the second gate line G2 on the substrate, the orthographic projection of the enable signal line EM on the substrate, and the orthographic projection of the second reset signal line Re2 on the substrate can all extend along the first direction X. The orthographic projection of the second gate line G2 on the substrate covers the orthographic projection of the fourth active part 74 on the substrate, and part of the structure of the second gate line G2 is used to form the gate electrode of the fourth transistor. The orthographic projection of the enable signal line EM on the base substrate covers the orthographic projection of the fifth active part 75 on the base substrate and the orthographic projection of the sixth active part 76 on the base substrate, and part of the structure of the enable signal line EM may be used to form the gate electrodes of the fifth transistor T5 and the sixth transistor T6 respectively. The orthographic projection of the second reset signal line Re2 on the substrate can cover the orthographic projection of the seventh active part 77 on the substrate, and part of the structure of the second reset signal line Re2 may be used to form the gate electrode of the seventh transistor T7. The orthographic projection of the second conductive part 12 on the base substrate covers the orthographic projection of the third active part 73 on the base substrate, and the second conductive part 12 can be used to form the gate electrode of the driving transistor T3 and the first electrode of the capacitor C. Two adjacent second conductive parts 21 in adjacent pixel unit groups in the first direction X may be connected to each other. As shown in FIGS. 28 and 38, the second gate line G2 in the current row of pixel driving circuits can be multiplexed as the second reset signal line Re2 in the previous row of pixel driving circuits. The light-shielding layer can also be connected to a stable power supply terminal. For example, the light-shielding layer can be connected to the first power supply terminal, the first initial signal terminal, the second initial signal terminal, etc. in FIG. 1. The light-shielding part may stabilize the voltage of the second conductive part 12, thereby reducing the voltage fluctuation of the gate electrode of the driving transistor T3 in the light-emitting phase. In addition, the display panel can use the first conductive layer as a mask to conduct conductorization treatment on the first active layer, that is, the region covered by the first conductive layer in the first active layer can form the channel region of the transistor, and the region of the first active layer not covered by the first conductive layer forms a conductor structure.

As shown in FIGS. 28, 32, and 39, the second conductive layer may include: a first initial signal line Vinit1, a third reset signal line 2Re1, a third gate line 2G1, and a plurality of first conductive parts 21. Wherein, the first initial signal line Vinit1 is used to provide the first initial signal terminal in FIG. 1, the third reset signal line 2Re1 can be used to provide the first reset signal terminal in FIG. 1, and the third gate line 2G1 can be used to provide the first gate drive signal terminal in FIG. 1. The orthographic projection of the first initial signal line Vinit1 on the substrate, the orthographic projection of the third reset signal line 2Re1 on the substrate, and the orthographic projection of the third gate line 2G1 on the substrate can all be extended along the first direction X. As shown in FIG. 32, the second conductive layer may further include a plurality of first connection parts 22. In the pixel unit groups adjacent in the first direction X, the first connection parts 22 are connected between the two first conductive parts 21 adjacent in the first direction X.

As shown in FIGS. 28, 33, and 40, the second active layer may include a first active part 81, a second active part 82, a fourteenth active part 814, a fifteenth active part 815 and a sixteenth active part 816 located in the first pixel unit group Pc1. The first active part 81 is used to form the channel region of the first transistor T1, and the second active part 82 is used to form the channel region of the second transistor T2. The fifteenth active part 815 is connected between the first active part 81 and the second active part 82. The fourteenth active part 814 is connected to an end of the first active part 81 away from the fifteenth active part 815, and the sixteenth active part 816 is connected to an end of the second active part 82 away from the first active part 81.

As shown in FIGS. 28, 33, and 40, the structure of the second active layer in the fifth pixel unit group Pc5 is the same as the structure of the second active layer in the first pixel unit group Pc1.

As shown in FIGS. 28, 33, and 40, compared with the first pixel unit group Pc1, in the second pixel unit group Pc2 and the third pixel unit group Pc3, the cutout is formed at the position of the first active part and the second active part, that is, the second pixel unit group Pc2 and the third pixel unit group Pc3 are not provided with the first active part and the second active part.

As shown in FIGS. 28, 33, and 40, compared with the first pixel unit group Pc1, in the fourth pixel unit group, the cutout is formed at the position of the first active part 81, the second active part 82, and the fifteenth active part 815, that is, the fourth pixel unit group is only provided with the fourteenth active part 814 and the sixteenth active part 816.

In addition, the second active layer may be formed of InGaZnO, and correspondingly, the first transistor T1 and the second transistor T2 may be N-type metal oxide thin film transistors. The orthographic projection of the third gate line 2G1 on the substrate may cover the orthographic projection of the second active part 82 on the substrate, and part of the structure of the third gate line 2G1 may be used to form the bottom gate electrode of the second transistor T2. The orthographic projection of the third reset signal line 2Re1 on the substrate can cover the orthographic projection of the first active part 81 on the substrate, and part of the structure of the third reset signal line 2Re1 can be used to form the bottom gate electrode of the first transistor T1.

As shown in FIGS. 28, 34, and 41, the third conductive layer may include a first reset signal line 3Re1 and a first gate line 3G1. Both the orthographic projection of the first reset signal line 3Re1 on the base substrate and the orthographic projection of the first gate line 3G1 on the base substrate may extend along the first direction X. The first reset signal line 3Re1 can be used to provide the first reset signal terminal in FIG. 1, and the orthographic projection of the first reset signal line 3Re1 on the substrate can cover the orthographic projection of the first active part 81 on the substrate. Part of the structure of the first reset signal line 3Re1 can be used to form the top gate electrode of the first transistor T1, and at the same time, the first reset signal line 3Re1 can be connected to the third reset signal line 2Re1 through a via hole located in the frame area of the display panel. The first gate line 3G1 can be used to provide the first gate driving signal terminal in FIG. 1, and the orthographic projection of the first gate line 3G1 on the substrate can cover the orthographic projection of the second active part 82 on the substrate. Part of the structure of the first gate line 3G1 can be used to form the top gate electrode of the second transistor T2, and at the same time, the first gate line 3G1 can be connected to the third gate line 2G1 through a via hole located in the frame area of the display panel. The display panel can use the third conductive layer as a mask to conduct conductorization treatment on the second active layer, that is, the area covered by the third conductive layer in the second active layer can form the channel region of the transistor, and the area of the second active layer not covered by the third conductive layer may form conductor structures.

Figure 42:
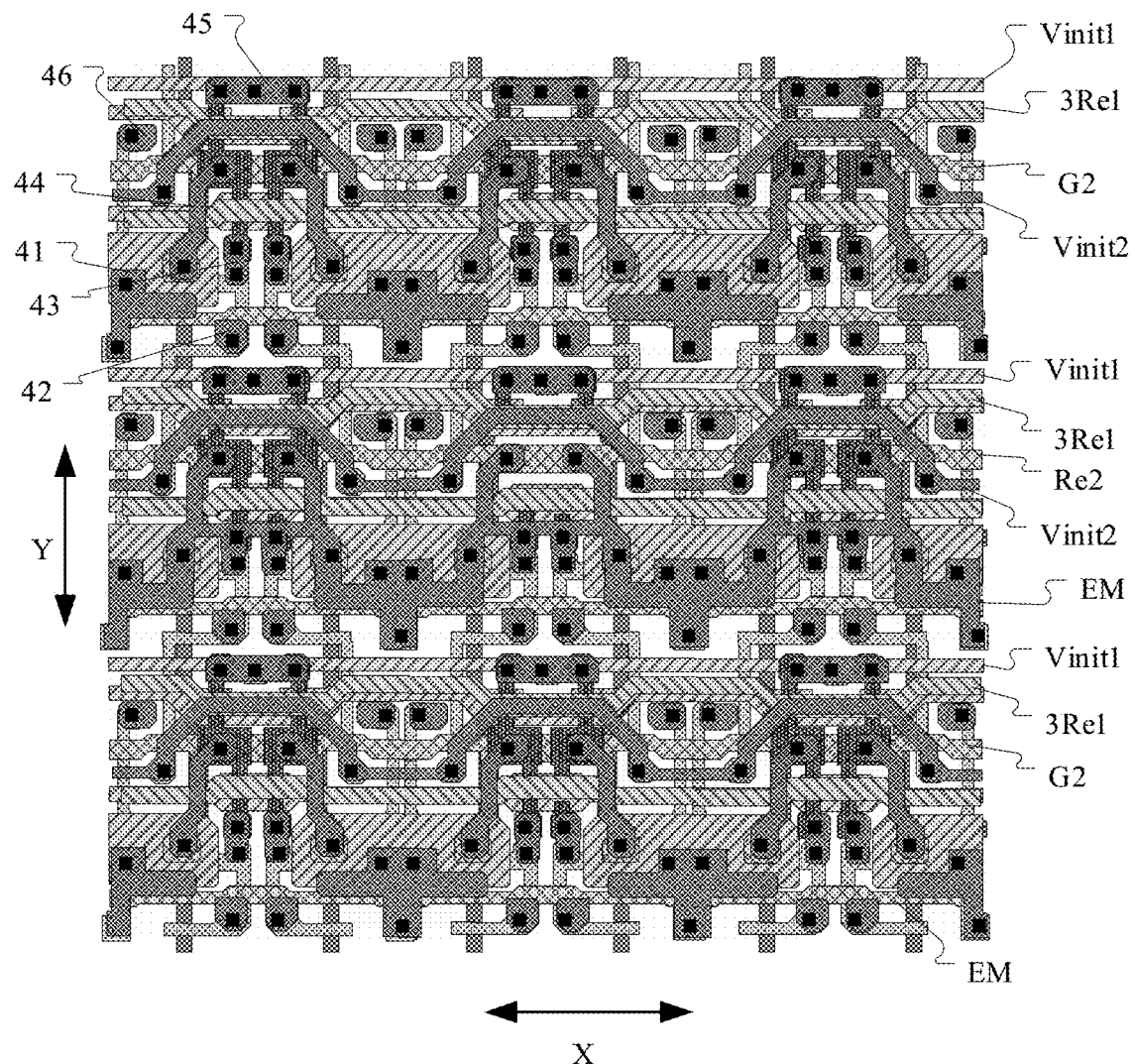
FIG. 42 is a structural layout of the light-shielding layer, the first active layer, the first conductive layer, the second conductive layer, the second active layer, the third conductive layer, and the fourth conductive layer in FIG. 28.

As shown in FIGS. 28, 35, and 42, the fourth conductive layer may include a first bridging part 41, a second bridging part 42, a third bridging part 43, a fourth bridging part 44, a fifth bridging part 45, a sixth bridging part 46, and a second initial signal line Vinit2. Wherein, the first bridging part 41 can be connected to the first connection part 22 through a via hole, and connected to the ninth active part 79 through a via hole, so as to connect the first electrode of the fifth transistor and the second electrode of the capacitor C. Wherein, adjacent pixel driving circuits in adjacent pixel unit groups in the first direction X may share the same first bridging part 41. The second bridging part 42 may be connected to the tenth active part 710 through a via hole, so as to connect the second electrode of the sixth transistor T6 and the second electrode of the seventh transistor T7. The third bridging part 43 can be respectively connected to the eleventh active part 711 and the sixteenth active part 816 through via holes to connect the second electrode of the second transistor T2, the first electrode of the sixth transistor T6, and the second electrode of the driving transistor T3. The fourth bridging part 44 can be connected to the fifteenth active part 815 and the second conductive part 12 through via holes, so as to connect the first electrode of the second transistor T2 and the gate electrode of the driving transistor. As shown in FIG. 32, an opening 211 is formed on the first conductive part 21, and the orthographic projection of the via hole connected between the second conductive part 12 and the fourth bridging part 44 on the base substrate is located within the orthographic projection of the opening 211 on the base substrate, so that the via hole and the first conductive part 21 are insulated from each other. The fifth bridging part 45 can be connected to the fourteenth active part 814 and the first initial signal line Vinit1 through via holes, so as to connect the first electrode of the first transistor and the first initial signal terminal. Wherein, in the same pixel unit group, two adjacent pixel driving circuits may share the same fifth bridging part 45. The sixth bridging part 46 may be connected to the twelfth active part 712 through a via hole, so as to be connected to the first electrode of the fourth transistor. The second initial signal line Vinit2 can be used to provide the second initial signal terminal in FIG. 1, the orthographic projection of the second initial signal line Vinit2 on the base substrate may be extended in the first direction X, the second initial signal line Vinit2 may be connected to the thirteenth active part 713 through a via hole, so as to connect the first electrode of the seventh transistor and the second initial signal terminal.

As shown in FIGS. 28, 35, and 42, the fourth conductive layer may further include an eleventh bridging part 411, and the eleventh bridging part 411 is correspondingly disposed in the pixel unit group in the dummy pixel row. In the dummy pixel row, the eleventh bridging part 411 is connected between the two fourth bridging parts 44 in the same pixel unit group, and the two second bridging parts 42 in the pixel unit group are connected to the eleventh bridging part 411. In addition, in the pixel unit group, the first bridging part 41 and the fourth bridging part 44 in the same pixel driving circuit are connected. As shown in FIG. 42, in the fourth pixel unit group Pc4, the fourth bridging part 44 may be connected to the second gate line G2 through a via hole.

As shown in FIGS. 28 and 36, the fifth conductive layer may include a plurality of third power lines VDD, a plurality of data lines Da, and an eighth bridging part 58. The eighth bridging part 58 can be connected to the second bridging part 42 through a via hole to connect to the second electrode of the seventh transistor, and the eighth bridging part 58 can also be used to connect to the first electrode of the light emitting unit. The orthographic projection of the third power line VDD on the base substrate and the orthographic projection of the data line Da on the base substrate may extend along the second direction Y. The third power line VDD can be used to provide the first power supply terminal in FIG. 1, and the data line Da can be used to provide the data signal terminal in FIG. 1. As shown in FIG. 28, a third power line VDD and a data line Da may be correspondingly provided for each column of pixel driving circuits. In the first pixel unit group Pc1, the second pixel unit group Pc2, the fourth pixel unit group Pc4, and the fifth pixel unit group Pc5, the third power line VDD can be connected to the first bridging part 41 through a via hole to connect the first electrode of the fifth transistor T5 and the first power supply terminal. The data line Da can be connected to the sixth bridging part 46 through a via hole, so as to connect the first electrode of the fourth transistor and the data signal terminal. As shown in FIG. 36, the third power line VDD may include a first extension VDD1, a second extension VDD2, and a third extension VDD3, and the second extension VDD2 is connected between the first extension VDD1 and the third extension VDD3, the size of the orthographic projection of the second extension VDD2 on the base substrate in the row direction X may be larger than the size of the orthographic projection of the first extension VDD1 on the base substrate in the row direction X, and the size of the orthographic projection of the second extension VDD2 on the base substrate in the row direction X may be larger than the size of the orthographic projection of the third extension VDD3 on the base substrate in the row direction X. The orthographic projection of the second extension VDD2 on the base substrate can cover the orthographic projection of the first active part 81 on the base substrate and the orthographic projection of the second active part 82 on the base substrate. The second extension VDD2 may reduce the influence of light on the characteristics of the first transistor T1 and the second transistor T2. In addition, the orthographic projection of the third power line VDD on the base substrate can cover the orthographic projection of the fourth bridging part 44 on the base substrate, and the third power line VDD can be used to shield the noise interference of other signals on the fourth bridging part 44, thereby improving the stability of the gate voltage of the driving transistor T3. In addition, in the same pixel unit group, the second extension parts VDD2 in two adjacent pixel driving circuits can be connected to each other, so that the third power line VDD and the first conductive part 21 can form a grid structure, and the power line of the grid structure can reduce the voltage drop of the power signal thereon.

As shown in FIGS. 28 and 36, in the dummy pixel column, the second extension VDD2 in the fourth pixel unit group Pc4 is disconnected from the second extension VDD2 in the second pixel unit group Pc2, and the data line Da in the dummy pixel column is connected to the second extension VDD2 in the fourth pixel unit group Pc4, and the second extension VDD2 in the fourth pixel unit group Pc4 is connected to the first bridging part 41 corresponding to the fourth pixel unit group Pc4 through a via hole. In addition, as shown in FIG. 28, the first bridging part 41 in the third pixel unit group Pc3 is not connected to the third power line VDD corresponding to the third pixel unit group Pc3.

As shown in FIG. 28, the data line Da in the dummy pixel column can form the above-mentioned second power line, the second gate line G2 in the dummy pixel row can form the above-mentioned first power line, and the data line Da in the dummy pixel column and the second gate line G2 in the dummy pixel row form a grid structure, and the grid structure is connected to the common electrode layer, so that the grid structure can reduce the voltage difference at different positions on the common electrode layer. In this exemplary embodiment, the first bridging part 41 connected in the row direction X in the dummy pixel row may also form the above-mentioned first power line. The first bridging part 41 connected in the row direction X in the dummy pixel row is connected in parallel with the second gate line G2, so as to reduce the self-resistance of the first power line, thereby reducing the voltage difference at different positions on the common electrode layer. In addition, as shown in FIGS. 28, 31, and 38, in the dummy pixel row, in pixel unit groups adjacent in the row direction, adjacent second conductive parts 12 are connected. This arrangement can also further reduce the self-resistance of the first power line.

It should be understood that, in other exemplary embodiments, the second extension VDD2 in the fourth pixel unit group Pc4 may not be disconnected from the second extension VDD2 in the second pixel unit group Pc2, that is, the second extension VDD2 in the fourth pixel unit group Pc4 is connected to the second extension VDD2 in the second pixel unit group Pc2. Correspondingly, the data line Da in the dummy pixel column is not connected to the second extension part VDD2 in the fourth pixel unit group Pc4, and the data line Da in the dummy pixel column can be connected to the first bridging part in the dummy pixel row in other ways, for example, the data line Da in the dummy pixel column may be directly connected to the first bridging part in the dummy pixel row through a via hole.

It should be understood that, in other exemplary embodiments, the fourth bridging part 44 in the fourth pixel unit group Pc4 may not be connected to the second gate line in the dummy pixel row. Therefore, only the first bridging parts connected in the row direction X in the dummy pixel row can be used to form the above-mentioned first power line. In addition, in other exemplary embodiments, the fourth bridging part 44 in the fourth pixel unit group Pc4 can also be connected to the enable signal line EM in the dummy pixel row through a via hole, so that the enable signal line in the dummy pixel row forms the above-mentioned first power line. Correspondingly, the first pixel power supply group may include the seventh active part, that is, the first pixel unit group no longer needs to share the seventh active part in the third pixel unit group.

It should be understood that, in other exemplary embodiments, other signal lines extending along the first direction X in the dummy pixel row may also be used to form the above-mentioned first power line. Other signal lines extending along the second direction Y in the dummy pixel column may also be used to form the above-mentioned second power line.

In this exemplary embodiment, a partial cross-sectional view of the display panel shown in FIG. 28 along the dotted line CC may also be shown in FIG. 19. The display panel may further include an electrode layer located on the side of the fifth conductive layer away from the base substrate, the electrode layer may be used to form the first electrode of the light emitting unit, and an insulating layer is provided between the electrode layer and the fifth conductive layer.

It should be noted that, as shown in FIGS. 28 and 42, the black square drawn on the side of the fourth conductive layer away from the base substrate indicates the via hole where the fourth conductive layer is connected to other layers on the side facing the base substrate; the black square drawn on the side of the fifth conductive layer facing away from the base substrate indicates the via hole where the fifth conductive layer is connected to other layers on the side facing the base substrate. The black square only indicates the position of the via hole, and different via holes represented by black squares at different positions may penetrate through different insulating layers.

In the display panel shown in FIG. 4, the first power line VSS1 is located at the third conductive layer, and the second power line VSS2 is located at the fifth conductive layer. It should be understood that, in other exemplary embodiments, the first power line VSS1 and the second power line VSS2 may also be located at other conductive layers, for example, the first power line VSS1 may also be located at one or more layers of the light-shielding layer, the second conductive layer, the four conductive layers and the electrode layer; and the second power line VSS2 may also be located at one or more layers of the light-shielding layer, the fourth conductive layer, and the electrode layer.

Figure 43:
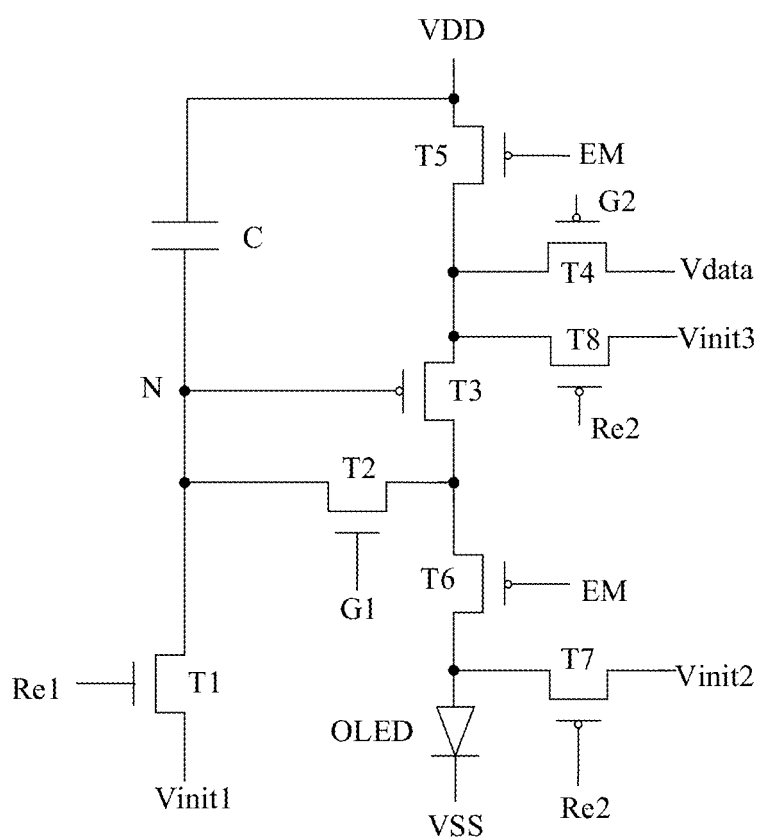
FIG. 43 is a schematic structural diagram of another exemplary embodiment of a display panel of the present disclosure.

As shown in FIG. 43, it is a schematic structural diagram of another exemplary embodiment of the display panel of the present disclosure. The pixel driving circuit may include: a driving transistor T3, a first transistor T1, a second transistor T2, a fourth transistor T4, a fifth transistor T5, a sixth transistor T6, a seventh transistor T7, an eighth transistor T8, and a capacitor C. Wherein, the first electrode of the fourth transistor T4 is connected to the data signal terminal Da, the second electrode of the fourth transistor T4 is connected to the first electrode of the driving transistor T3, and the gate electrode of the fourth transistor T4 is connected to the second gate driving signal terminal G2; the first electrode of the fifth transistor T5 is connected to a power supply terminal VDD, the second electrode of the fifth transistor T5 is connected to the first electrode of the driving transistor T3, and the gate electrode of the fifth transistor T5 is connected to the enable signal terminal EM; the gate electrode of the driving transistor T3 is connected to the node N; the first electrode of the second transistor T2 is connected to the node N, the second electrode of the second transistor T2 is connected to the second electrode of the driving transistor T3, and the gate electrode of the second transistor T2 is connected to the first gate driving signal terminal G1; the first electrode of the sixth transistor T6 is connected to the second electrode of the driving transistor T3, the second electrode of the sixth transistor T6 is connected to the second electrode of the seventh transistor T7, and the gate electrode of the sixth transistor T6 is connected to the enable signal terminal EM; the first electrode of the seventh transistor T7 is connected to the second initial signal terminal Vinit2, and the gate electrode of the seventh transistor T7 is connected to the second reset signal terminal Re2; the second electrode of the first transistor T1 is connected to the node N, the first electrode of the first transistor T1 is connected to the first initial signal terminal Vinit1, and the gate electrode of the first transistor T1 is connected to the first reset signal terminal Re1; the first electrode of the capacitor C is connected to the node N, and the second electrode of the capacitor C is connected to the first power supply terminal VDD; the first electrode of the eighth transistor T8 is connected to the third initial signal line Vinit3, the second electrode of the eighth transistor T8 is connected to the first electrode of the driving transistor, and the gate electrode of the eighth transistor T8 is connected to the second reset signal terminal Re2. The pixel driving circuit may be connected to a light emitting unit OLED for driving the light emitting unit OLED to emit light, and the light emitting unit OLED may be connected between the second electrode of the sixth transistor T6 and the second power supply terminal VSS. Wherein, the first transistor T1 and the second transistor T2 may be N-type transistors; and the driving transistor T3, the fourth transistor T4, the fifth transistor T5, the sixth transistor T6, the seventh transistor T7, and the eighth transistor T8 may be P-type transistors.

The pixel driving circuit driving method may include a reset phase, a data writing phase, and a light emitting phase. In the reset phase, the first reset signal terminal Re1 outputs a high-level signal, the second reset signal terminal Re2 outputs a low-level signal, the first transistor T1 and the eighth transistor T8 are turned on, the first initial signal terminal Vinit1 inputs the first initial signal to the node N, and the third initial signal terminal Vinit3 inputs the third initial signal to the first electrode of the driving transistor T3. In the data writing phase, the first gate drive signal terminal G1 outputs a high-level signal, the second gate drive signal terminal G2 outputs a low-level signal, the second transistor T2 and the fourth transistor T4 are turned on, and the data signal terminal Da outputs the data signal to write the compensation voltage Vdata+Vth to the node N, wherein Vdata is the voltage of the data signal, and Vth is the threshold voltage of the driving transistor T3. The light-emitting phase t4: the enable signal terminal EM outputs a low-level signal, the sixth transistor T6 and the fifth transistor T5 are turned on, and the driving transistor T3 drives the light emitting unit to emit light under the action of the compensation voltage Vdata+Vth stored in the capacitor C. The output current of the driving transistor in the pixel driving circuit of the present disclosure is I=($\rho$WCox/2L)(Vdata+Vth−Vdd−Vth)$_2$. The pixel driving circuit can avoid the influence of the threshold value of the driving transistor on its output current. Wherein, I is the output current of the driving transistor; u is the carrier mobility; Cox is the gate capacitance per unit area, W is the width of the driving transistor channel, L is the length of the driving transistor channel, Vgs is the gate-source voltage difference of the driving transistor, and Vth is the threshold voltage of the driving transistor.

Figure 44:
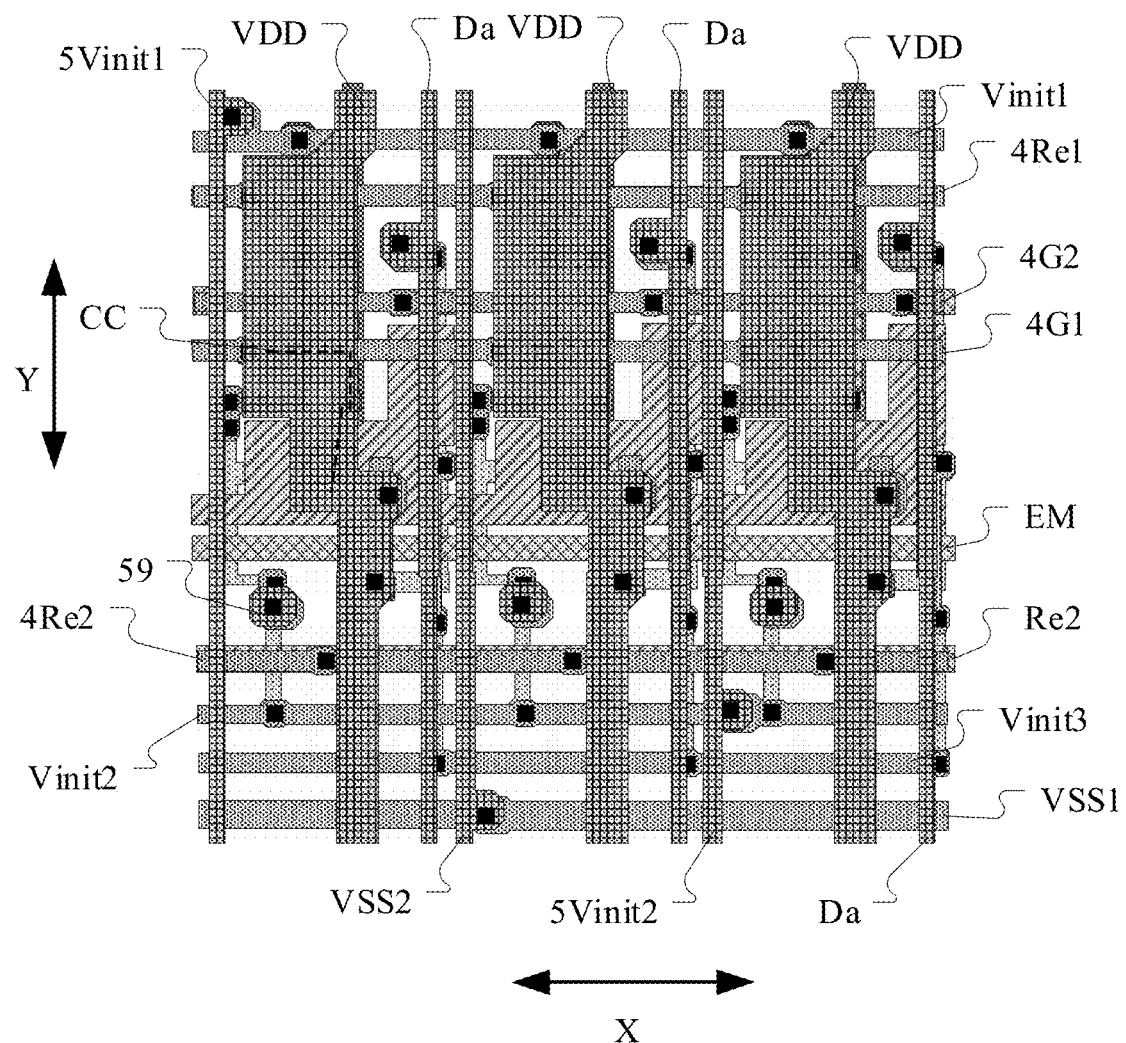
FIG. 44 is a structural layout of an exemplary embodiment of a display panel of the present disclosure.
Figure 45:
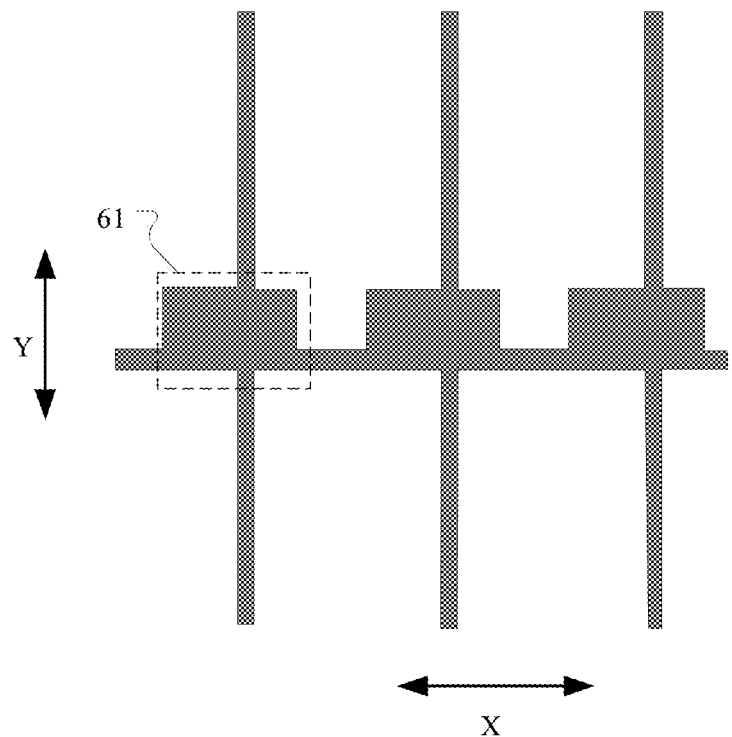
FIG. 45 is a structural layout of the light-shielding layer in FIG. 44.
Figure 46:
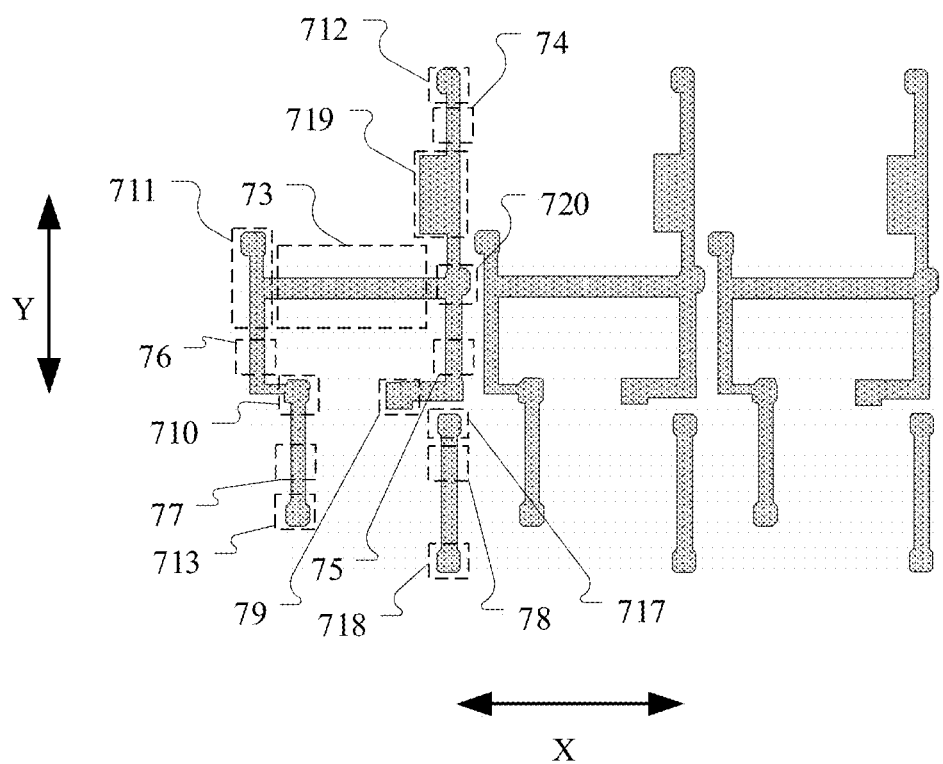
FIG. 46 is a structural layout of the first active layer in FIG. 44.
Figure 47:
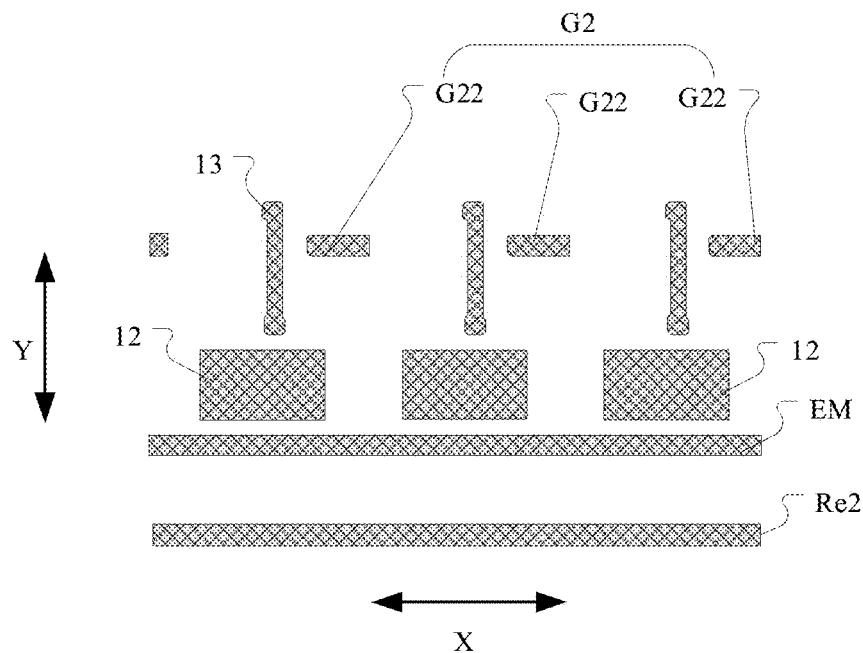
FIG. 47 is a structural layout of the first conductive layer in FIG. 44.
Figure 48:
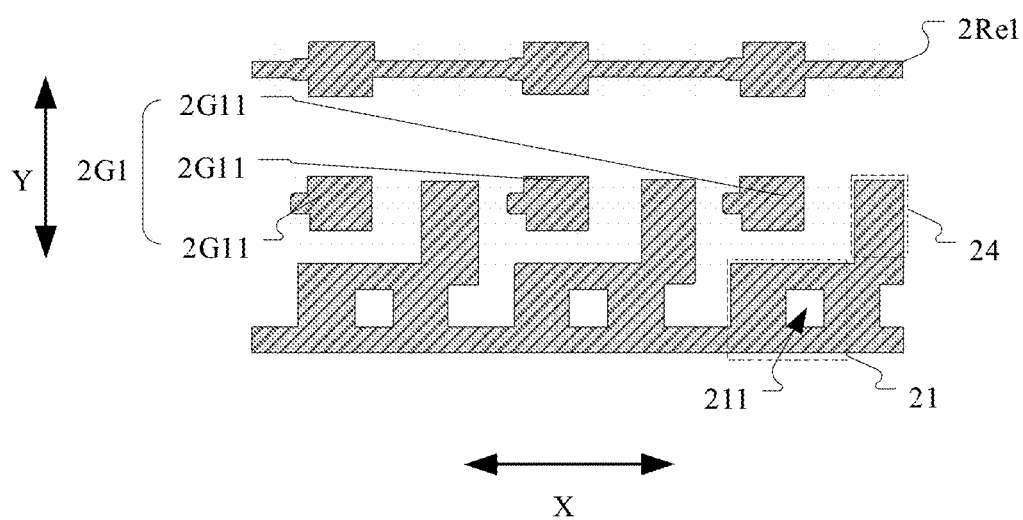
FIG. 48 is a structural layout of the second conductive layer in FIG. 44.
Figure 49:
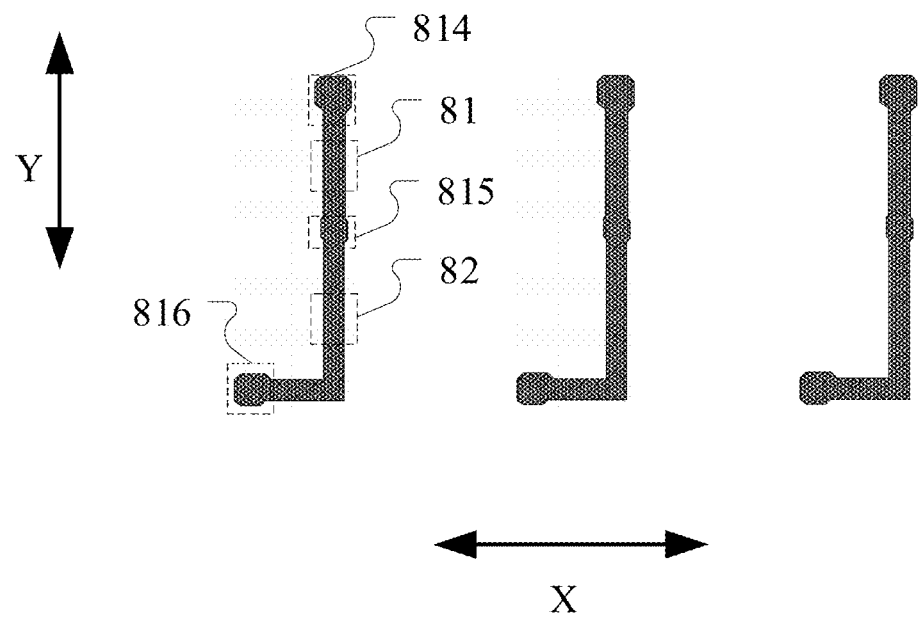
FIG. 49 is a structural layout of the second active layer in FIG. 44.
Figure 50:
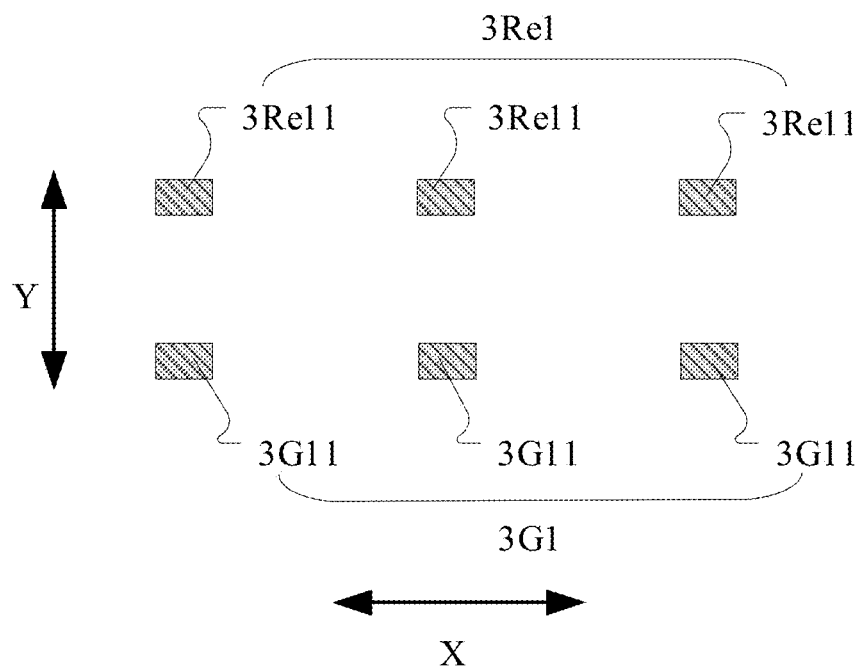
FIG. 50 is a structural layout of the third conductive layer in FIG. 44.
Figure 51:
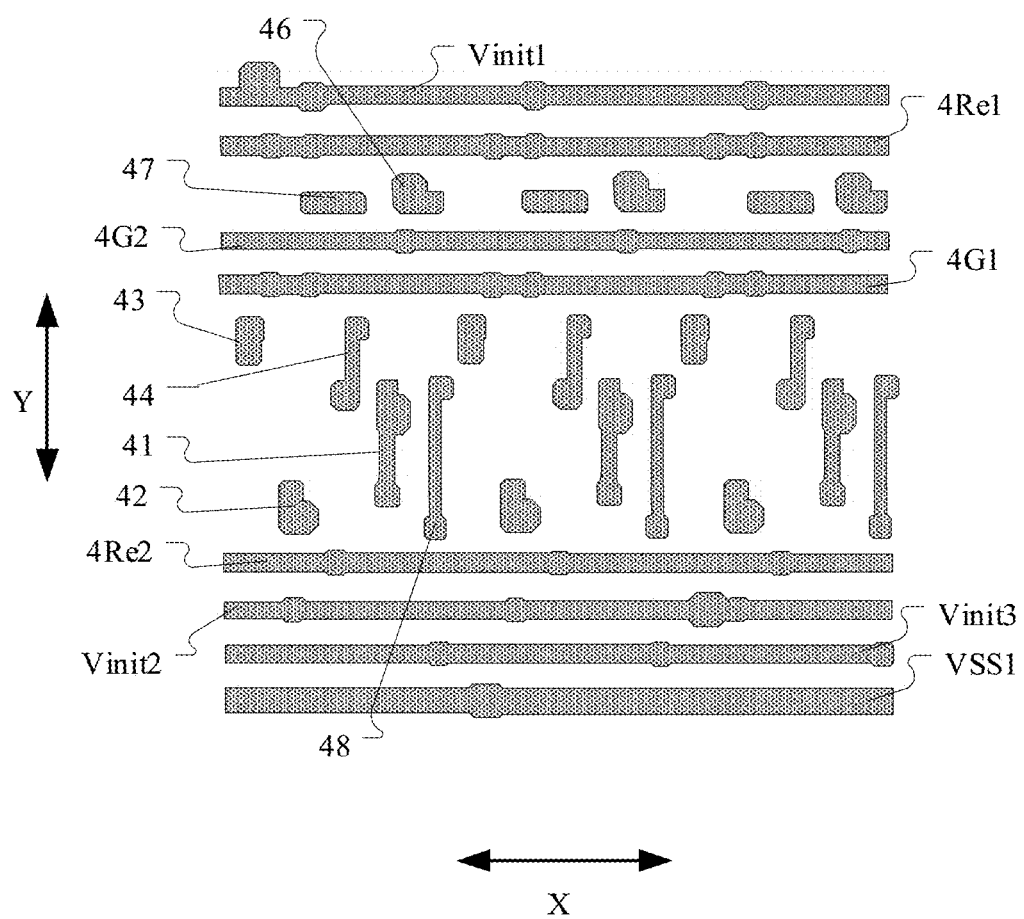
FIG. 51 is a structural layout of the fourth conductive layer in FIG. 44.
Figure 52:
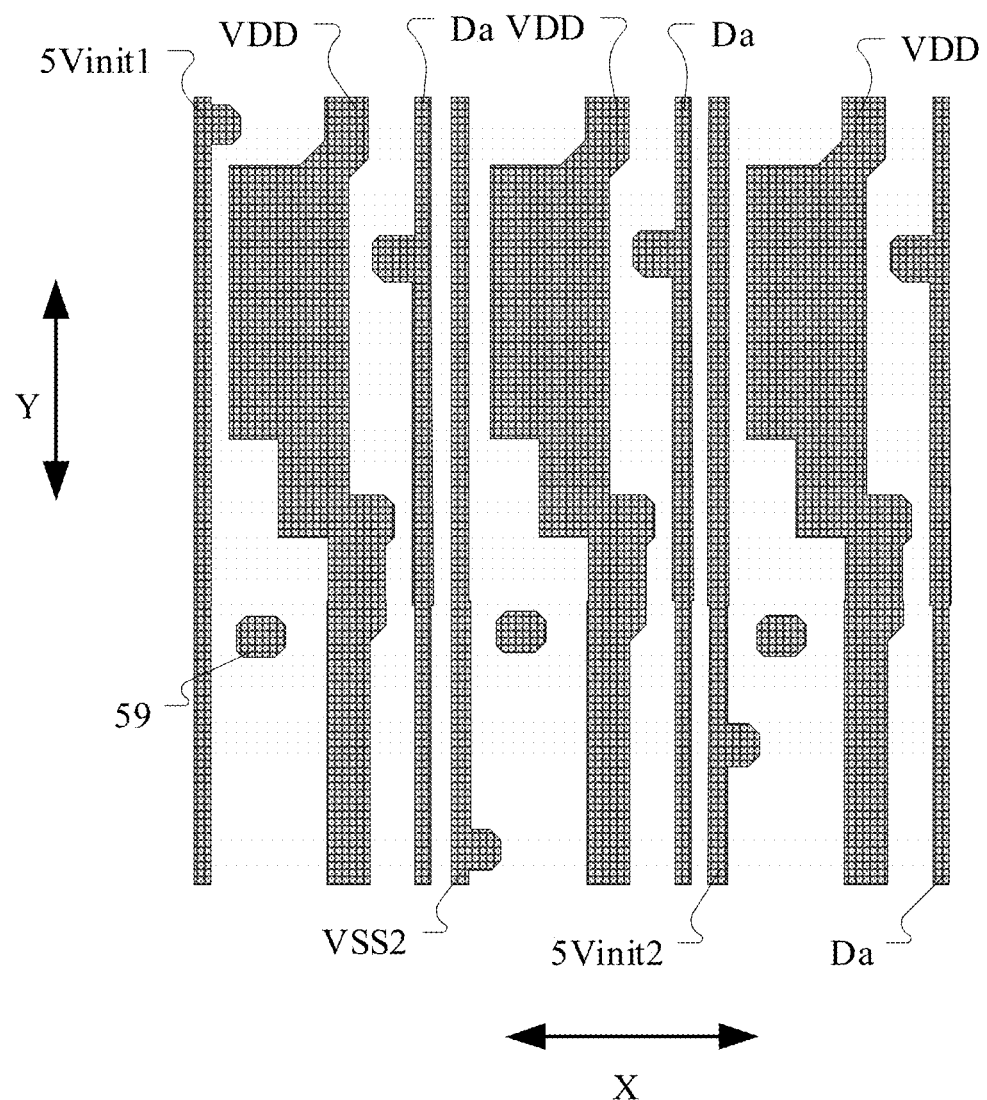
FIG. 52 is a structural layout of the fifth conductive layer in FIG. 44.
Figure 53:
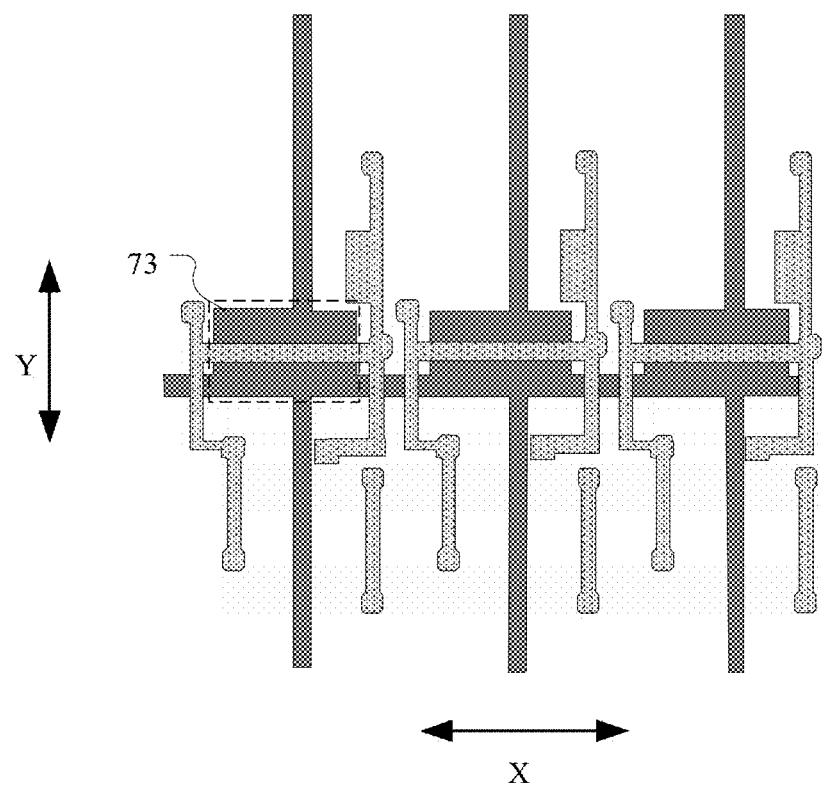
FIG. 53 is a structural layout of the light-shielding layer and the first active layer in FIG. 44.
Figure 54:
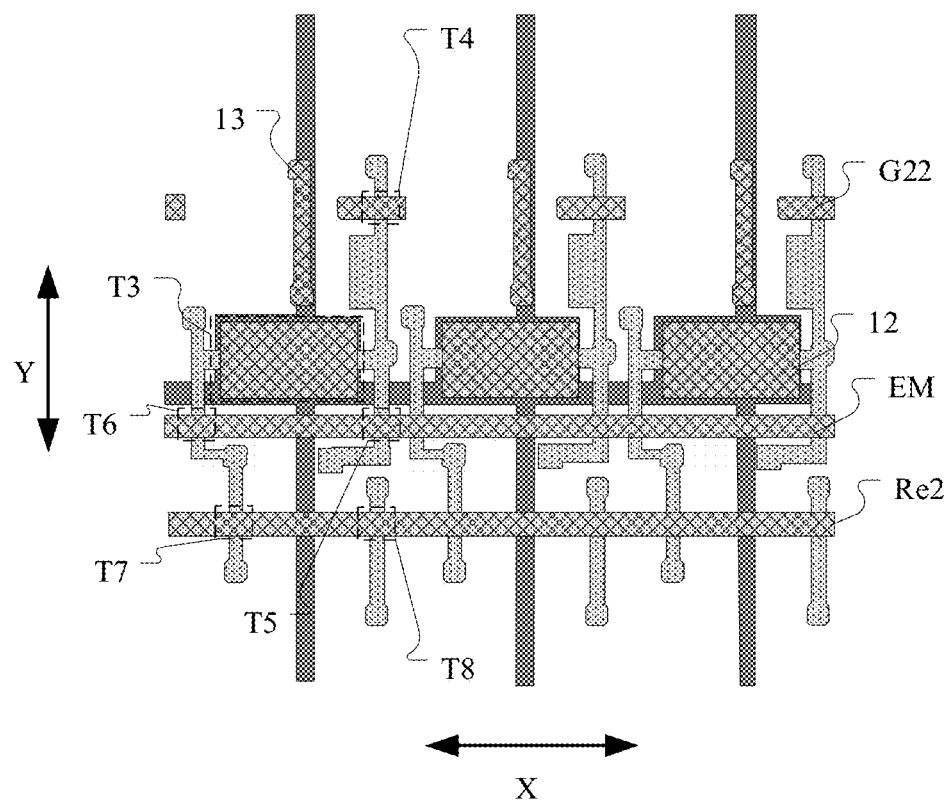
FIG. 54 is a structural layout of the light-shielding layer, the first active layer, and the first conductive layer in FIG. 44.
Figure 55:
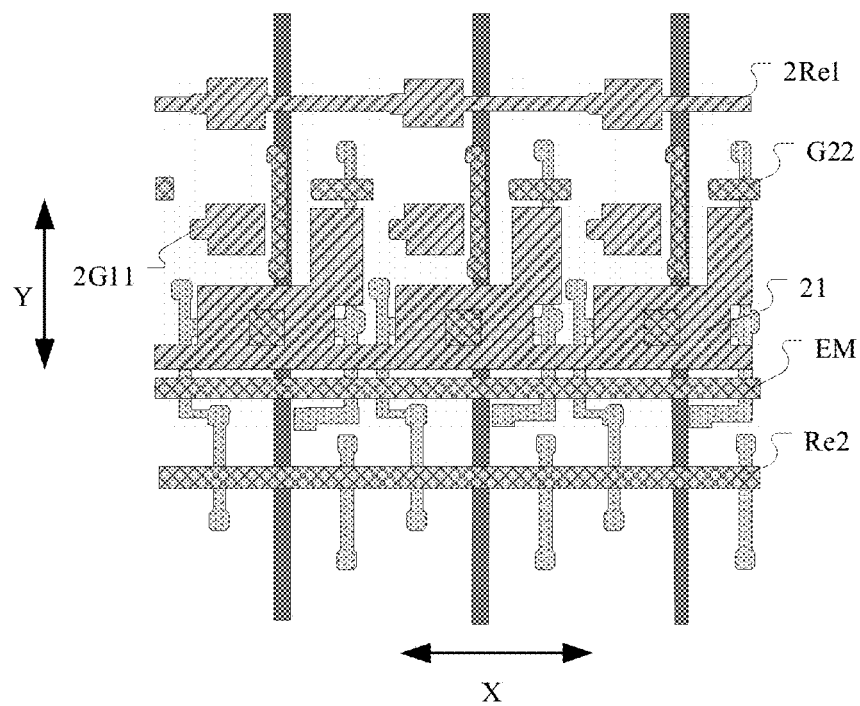
FIG. 55 is a structural layout of the light-shielding layer, the first active layer, the first conductive layer, and the second conductive layer in FIG. 44.
Figure 56:
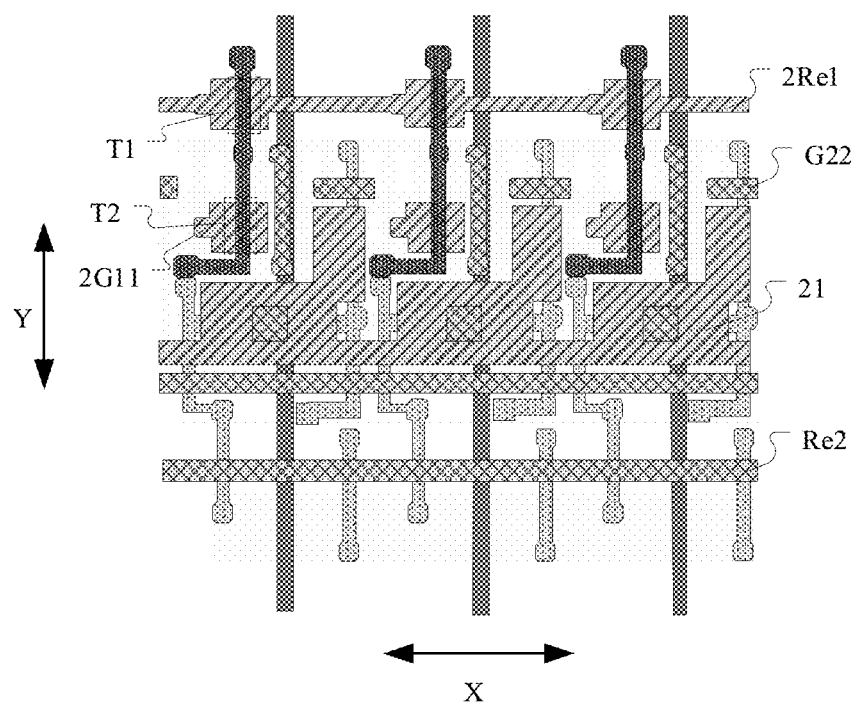
FIG. 56 is a structural layout of the light-shielding layer, the first active layer, the first conductive layer, the second conductive layer, and the second active layer in FIG. 44.
Figure 57:
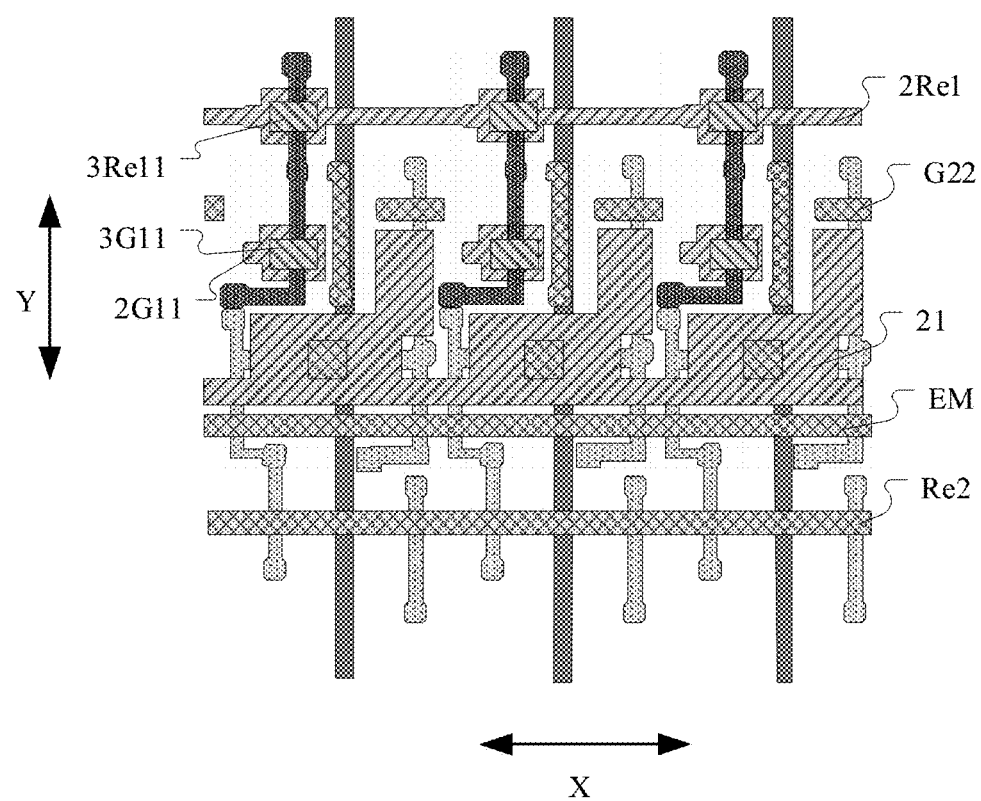
FIG. 57 is a structural layout of the light-shielding layer, the first active layer, the first conductive layer, the second conductive layer, the second active layer, and the third conductive layer in FIG. 44.
Figure 58:
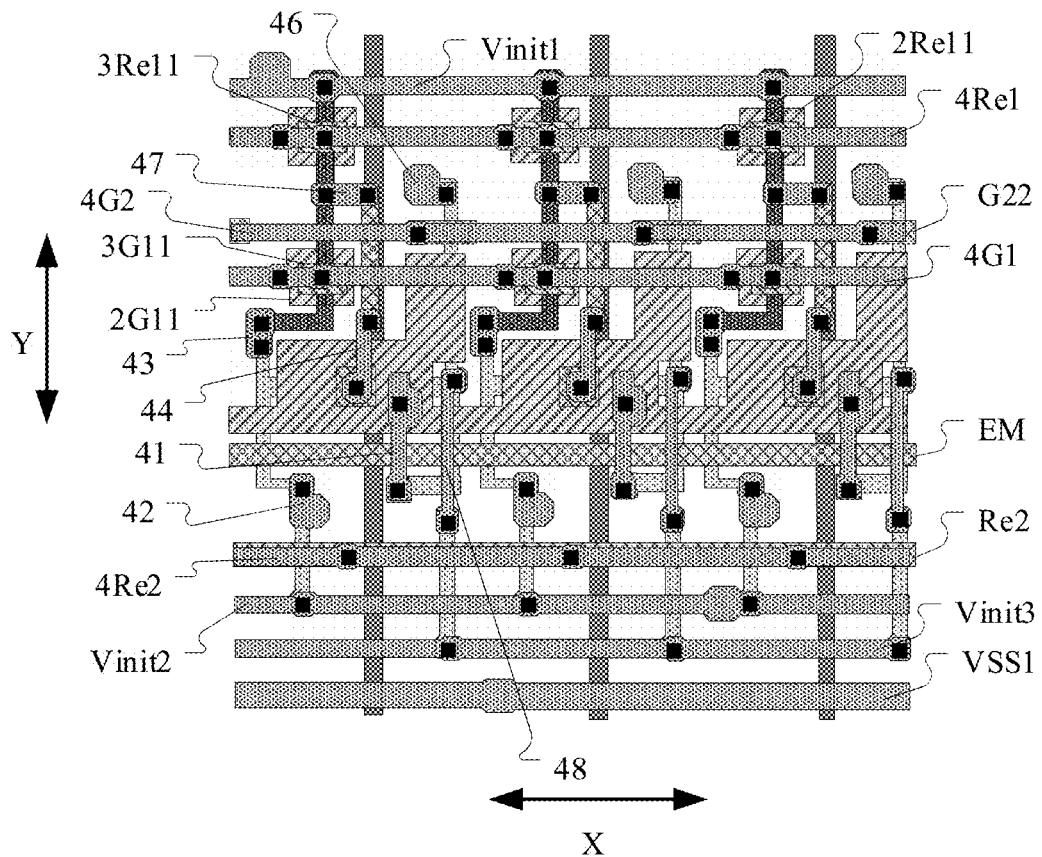
FIG. 58 is a structural layout of the light-shielding layer, the first active layer, the first conductive layer, the second conductive layer, the second active layer, the third conductive layer, and the fourth conductive layer in FIG. 44.

This exemplary embodiment also provides another display panel, which may include a base substrate, a light-shielding layer, a first active layer, a first conductive layer, a second conductive layer, a second active layer, a third conductive layer, a fourth conductive layer, and a fifth conductive layer that are sequentially stacked, wherein an insulating layer may be disposed between the above-mentioned adjacent layers. As shown in FIGS. 44-58, FIG. 44 is a structural layout of an exemplary embodiment of the display panel of the present disclosure, FIG. 45 is a structural layout of the light-shielding layer in FIG. 44, FIG. 46 is a structural layout of the first active layer in FIG. 44, FIG. 47 is a structural layout of the first conductive layer in FIG. 44, FIG. 48 is a structural layout of the second conductive layer in FIG. 44, FIG. 49 is a structural layout of the second active layer in FIG. 44, FIG. 50 is a structural layout of the third conductive layer in FIG. 44, FIG. 51 is a structural layout of the fourth conductive layer in FIG. 44, FIG. 52 is a structural layout of the fifth conductive layer in FIG. 44, FIG. 53 is a structural layout of the light-shielding layer and the first active layer in FIG. 44, FIG. 54 is a structural layout of the light-shielding layer, the first active layer, and the first conductive layer in FIG. 44, FIG. 55 is a structural layout of the light-shielding layer, the first active layer, the first conductive layer, and the second conductive layer in FIG. 44, FIG. 56 is a structural layout of the light-shielding layer, the first active layer, the first conductive layer, the second conductive layer, and the second active layer in FIG. 44, FIG. 57 is a structural layout of the light-shielding layer, the first active layer, the first conductive layer, the second conductive layer, the second active layer, and the third conductive layer in FIG. 44, FIG. 58 is a structural layout of the light-shielding layer, the first active layer, the first conductive layer, the second conductive layer, the second active layer, the third conductive layer, and the fourth conductive layer. The display panel may include a plurality of pixel driving circuits shown in FIG. 43.

As shown in FIGS. 44, 45, and 53, the light-shielding layer may include a plurality of light-shielding parts 61, and adjacent light-shielding parts 61 may be connected to each other.

As shown in FIGS. 44, 46, and 54, the first active layer may include a third active part 73, a fourth active part 74, a fifth active part 75, a sixth active part 76, a seventh active part 77, and an eighth active part 78. Wherein, the third active part 73 can be used to form the channel region of the driving transistor T3; the fourth active part 74 can be used to form the channel region of the fourth transistor T4; the fifth active part 75 can be used to form the channel region of the fifth transistor T5; the sixth active part 76 can be used to form the channel region of the sixth transistor T6; the seventh active part 77 can be used to form the channel region of the seventh transistor T7; and the eighth active part 78 can be used to form the channel region of the eighth transistor T8. The first active layer further includes: a ninth active part 79, a tenth active part 710, an eleventh active part 711, a twelfth active part 712, a thirteenth active part 713, a seventeenth active part 717, an eighteenth active part 718, a nineteenth active part 719, and a twentieth active part 720. Wherein, the ninth active part 79 is connected to an end of the fifth active part 75 away from the third active part 73. The tenth active part 710 is connected between the sixth active part 76 and the seventh active part 77, the eleventh active part 711 is connected between the sixth active part 76 and the third active part 73, the twelfth active part 712 is connected to an end of the fourth active part 74 away from the third active part 73, the thirteenth active part 713 is connected to an end of the seventh active part 77 away from the sixth active part 76, the seventeenth active part 717 and the eighteenth active part 718 are respectively connected to both ends of the eighth active part 78, and the nineteenth active part 719 is connected between the fourth active part 74 and the fifth active part 75. The size of the orthographic projection of the nineteenth active part 719 on the base substrate in the first direction X is greater than the size of the orthographic projection of the fourth active part 74 on the base substrate in the first direction X. The twentieth active part 720 is connected between the nineteenth active part 719 and the third active part 73. Wherein, the orthographic projection of the light-shielding part 61 on the base substrate can cover the orthographic projection of the third active part 73 on the base substrate, and the light-shielding part 61 can reduce the influence of light on the driving characteristics of the driving transistor T3. The first active layer can be formed of polysilicon material, and correspondingly, the driving transistor T3, the fourth transistor T4, the fifth transistor T5, the sixth transistor T6, the seventh transistor T7, and the eighth transistor T8 can be P-type low-temperature polysilicon thin films transistor.

As shown in FIGS. 44, 47, and 54, the first conductive layer may include: a second conductive part 12, a second gate line G2, an enable signal line EM, a second reset signal line Re2, and a third conductive part 13. The second gate line G2 can be used to provide the second gate drive signal terminal in FIG. 1; the enable signal line EM can be used to provide the enable signal terminal in FIG. 1; and the second reset signal line Re2 can be used to provide the second reset signal terminal in FIG. Both the orthographic projection of the enable signal line EM on the base substrate and the orthographic projection of the second reset signal line Re2 on the base substrate may extend along the row direction X.

The second gate line G2 may include a plurality of second gate line segments G22 distributed at intervals in the first direction X, and the orthographic projection of the second gate line segment G22 on the substrate extends along the first direction X and covers the orthographic projection of the fourth active part 74 on the base substrate, part of the structure of the second gate line segment G22 is used to form the gate electrode of the fourth transistor T4. The orthographic projection of the enable signal line EM on the base substrate covers the orthographic projection of the fifth active part 75 on the base substrate and the orthographic projection of the sixth active part 76 on the base substrate, part of the structure of the enable signal line EM can be used to form the gates of the fifth transistor T5 and the sixth transistor T6 respectively. The orthographic projection of the second reset signal line Re2 on the substrate can cover the orthographic projection of the seventh active part 77 on the substrate and the orthographic projection of the eighth active part 78 on the substrate. Part of the structure of the second reset signal line Re2 can be used to form the gate electrode of the seventh transistor T7, and another part of the structure of the second reset signal line Re2 can be used to form the gate electrode of the eighth transistor T8. The orthographic projection of the second conductive part 12 on the base substrate covers the orthographic projection of the third active part 73 on the base substrate, and the second conductive part 12 can be used to form the gate electrode of the driving transistor T3 and the first electrode of the capacitor C. The light-shielding layer can also be connected to a stable power supply terminal. For example, the light-shielding layer can be connected to the first power supply terminal, the first initial signal terminal, the second initial signal terminal, the third initial signal terminal Vinit3, etc. in FIG. 1. The light-shielding layer 61 can stabilize the voltage of the second conductive part 12, thereby reducing the voltage fluctuation of the gate electrode of the driving transistor T3 during the light-emitting phase. In addition, the display panel can use the first conductive layer as a mask to conduct conductorization treatment on the first active layer, that is, the region covered by the first conductive layer in the first active layer can form the channel region of the transistor, and the region of the first active layer not covered by the first conductive layer forms a conductor structure.

As shown in FIGS. 44, 48, and 55, the second conductive layer may include: a third reset signal line 2Re1, a third gate line 2G1, a plurality of first conductive parts 21, and a fourth conductive part 24. Wherein, the third reset signal line 2Re1 can be used to provide the first reset signal terminal in FIG. 1, and the third gate line 2G1 can be used to provide the first gate driving signal terminal in FIG. 1. The orthographic projection of the third reset signal line 2Re1 on the base substrate may extend along the first direction X. The third gate line 2G1 may include a plurality of third gate line segments 2G11 distributed at intervals in the first direction X, and the orthographic projection of the third gate line segment 2G11 on the substrate may extend along the first direction X. The orthographic projection of the first conductive part 21 on the substrate and the orthographic projection of the second conductive part 12 on the substrate at least partially overlap, and the first conductive part 21 is used to form the second electrode of the capacitor C. As shown in FIG. 48, in the first direction X, the first conductive parts 21 are connected to each other. The fourth conductive part 24 is connected to the first conductive part 21, and the orthographic projection of the fourth conductive part 24 on the base substrate may at least partially overlap with the orthographic projection of the nineteenth active part 719 on the base substrate. The orthographic projection of the conductive part 24 on the base substrate may be located between the orthographic projections of adjacent third gate line segments 2G11 on the base substrate in the first direction X. The fourth conductive part 24 and the nineteenth active part 719 can form a parasitic capacitance. In the data writing phase, the data signal input to the second electrode of the fourth transistor T4 can be stored in the parasitic capacitance, and when the data writing phase ends, the data signal stored in the parasitic capacitance can continue to input a compensation voltage to the node N through the driving transistor T3. This configuration can fully write the compensation voltage to the node N in a short data writing phase, so that a higher refresh frequency of the display panel can be realized.

As shown in FIGS. 44, 49, and 56, the second active layer may include a first active part 81, a second active part 82, a fourteenth active part 814, a fifteenth active part 815, and a sixteenth active part active part 816. The first active part 81 is used to form the channel region of the first transistor T1, the second active part 82 is used to form the channel region of the second transistor T2, the fifteenth active part 815 is connected between the first active part 81 and the second active part 82. The fourteenth active part 814 is connected to an end of the first active part 81 away from the fifteenth active part 815, and the sixteenth active part 816 is connected to an end of the second active part 82 away from the first active part 81. Wherein, the second active layer may be formed of InGaZnO, and correspondingly, the first transistor T1 and the second transistor T2 may be N-type metal oxide thin film transistors. The orthographic projection of the third gate line 2G1 on the substrate may cover the orthographic projection of the second active part 82 on the substrate, and part of the structure of the third gate line 2G1 may be used to form the bottom gate electrode of the second transistor. The orthographic projection of the third reset signal line 2Re1 on the substrate can cover the orthographic projection of the first active part 81 on the substrate, and part of the structure of the third reset signal line 2Re1 can be used to form the bottom gate electrode of the first transistor T1.

As shown in FIGS. 44, 50 and 57, the third conductive layer may include a first reset signal line 3Re1 and a first gate line 3G1. The first reset signal line 3Re1 includes a plurality of first reset signal line segments 3Re11 distributed at intervals in the first direction X, and the orthographic projection of the first reset signal line segment 3Re11 on the substrate extends along the first direction X. The first gate line 3G1 includes a plurality of first gate line segments 3G11 distributed at intervals in the first direction X, and the orthographic projection of the first gate line segment 3G11 on the substrate extends along the first direction X. The first reset signal line 3Re1 can be used to provide the first reset signal terminal in FIG. 1, the orthographic projection of the first reset signal line 3Re1 on the substrate can cover the orthographic projection of the first active part 81 on the substrate, and part of the structure of the first reset signal line 3Re1 can be used to form the top gate electrode of the first transistor T1. The first gate line 3G1 can be used to provide the first gate driving signal terminal in FIG. 1, the orthographic projection of the first gate line 3G1 on the substrate can cover the orthographic projection of the second active part 82 on the substrate, and part of the structure of the first gate line 3G1 can be used to form the top gate electrode of the second transistor T2. In addition, the display panel can use the third conductive layer as a mask to conduct conductorization treatment on the second active layer, that is, the region of the second active layer covered by the third conductive layer can form the channel region of the transistor, and the region of the second active layer not covered by the third conductive layer forms a conductor structure.

As shown in FIGS. 44, 51, and 58, the fourth conductive layer may include a first bridging part 41, a second bridging part 42, a third bridging part 43, a fourth bridging part 44, a sixth bridging part 46, a seventh bridging part. 47, an eighth bridging part 48, a first initial signal line Vinit1, a second initial signal line Vinit2, a third initial signal line Vinit3, a first power line VSS1, a first gate connection line 4G1, a second gate connection line 4G2, a the first reset connection line 4Re1, and the second reset connection line 4Re2. The orthographic projection of the first initial signal line Vinit1 on the substrate, the orthographic projection of the second initial signal line Vinit2 on the substrate, the orthographic projection of the third initial signal line Vinit3 on the substrate, the orthographic projection of the first power line VSS1 on the base substrate, the orthographic projection of the first gate connection line 4G1 on the base substrate, the orthographic projection of the second gate connection line 4G2 on the base substrate, the orthographic projection of the first reset connection line 4Re1 on the substrate and the orthographic projection of the second reset connection line 4Re2 on the base substrate may extend along the first direction X. The first initial signal line Vinit1 is used to provide a first initial signal terminal, the second initial signal line Vinit2 is used to provide a second initial signal terminal, and the third initial signal line Vinit3 is used to provide a third initial signal terminal. Wherein, the first bridging part 41 can be connected to the first conductive part 21 through a via hole, and connected to the ninth active part 79 through a via hole, so as to connect the first electrode of the fifth transistor and the second electrode of the capacitor C. The second bridging part 42 may be connected to the tenth active part 710 through a via hole, so as to connect the second electrode of the sixth transistor T6 and the second electrode of the seventh transistor T7. The third bridging part 43 can be respectively connected to the eleventh active part 711 and the sixteenth active part 816 through via holes to connect the second electrode of the second transistor T2, the first electrode of the sixth transistor T6, and the second electrode of the driving transistor T3. The fourth bridging part 44 can be connected to the third conductive part 13 and the second conductive part 12 respectively through via holes, and the seventh bridging part 47 can be respectively connected to the third conductive part 13 and the fifteenth active part 815 through via holes to connect the first electrode of the second transistor T2 and the gate electrode of the driving transistor. As shown in FIG. 48, an opening 211 is formed on the first conductive part 21, and the orthographic projection of the via hole connected between the second conductive part 12 and the fourth bridging part 44 on the base substrate is located within the orthographic projection of the opening 211 on the base substrate, so that the conductive structure in the via hole and the first conductive part 21 are insulated from each other. The eighth bridging part 48 can be connected to the seventeenth active part 717 and the twentieth active part 720 through via holes, so as to connect the second electrode of the eighth transistor and the first electrode of the driving transistor. The first initial signal line Vinit1 may be connected to the fourteenth active part 814 through a via hole, so as to connect the first initial signal terminal and the first electrode of the first transistor T1. The second initial signal line Vinit2 can be connected to the thirteenth active part 713 through a via hole, so as to connect the second initial signal terminal and the first electrode of the seventh transistor. The third initial signal line Vinit3 is connected to the eighteenth active part 718 through a via hole, so as to connect the first electrode of the eighth transistor to the third initial signal terminal. The first gate connection line 4G1 can be respectively connected to the third gate line segments 2G11 in the same third gate line 2G1 through via holes, and connected to the first gate line segments 3G11 in the same first gate line 3G1 through a via hole. The second gate connection lines 4G2 can be respectively connected to the second gate line segments G22 in the same second gate line G2 through via holes. The first reset connection line 4Re1 can be respectively connected to the first reset signal line segments 3Re11 in the same first reset signal line 3Re1 through via holes, and connected to the third reset signal line 2Re1 through a plurality of via holes. The second reset connection line 4Re2 may be connected to the second reset signal line Re2 through a plurality of via holes. In this exemplary embodiment, the square resistance of the fourth conductive layer may be smaller than the square resistance of the first conductive layer, the second conductive layer, and the third conductive layer. The first gate connection line 4G1 can reduce the self-resistance of the first gate line 3G1 and the third gate line 2G1, thereby improving the response speed of the second transistor. The second gate connection line 4G2 can reduce the self-resistance of the second gate line G2, thereby improving the response speed of the fourth transistor T4. The first reset connection line 4Re1 can reduce the self-resistance of the first reset signal line 3Re1 and the third reset signal line 2Re1, thereby improving the response speed of the first transistor T1. The second reset connection line 4Re2 can reduce the self-resistance of the second reset signal line Re2, thereby improving the response speed of the seventh transistor and the eighth transistor.

As shown in FIGS. 44 and 52, the fifth conductive layer may include a plurality of third power lines VDD, a plurality of data lines Da, a second power line VSS2, a fourth initial line 5Vinit1, a fifth initial line 5Vinit2, and a ninth bridging part 59. Wherein, the orthographic projection of the third power line VDD on the base substrate, the orthographic projection of the data line Da on the base substrate, the orthographic projection of the second power line VSS2 on the base substrate, the orthographic projection of the fourth initial line 5Vinit1 on the substrate and the orthographic projection of the fifth initial line 5Vinit2 on the base substrate may extend along the second direction Y. The third power line VDD can be used to provide the first power supply terminal, the data line Da can be used to provide the data signal terminal, and the second power line VSS2 can be used to provide the second power supply terminal. As shown in FIG. 44, each column of pixel driving circuits can be provided with a corresponding third power line VDD, and the third power line VDD can be connected to the first bridging part 41 through a via hole to connect the first electrode of the fifth transistor and the first power supply terminal. The data line Da can be connected to the sixth bridging part 46 through a via hole, so as to connect the first electrode of the fourth transistor and the data signal terminal. The ninth bridging part 59 may be connected to the second bridging part 42 through a via hole, so as to be connected to the second electrode of the seventh transistor. The second power line VSS2 can be connected to the first power line VSS1 that intersects with the second power line VSS2 through a via hole, and the first power line VSS1 and the second power line VSS2 can be connected to the common electrode layer. The first power line VSS1 and the second power line VSS2 forming the grid structure can reduce the voltage difference between different positions on the common electrode layer. The fourth initial line 5Vinit1 can be connected to the first initial signal line Vinit1 that intersects with the fourth initial line 5 Vinit1 through a via hole, and the fourth initial line 5Vinit1 and the first initial signal line Vinit1 form a grid structure, thereby reducing the voltage difference between the first initial signal terminals in the pixel drive circuits at different positions of the display panel. The fifth initial line 5Vinit2 can be connected to the second initial signal line Vinit2 that intersects the fifth initial line 5Vinit2 through a via hole, and the fifth initial line 5Vinit2 and the second initial signal line Vinit2 form a grid structure, thereby reducing the voltage difference between the second initial signal terminals in the pixel drive circuits at different positions of the display panel. In this exemplary embodiment, as shown in FIG. 44, a second power line VSS2, a fourth initial line 5Vinit1, and a fifth initial line 5Vinit2 may be correspondingly provided for every three columns of pixel driving circuits.

It should be understood that, in other exemplary embodiments, the fifth conductive layer may further include a third initial connection line, and the third initial connection line may be connected to the third initial signal line that intersects with the third initial connection line through a via hole, so as to reduce the voltage difference between the third initial signal terminals in the pixel drive circuits at different positions of the display panel.

It should be noted that, as shown in FIGS. 44 and 58, the black square drawn on the side of the fourth conductive layer away from the base substrate indicate the via hole where the fourth conductive layer is connected to other layers on the side facing the base substrate; and the black square drawn on the side of the fifth conductive layer facing away from the base substrate indicates the via hole where the fifth conductive layer is connected to other layers on the side facing the base substrate. The black square only indicates the position of the via hole, and different via holes represented by the black squares at different positions may penetrate through different insulating layers.

Figure 59:
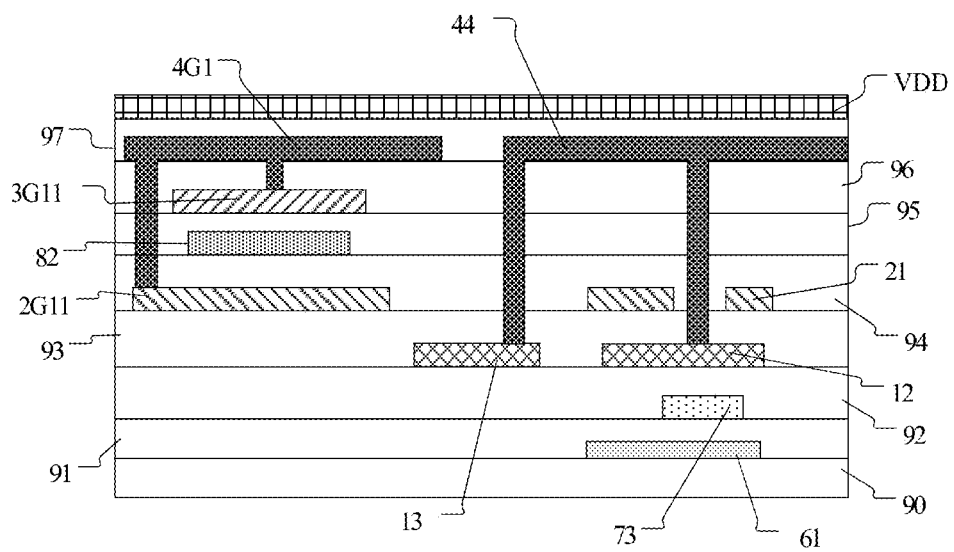
FIG. 59 is a partial cross-sectional view of the display panel shown in FIG. 44 cut along the dotted line CC.

As shown in FIG. 59, it is a partial cross-sectional view of the display panel shown in FIG. 44 cut along the dotted line CC. The display panel may further include a first insulating layer 91, a second insulating layer 92, a third insulating layer 93, a fourth insulating layer 94, a fifth insulating layer 95, a first dielectric layer 96, and a first planar layer 97, wherein, the base substrate 90, the light-shielding layer, the first insulating layer 91, the first active layer, the second insulating layer 92, the first conductive layer, third insulating layer 93, the second conductive layer, the fourth insulating layer 94, the second active layer, the fifth insulating layer 95, the third conductive layer, the first dielectric layer 96, the fourth conductive layer, the first planar layer 97, and the fifth conductive layer are sequentially stacked. The first insulating layer 91, the second insulating layer 92, the third insulating layer 93, the fourth insulating layer 94, and the fifth insulating layer 95 can be a single-layer structure or a multi-layer structure, and the material of the first insulating layer 91, the second insulating layer 92, the third insulating layer 93, the fourth insulating layer 94, and the fifth insulating layer 95 can be at least one of silicon nitride, silicon oxide, and silicon oxynitride; the first dielectric layer 96 can be silicon nitride layer; and the material of the first planar layer 97 can be an organic material, such as polyimide (PI), polyethylene terephthalate (PET), polyethylene naphthalate (PEN), silicon-glass bonded structure (SOG). The base substrate 90 may include a glass substrate, a barrier layer, and a polyimide layer stacked in sequence, and the barrier layer may be an inorganic material. The material of the first conductive layer, the second conductive layer, and the third conductive layer may be one or an alloy of molybdenum, aluminum, copper, titanium, niobium, or a molybdenum/titanium alloy or laminate. The material of the fourth conductive layer and the fifth conductive layer may include metal materials, such as one or an alloy of molybdenum, aluminum, copper, titanium, niobium, or a molybdenum/titanium alloy or laminate, etc., or may be titanium/aluminum/titanium laminate. The light-shielding layer may be a conductive layer, for example, the light-shielding layer may be a molybdenum layer.

Figure 60:
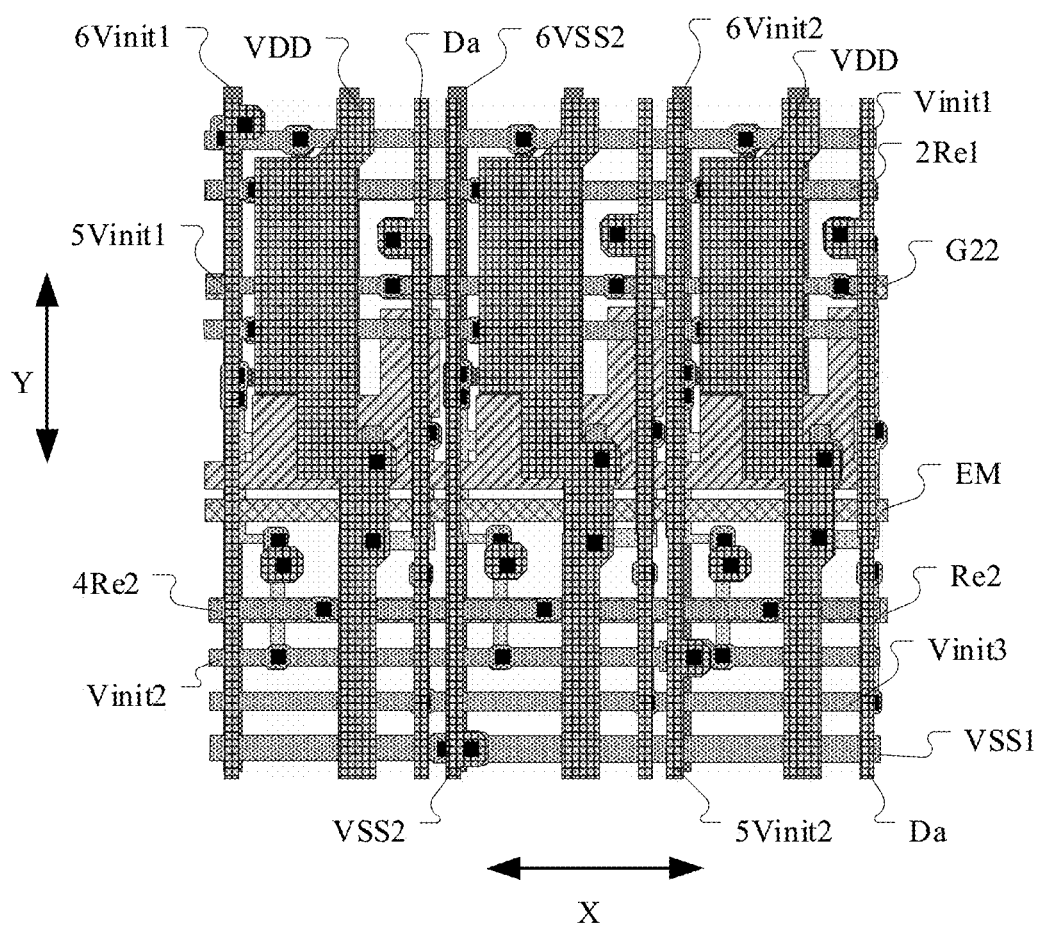
FIG. 60 is a structural layout of another exemplary embodiment of a display panel of the present disclosure.
Figure 61:
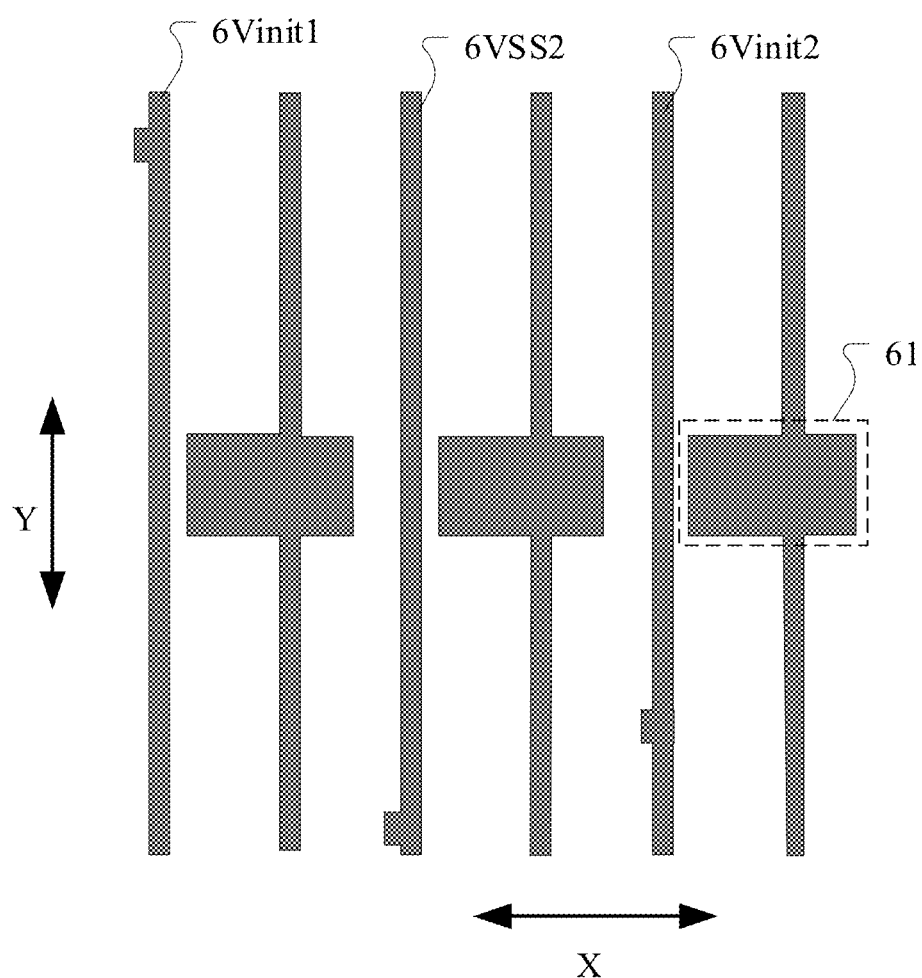
FIG. 61 is a structural layout of the light-shielding layer in FIG. 60.
Figure 62:
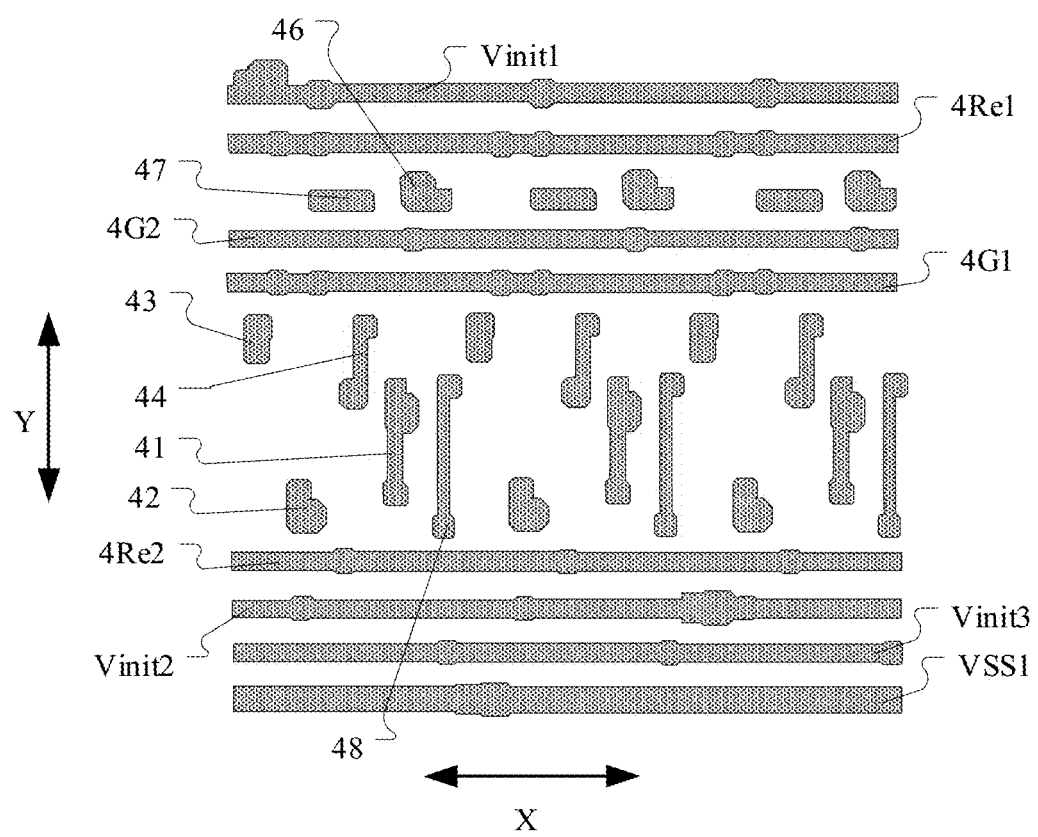
FIG. 62 is a structural layout of the fourth conductive layer in FIG. 60.
Figure 63:
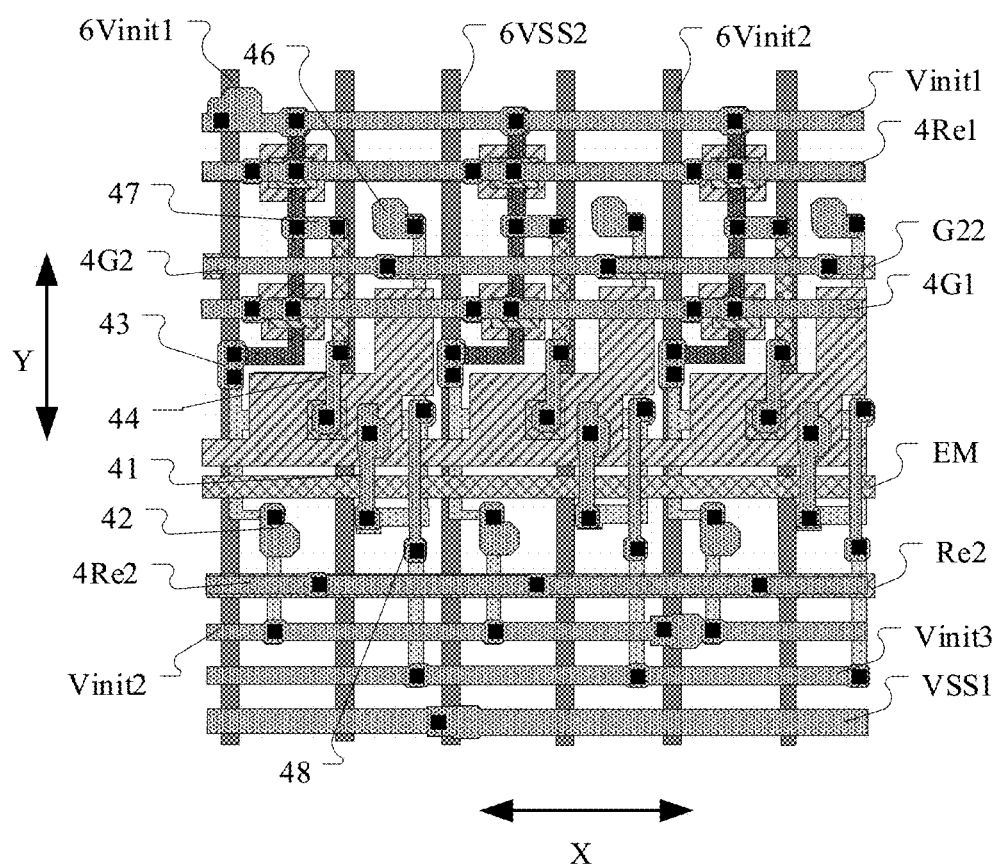
FIG. 63 is a structural layout of the light-shielding layer, the first active layer, the first conductive layer, the second conductive layer, the second active layer, the third conductive layer, and the fourth conductive layer in FIG. 60.

It should be understood that, in other exemplary embodiments, the second power line may also be located on the light-shielding layer. As shown in FIGS. 60-63, FIG. 60 is a structural layout of another exemplary embodiment of a display panel of the present disclosure, FIG. 61 is a structural layout of a light-shielding layer in FIG. 60, FIG. 62 is a structural layout of the fourth conductive layer in FIG. 60, and FIG. 63 is a structural layout of the light-shielding layer, the first active layer, the first conductive layer, the second conductive layer, the second active layer, the third conductive layer, and the fourth conductive layer in FIG. 60.

As shown in FIGS. 60, 61, and 63, the difference between the display panel shown in FIG. 60 and the display panel shown in FIG. 44 is that the light-shielding layer of the display panel shown in FIG. 60 can also include a sixth initial line 6Vinit1, a seventh initial line 6 Vinit2, and a second power line 6VSS2. The orthographic projection of the sixth initial line 6Vinit1 on the base substrate, the orthographic projection of the seventh initial line 6Vinit2 on the base substrate, and the orthographic projection of the second power line 6VSS2 on the base substrate may extend along the second direction Y. As shown in FIGS. 60, 61, 62, and 63, the first initial signal line Vinit can be connected to the sixth initial line 6Vinit1 that intersects the first initial signal line Vinit1 through a via hole, and the second initial signal line Vinit2 can be connected to the seventh initial line 6Vinit2 that intersects the second initial signal line Vinit2 through a via hole. The first power line VSS1 can be connected to the second power line 6VSS2 intersecting with the first power line VSS1 through a via hole. Wherein, the sixth initial line 6Vinit1, the first initial signal line Vinit1, and the fourth initial line 5Vinit1 can form a grid structure, and the sixth initial line 6Vinit1 can further reduce the voltage difference of the first initial signal terminals in the pixel driving circuits at different positions of the panel. The seventh initial line 6Vinit2, the second initial signal line Vinit2, and the fifth initial line 5 Vinit2 may form a grid structure. The seventh initial line 6Vinit2 can further reduce the voltage difference of the second initial signal terminals in the pixel driving circuits at different positions of the panel. The second power line 6VSS2, the first power line VSS1, and the second power line VSS2 may form a grid structure. The second power line 6VSS2 can further reduce the voltage difference between different positions of the common electrode layer.

Other structures of the display panel shown in FIG. 60 may be the same as those of the display panel shown in FIG. 44.

Figure 64:
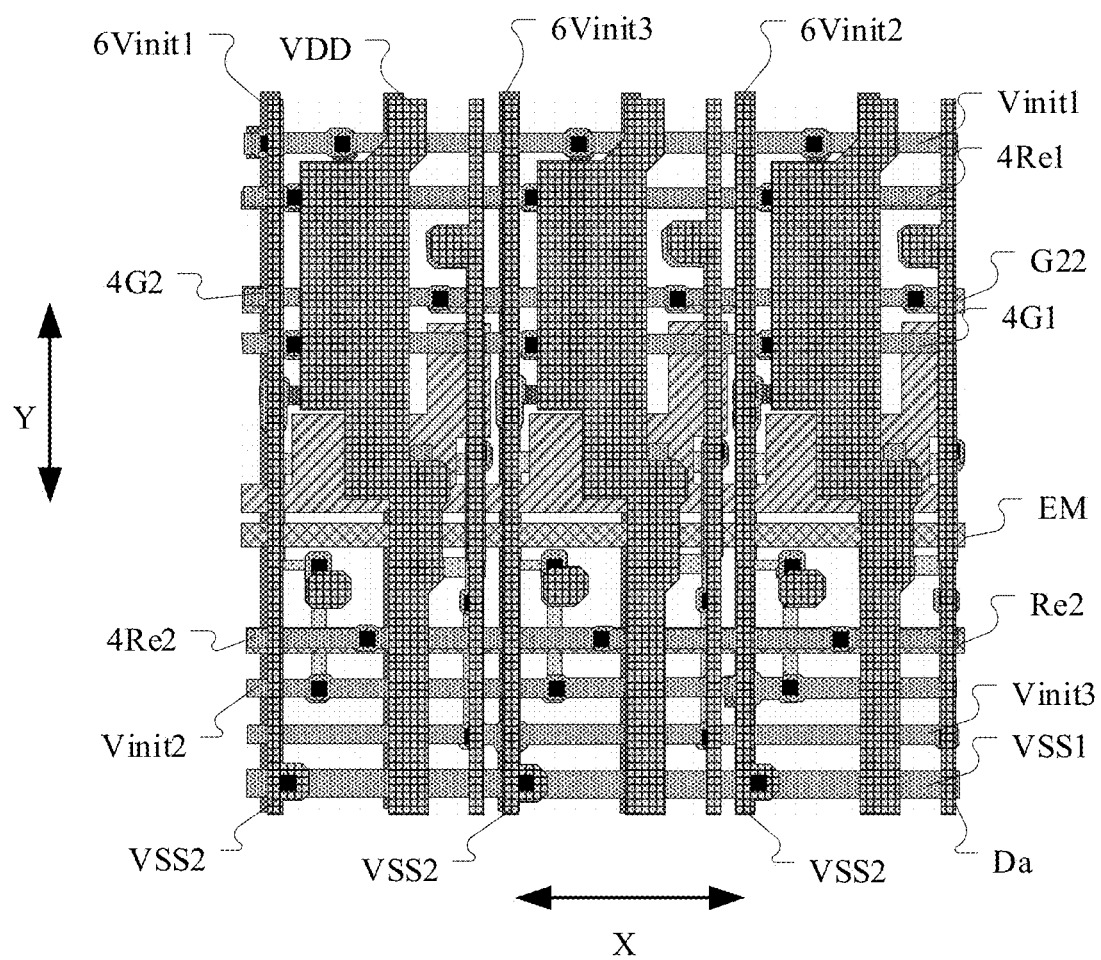
FIG. 64 is a structural layout of another exemplary embodiment of a display panel of the present disclosure.
Figure 65:
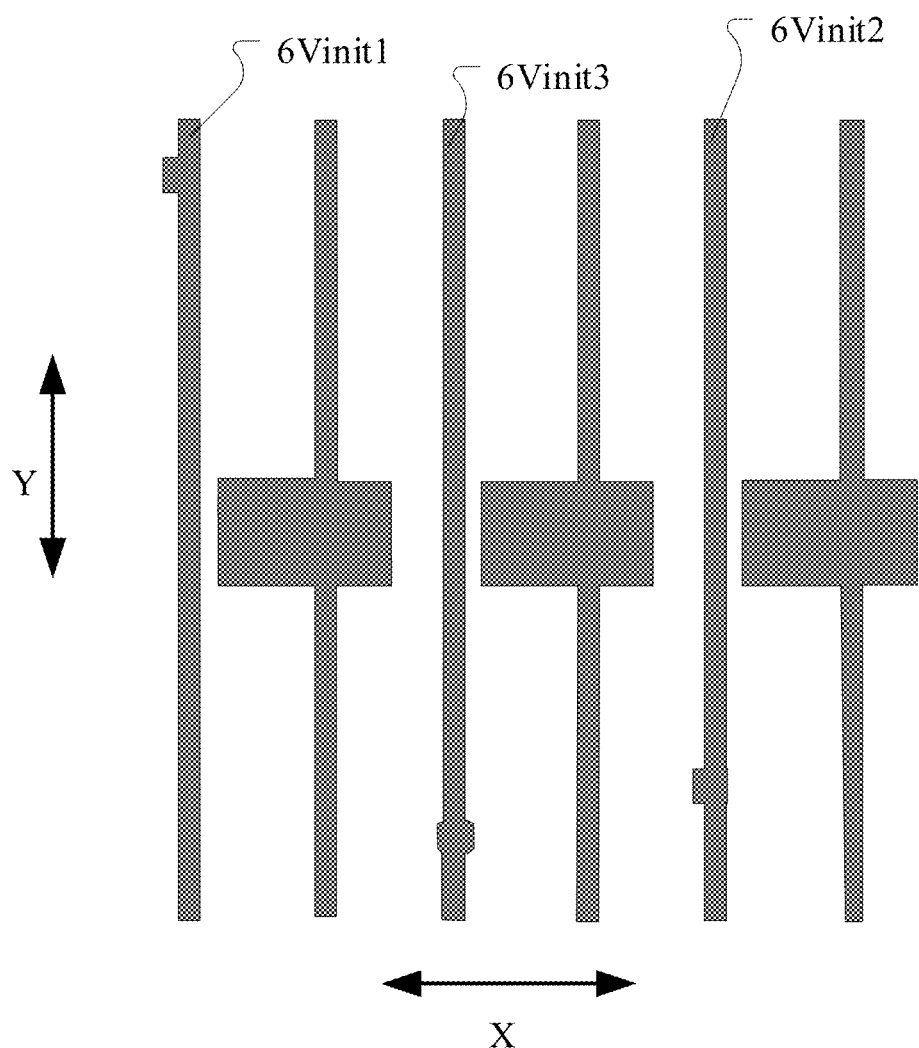
FIG. 65 is a structural layout of the light-shielding layer in FIG. 64.
Figure 66:
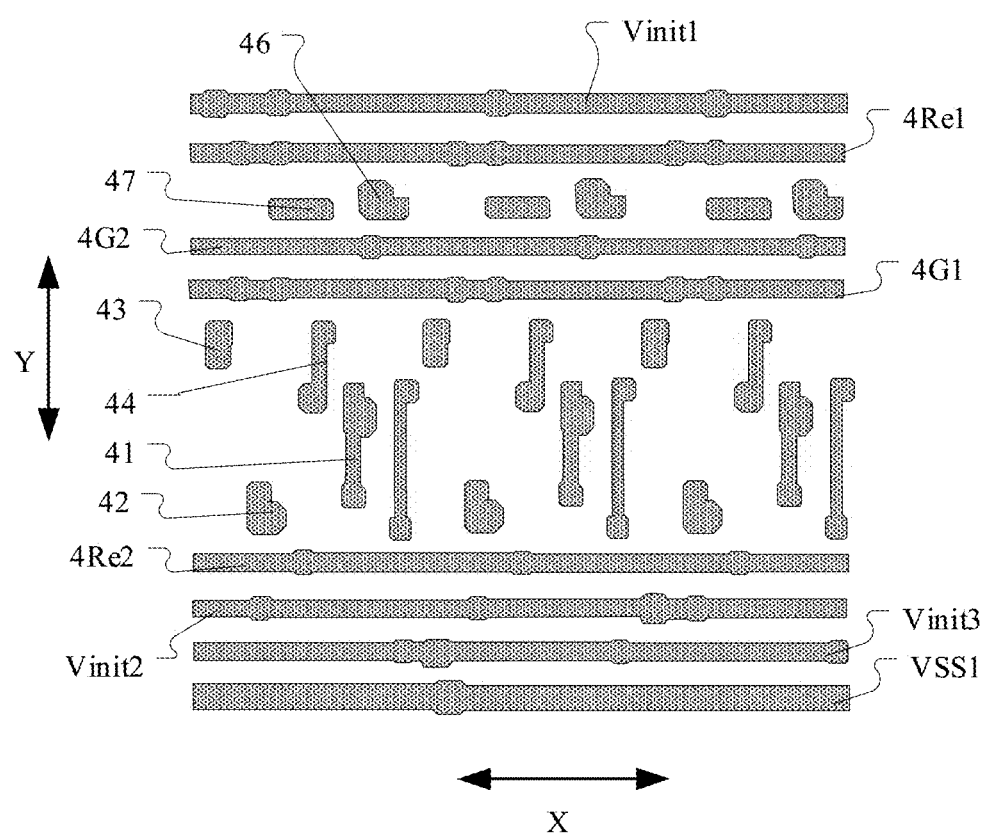
FIG. 66 is a structural layout of the fourth conductive layer in FIG. 64.
Figure 67:
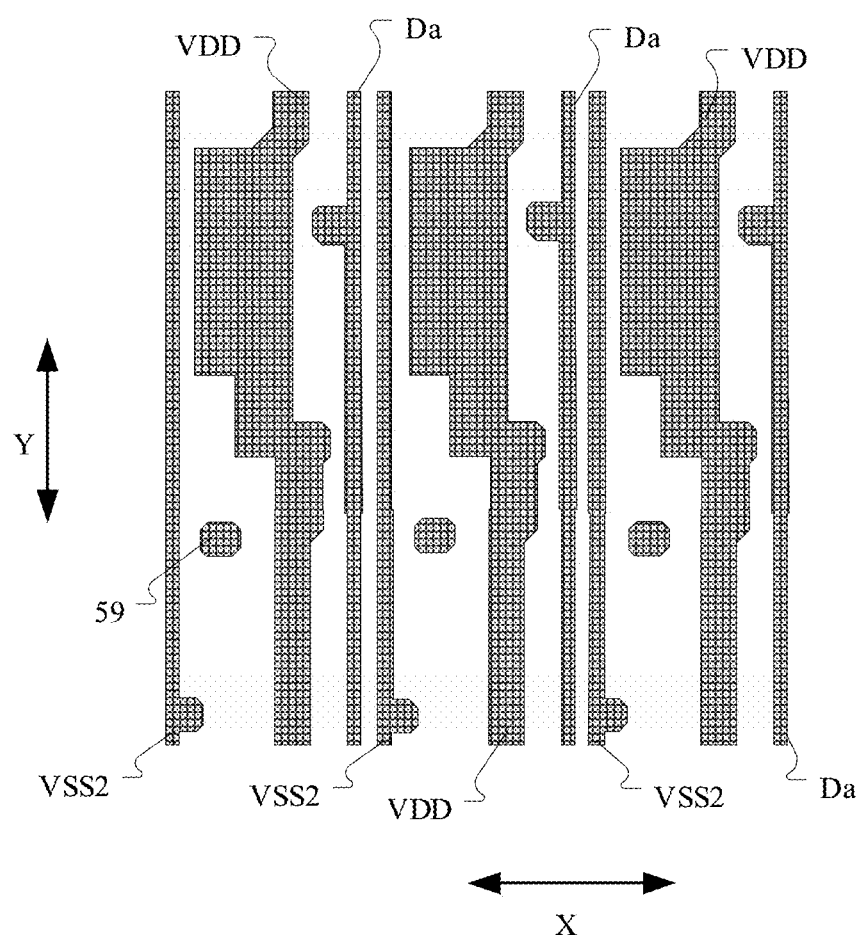
FIG. 67 is a structural layout of the fifth conductive layer in FIG. 64.
Figure 68:
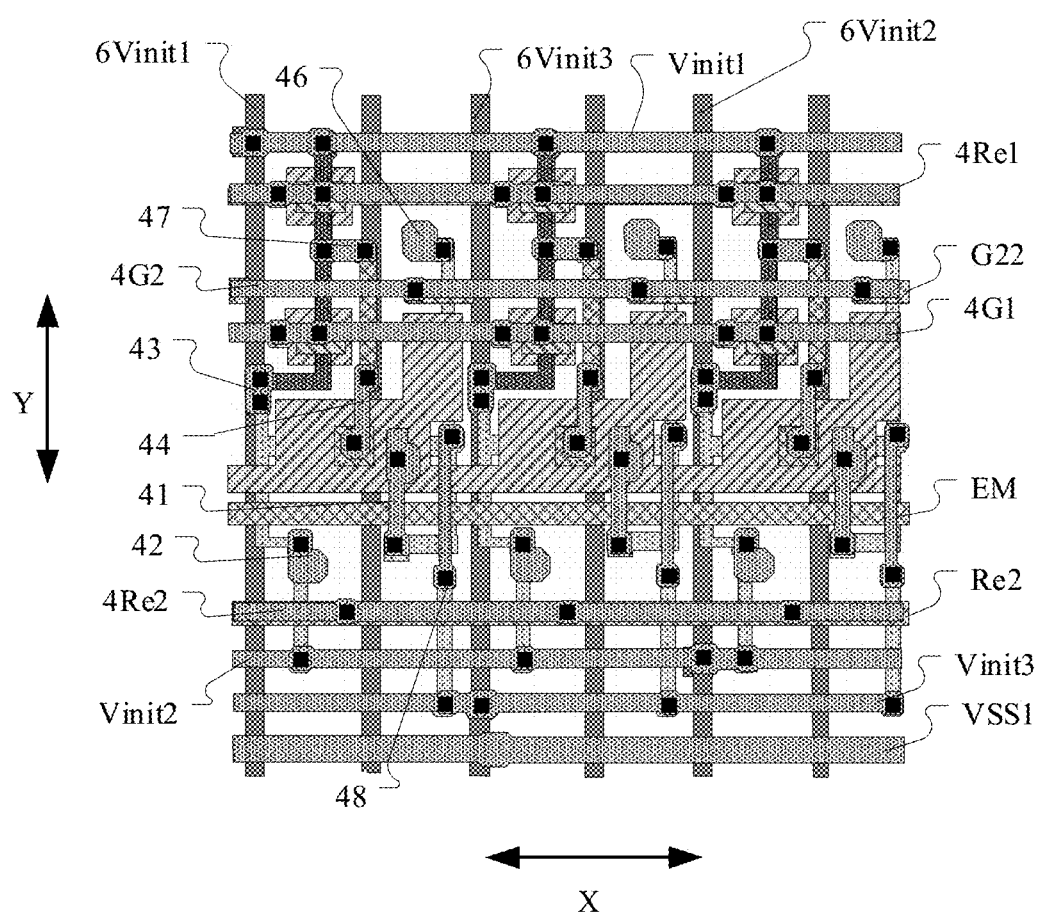
FIG. 68 is a structural layout of the light-shielding layer, the first active layer, the first conductive layer, the second conductive layer, the second active layer, the third conductive layer, and the fourth conductive layer in FIG. 64.

It should be understood that, in other exemplary embodiments, the third initial signal line Vinit3 may also form a grid structure. As shown in FIGS. 64-68, FIG. 64 is a structural layout of another exemplary embodiment of a display panel of the present disclosure, FIG. 65 is a structural layout of the light-shielding layer in FIG. 64, FIG. 66 is a structural layout of the fourth conductive layer in FIG. 64, FIG. 67 is a structural layout of the fifth conductive layer in FIG. 64, and FIG. 68 is a structural layout of the light-shielding layer, the first active layer, the first conductive layer, the second conductive layer, the second active layer, the third conductive layer, and the fourth conductive layer in FIG. 64.

The difference between the display panel shown in FIG. 64 and the display panel shown in FIG. 44 is that: as shown in FIGS. 64, 65, and 68, the light-shielding layer of the display panel shown in FIG. 64 may also include a sixth initial line 6Vinit1, a seventh initial line 6Vinit2, and an eighth initial line 6Vinit3. As shown in FIGS. 64, 65, 66, and 68, the first initial signal line Vinit1 can be connected to the sixth initial line 6Vinit1 that intersects the first initial signal line Vinit1 through a via hole, and the second initial signal line Vinit2 can be connected to the seventh initial line 6Vinit2 that intersects the second initial signal line Vinit2 through a via hole. The third signal initial line Vinit3 may be connected to the eighth initial line 6Vinit3 intersecting the third signal initial line Vinit3 through a via hole. Wherein, the sixth initial line 6Vinit1 and the first initial signal line Vinit1 can form a grid structure, and the initial signal line of the grid structure can reduce the voltage difference of the first initial signal terminals in the pixel driving circuits at different positions of the display panel. The seventh initial line 6Vinit2 and the second initial signal line Vinit2 may form a grid structure. The initial signal line of the grid structure can reduce the voltage difference of the second initial signal terminals in the pixel driving circuits at different positions of the display panel. The eighth initial line 6Vinit3 and the third signal initial line Vinit3 may form a grid structure. The initial signal line of the grid structure can reduce the voltage difference of the third initial signal terminals in the pixel driving circuits at different positions of the display panel.

As shown in FIGS. 64 and 67, compared with the display panel shown in FIG. 44, the fifth conductive layer of the display panel shown in FIG. 64 is not provided with the fourth initial line 5Vinit1 and the fifth initial line 5Vinit2, instead a second power line VSS2 is provided in each column of the driving circuit, and each second power line VSS2 is connected to the first power line VSS1 intersecting with the second power line VSS2 through a via hole.

Other structures of the display panel shown in FIG. 64 may be the same as those of the display panel shown in FIG. 44.

Figure 69:
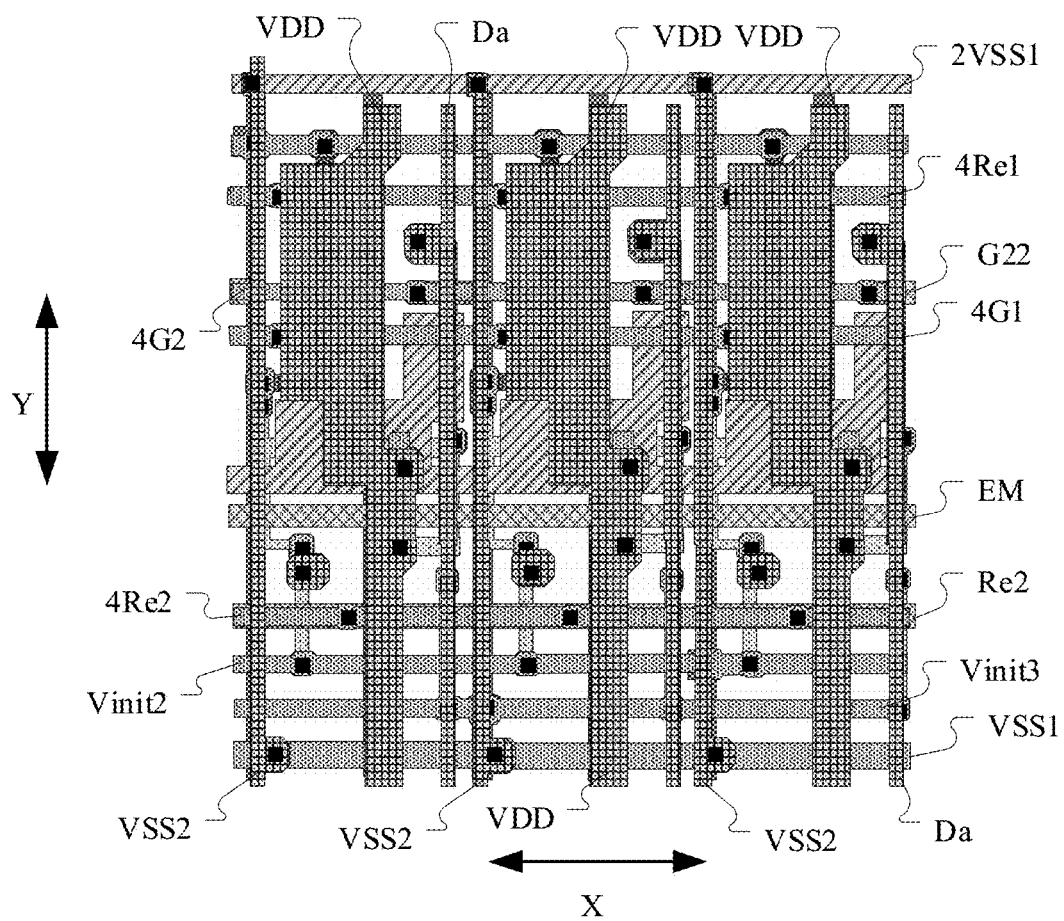
FIG. 69 is a structural layout of another exemplary embodiment of a display panel of the present disclosure.
Figure 70:
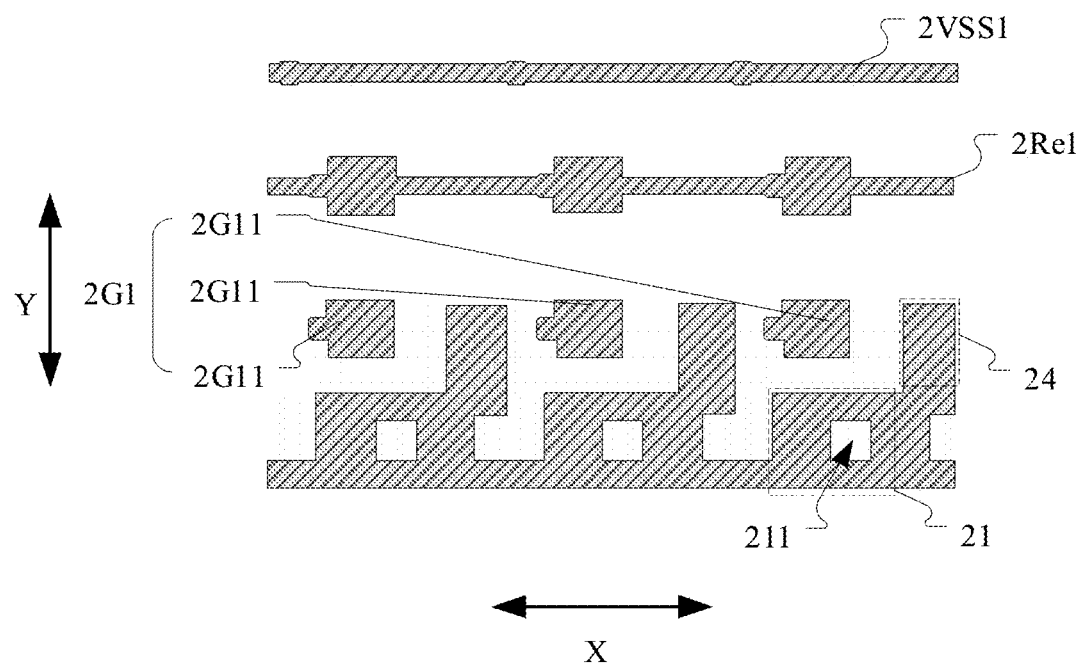
FIG. 70 is a structural layout of the second conductive layer in FIG. 69.
Figure 71:
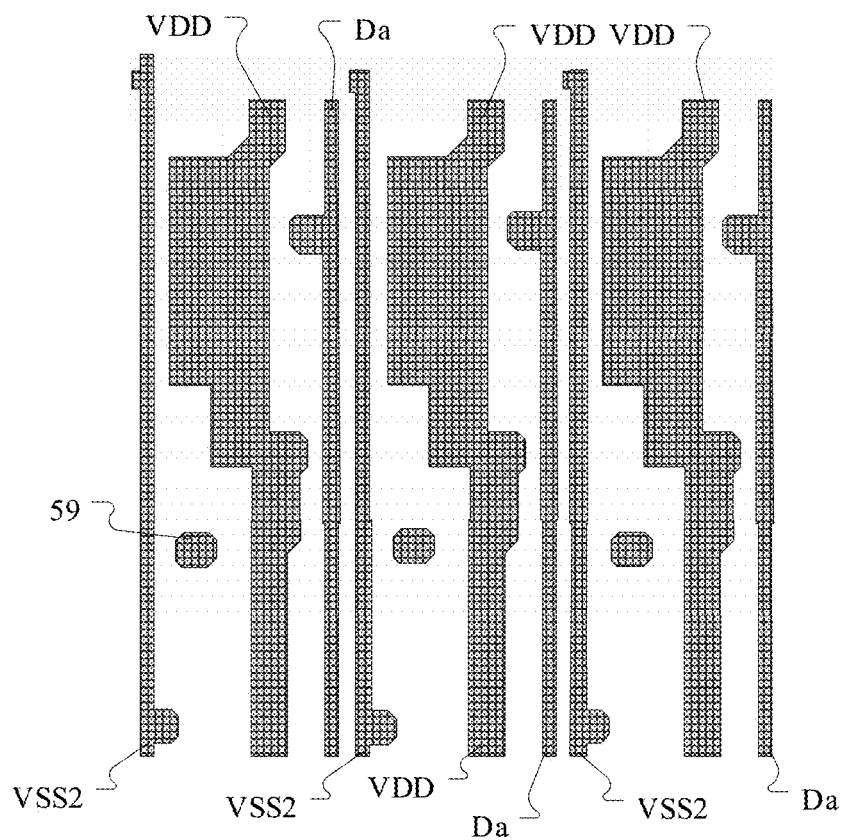
FIG. 71 is a structural layout of the fifth conductive layer in FIG. 69.

As shown in FIGS. 69-71, FIG. 69 is a structural layout of another exemplary embodiment of a display panel of the present disclosure, FIG. 70 is a structural layout of the second conductive layer in FIG. 69, and FIG. 71 is a structural layout of the fifth conductive layer in FIG. 69.

The difference between the display panel shown in FIG. 69 and the display panel shown in FIG. 64 is that: the second conductive layer of the display panel shown in FIG. 69 may further include a first power line 2VSS1, and the orthographic projection of the first power line 2VSS1 on the base substrate may extend along the first direction X. As shown in FIG. 69, the display panel shown in FIG. 69 is different from the display panel shown in FIG. 64 in that: the second power line VSS2 in the fifth conductive layer can also be connected to the intersecting first power line 2VSS1 through a via hole. Therefore, the first power line 2VSS1, the first power line VSS1, and the second power line VSS2 can form a grid structure, and the power lines of the grid structure can reduce the voltage difference at different positions of the common electrode layer.

Other structures of the display panel shown in FIG. 69 may be the same as those of the display panel shown in FIG. 64.

This exemplary embodiment also provides a display device, which includes the above-mentioned display panel. The display device may be a display device such as a mobile phone, a tablet computer, or a television.

Other embodiments of the disclosure will be readily apparent to those skilled in the art from consideration of the specification and practice of the disclosure herein. This application is intended to cover any modification, use or adaptation of the present disclosure, which follow the general principles of the present disclosure and include common knowledge or customary techniques in the technical field not disclosed in the present disclosure means. The specification and examples are to be considered exemplary only, with the true scope and spirit of the disclosure indicated by the appended claims.

It should be understood that the present disclosure is not limited to the precise constructions which have been described above and shown in the drawings, and various modifications and changes may be made without departing from the scope thereof. The scope of the present disclosure is limited only by the appended claims.

What is claimed is:

1. A display panel, wherein the display panel comprises a display area, a light emitting unit located in the display area, and a pixel driving circuit for driving the light emitting unit, the pixel driving circuit is connected to a first electrode of the light emitting unit, and the display panel further comprises:
   a base substrate;
   a first power line, disposed in the display area of the display panel, wherein an orthographic projection of the first power line on the base substrate is extended along a first direction;
   a second power line, disposed in the display area of the display panel, wherein an orthographic projection of the second power line on the base substrate is extended along a second direction, the second direction intersects the first direction, and at least a part of the second power line is connected to at least a part of the first power line;
   a common electrode layer disposed at a side of the base substrate, wherein the common electrode layer is used to form a second electrode of the light emitting unit, and the common electrode layer is connected to the first power line and the second power line; and
   a data line, an orthographic projection of the data line on the base substrate is extended along the second direction,
   wherein two adjacent second power lines are disposed mirror-symmetrically and two adjacent data lines are disposed mirror-symmetrically.

2. The display panel according to claim 1, wherein two adjacent data lines are mirror-symmetrically disposed between the two second power lines that are disposed mirror-symmetrically, and the two data lines and the two second power lines share a same axis of symmetry.

3. The display panel according to claim 1, wherein the data line is connected to the pixel driving circuit by a sixth bridging part, and the first power line is connected to the second power line by a seventh bridging part,
   wherein the pixel driving circuit comprises a driving transistor and a first transistor, a first electrode of the first transistor is connected to a gate electrode of the driving transistor, a second electrode of the first transistor is connected to a first initial signal line, and a gate electrode of the first transistor is connected to a reset signal line, and
   wherein in the second direction, an orthographic projection of the reset signal line on the base substrate is between an orthographic projection of the sixth bridging part on the base substrate and an orthographic projection of the seventh bridging part on the base substrate.

4. The display panel according to claim 3, wherein the pixel driving circuit further comprises a second transistor, a first electrode of the second transistor is connected to the gate electrode of the driving transistor, and a second electrode of the second transistor is connected to the second electrode of the driving transistor, and a gate electrode of the second transistor is connected to a third gate line,
   wherein in the second direction, the orthographic projection of the sixth bridging part on the base substrate is between the orthographic projection of the reset signal line on the base substrate and an orthographic projection of the third gate line on the base substrate.

5. The display panel according to claim 4, wherein the orthographic projection of the seventh bridging part on the base substrate is overlapped with an orthographic projection of the first initial signal line on the base substrate.

6. The display panel according to claim 5, wherein an area where the orthographic projection of the seventh bridging part on the base substrate is overlapped with the orthographic projection of the first initial signal line on the base substrate is smaller than an area where the orthographic projection of the seventh bridging part on the base substrate is not overlapped with the orthographic projection of the first initial signal line on the base substrate.

7. The display panel according to claim 3, wherein the display panel further comprises a second conductive layer, disposed between the base substrate and the common electrode layer, and the second conductive layer comprises the first initial signal line and a third reset signal line, wherein a part of the third reset signal line is used to form a bottom gate electrode of the first transistor, and
   wherein the pixel driving circuit further comprises a second transistor, a fourth transistor, a fifth transistor, a sixth transistor, a seventh transistor, and a capacitor, and a first electrode of the second transistor is connected to the gate electrode of the driving transistor, and a second electrode of the second transistor is connected to a second electrode of the driving transistor, a first electrode of the fourth transistor connected to a data line, a second electrode of the fourth transistor is connected to a first electrode of the driving transistor, a first electrode of the fifth transistor is connected to a third power line, and a second electrode of the fifth transistor is connected to the first electrode of the driving transistor, a first electrode of the sixth transistor is connected to the second electrode of the driving transistor, a second electrode of the seventh transistor is connected to a second electrode of the sixth transistor, and a first electrode of the seventh transistor is connected to a second initial signal line, a first electrode of the capacitor is connected to the gate electrode of the driving transistor, and a second electrode of the capacitor is connected to the third power line, and
   the second electrode of the first transistor is connected to the first initial signal line through a first bridging part, and the second electrode of the sixth transistor is connected to the second electrode of the seventh transistor through a second bridging part, and
   wherein an orthographic projection of the first initial signal line on the base substrate is between an orthographic projection of the second bridging part on the base substrate and orthographic projection of the third reset line on the base substrate.

8. The display panel according to claim 3, wherein the pixel driving circuit further comprises a fifth transistor, a first electrode of the fifth transistor is connected to a third power line, and a second electrode of the fifth transistor is connected to a first electrode of the driving transistor, and wherein an orthographic projection of the first transistor on the base substrate and an orthographic projection of the second transistor on the base substrate are covered by an orthographic projection of the third power line on the base substrate.

9. The display panel according to claim 1, wherein the pixel driving circuit comprises a driving transistor and a fifth transistor, a first electrode of the fifth transistor is connected to a third power line, and a second electrode of the fifth transistor is connected to a first electrode of the driving transistor, and wherein the orthographic projection of the second power line on the base substrate is between the orthographic projection of the data line on the base substrate and an orthographic projection of the third power line on the base substrate.

10. The display panel according to claim 1, wherein the first power line comprises a first sub-power line, at least one first cutout located in a fan-out area is formed on the first sub-power line, and the first sub-power line comprises a first sub-power line segment located between two first cutouts; and the second power line comprises a second sub-power line, second cutouts located in the fan-out area are formed on the second sub-power line, the second sub-power line comprises a second sub-power line segment spaced by the second cutouts, and the second sub-power line segment is located in the fan-out area.

11. The display panel according to claim 10, wherein the pixel driving circuit comprises a driving transistor and a seventh transistor, a first electrode of the seventh transistor is connected to a second initial signal line, and a second electrode of the seventh transistor is connected to a first electrode of the light emitting unit;

wherein the display panel further comprises:
a fourth conductive layer, disposed between the base substrate and the common electrode layer, wherein the fourth conductive layer comprises a fourth bridging part, and the fourth bridging part is connected to a gate electrode of the driving transistor, wherein the second initial signal line is located at the fourth conductive layer, and the fourth conductive layer comprises a tenth bridging part; and
a fifth conductive layer, disposed between the fourth conductive layer and the common electrode layer, wherein the fifth conductive layer comprises the data line and the second power line;
wherein, the data line is connected to the tenth bridging part.

12. The display panel according to claim 11, wherein an orthographic projection of the tenth bridging part on the base substrate is overlapped with the orthographic projection of the data line on the base substrate.

13. The display panel according to claim 11, wherein the data line is connected to the pixel driving circuit by a sixth bridging part, and the first power line is connected to the second power line by a seventh bridging part, wherein the pixel driving circuit further comprises a first transistor, a first electrode of the first transistor is connected to a gate electrode of the driving transistor, a second electrode of the first transistor is connected to a first initial signal line, and a gate electrode of the first transistor is connected to a reset signal line, and wherein the orthographic projection of the tenth bridging part on the base substrate is overlapped with orthographic projections of the first initial signal line, the first power line and the reset signal line on the base substrate.

14. The display panel according to claim 13, wherein the tenth bridging part comprises a widened portion, and the widened portion is connected to the data line, wherein the pixel driving circuit further comprises a second transistor, a first electrode of the second transistor is connected to the gate electrode of the driving transistor, and a second electrode of the second transistor is connected to the second electrode of the driving transistor, and a gate electrode of the second transistor is connected to a third gate line, and wherein an orthographic projection of the widened portion on the base substrate is between the orthographic projection of the reset signal line on the base substrate and an orthographic projection of the third gate line on the base substrate.

15. The display panel according to claim 11, wherein a pattern of the tenth bridging part in one pixel is a horizontal mirrored pattern of the pattern of the tenth bridging part in adjacent one pixel.

16. The display panel according to claim 11, wherein the tenth bridging part in an N-th row is connected to the data line in an M-th column, the tenth bridging part in an (N+1)-th row is connected to the data line in an (M+1)-th column, . . . , and the tenth bridging part in an (N+j)-th row is connected to the data line in an (M+j)-th column, wherein M, N, j are positive integers.

17. The display panel according to claim 11, wherein a pattern of the first cutout and the tenth bridging part in one row is horizontal mirror-symmetrically disposed with the pattern of the first cutout and the tenth bridging part in next row.

18. The display panel according to claim 10, wherein the pixel driving circuit comprises a driving transistor and a fifth transistor, a first electrode of the fifth transistor is connected to a third power line, and a second electrode of the fifth transistor is connected to a first electrode of the driving transistor, and an orthographic projection of a first cutout of the first sub-power line on the base substrate is between an orthographic projection of the second power line on the base substrate and an orthographic projection of the third power line on the base substrate.

19. The display panel according to claim 1, wherein the pixel driving circuit comprises a driving transistor, and the display panel further comprises:
a first active layer, disposed between the base substrate and the common electrode layer, wherein the first active layer comprises a third active part, and the third active part is used to form a channel area of the driving transistor; and
a light-shielding layer, disposed between the base substrate and the first active layer, wherein the light-shielding layer comprises a light-shielding part, and an orthographic projection of the light-shielding part on the base substrate covers an orthographic projection of the third active part on the base substrate.

20. The display panel according to claim 19, wherein at least a part of the second power line is located at the light-shielding layer.

21. The display panel according to claim 1, wherein the pixel driving circuit comprises a driving transistor, a first transistor, a second transistor, a fourth transistor, a fifth transistor, a sixth transistor, a seventh transistor, and a capacitor, and a first electrode of the first transistor is connected to a gate electrode of the driving transistor, a second electrode of the first transistor is connected to a first initial signal line, a first electrode of the second transistor is connected to the gate electrode of the driving transistor, and a second electrode of the second transistor is connected to a second electrode of the driving transistor, a first electrode of the fourth transistor connected to a data line, a second electrode of the fourth transistor is connected to a first electrode of the driving transistor, a first electrode of the fifth transistor is connected to a third power line, and a second electrode of the fifth transistor is connected to the first electrode of the driving transistor, a first electrode of the sixth transistor is connected to the second electrode of the driving transistor, a second electrode of the seventh transistor is connected to a second electrode of the sixth transistor, and a first electrode of the seventh transistor is connected to a second initial signal line, a first electrode of the capacitor is connected to the gate electrode of the driving transistor, and a second electrode of the capacitor is connected to the third power line, and wherein the first transistor and the second transistor are metal oxide thin film transistors; and the driving transistor, the fourth transistor, the fifth transistor, the sixth transistor and the seventh transistor are low temperature polysilicon thin film transistors.

22. The display panel according to claim 1, wherein the first power line comprises a branch protruded in the second direction, and the first power line is connected to the second power line through the branch.

23. The display panel according to claim 1, wherein the pixel driving circuit comprises a driving transistor and a capacitor, a first electrode of the capacitor is connected to a gate electrode of the driving transistor, and a second electrode of the capacitor is connected to a third power line, wherein the display panel further comprises:

a second conductive layer, disposed between the base substrate and the common electrode layer, wherein the second conductive layer comprises: a first conductive part, and the first conductive part is used to form the second electrode of the capacitor;

a fourth conductive layer, disposed between the second conductive layer and the common electrode layer, wherein the fourth conductive layer comprises: a first bridging part, and the first bridging part is connected to the first conductive part through a first via hole; and a fifth conductive layer, disposed between the fourth conductive layer and the common electrode layer, wherein the third power line is located at the fifth conductive layer and is connected to the first bridging part through a second via hole, wherein orthographic projections of the first via hole and the second via hole on the base substrate are between adjacent two symmetrical data lines, and wherein the two adjacent second power lines and the two adjacent data lines are overlapped with the first bridging part.

24. The display panel according to claim 23, wherein the first power line comprises a first sub-power line, at least one first cutout located in a fan-out area is formed on the first sub-power line, and the first sub-power line comprises a first sub-power line segment located between two first cutouts;

the first power line is connected to the second power line by a seventh bridging part; and wherein an edge of at least part of the first cutout is overlapped with the second power line and an edge of the seventh bridging part adjacent to the second power line.

25. The display panel according to claim 1, wherein the pixel driving circuit comprises a driving transistor and a fifth transistor, a first electrode of the fifth transistor is connected to a third power line, and a second electrode of the fifth transistor is connected to a first electrode of the driving transistor, wherein the display panel further comprises:

a fifth conductive layer, disposed between the base substrate and the common electrode layer, the fifth conductive layer including the third power line;

wherein the third power line comprises: a first extension part, a second extension part, and a third extension part, and the second extension part is connected between the first extension part and the third extension part, and wherein a size in the row direction, of an orthographic projection of the second extension part on the base substrate, is greater than a size in the row direction, of an orthographic projection of the first extension part on the base substrate, and the size in the row direction, of the orthographic projection of the second extension part on the base substrate, is greater than a size in the row direction, of an orthographic projection of the third extension part on the base substrate;

and wherein a part of the second power line corresponding to the second extension part is protruded towards the second extension part.

26. A display device, comprising a display panel, wherein the display panel comprises a display area, a light emitting unit located in the display area, and a pixel driving circuit for driving the light emitting unit, the pixel driving circuit is connected to a first electrode of the light emitting unit, and the display panel further comprises:

a base substrate;

a first power line, disposed in the display area of the display panel, wherein an orthographic projection of the first power line on the base substrate is extended along a first direction;

a second power line, disposed in the display area of the display panel, wherein an orthographic projection of the second power line on the base substrate is extended along a second direction, the second direction intersects the first direction, and at least a part of the second power line is connected to at least a part of the first power line;

a common electrode layer disposed at a side of the base substrate, wherein the common electrode layer is used to form a second electrode of the light emitting unit, and the common electrode layer is connected to the first power line and the second power line; and a data line, an orthographic projection of the data line on the base substrate is extended along the second direction, wherein two adjacent second power lines and two adjacent data lines are disposed mirror-symmetrically.

\* \* \* \* \*